(12) United States Patent
Yang

(10) Patent No.: US 11,587,935 B2
(45) Date of Patent: Feb. 21, 2023

(54) SEMICONDUCTOR DEVICE WITH EMBEDDED STORAGE STRUCTURE AND METHOD FOR FABRICATING THE SAME

(71) Applicant: NANYA TECHNOLOGY CORPORATION, New Taipei (TW)

(72) Inventor: Sheng-Hui Yang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 66 days.

(21) Appl. No.: 16/839,214

(22) Filed: Apr. 3, 2020

(65) Prior Publication Data

US 2021/0313331 A1 Oct. 7, 2021

(51) Int. Cl.
*H01L 29/78* (2006.01)
*H01L 27/108* (2006.01)
*H01L 29/66* (2006.01)
*H01L 29/417* (2006.01)

(52) U.S. Cl.
CPC .. *H01L 27/10826* (2013.01); *H01L 29/41791* (2013.01); *H01L 29/66795* (2013.01); *H01L 29/785* (2013.01)

(58) Field of Classification Search
CPC ............. H01L 27/10802; H01L 29/785; H01L 29/66795; H01L 29/41791; H01L 27/10826
See application file for complete search history.

(56) References Cited

U.S. PATENT DOCUMENTS

2017/0162579 A1 6/2017 Choi et al.
2019/0006366 A1 1/2019 Leobandung et al.

FOREIGN PATENT DOCUMENTS

TW 201607037 A 2/2016

*Primary Examiner* — Suberr L Chi
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a substrate, a fin positioned on the substrate, a gate structure positioned on the fin, a pair of source/drain regions positioned on two sides of the fin, a dielectric layer positioned above the drain region and adjacent to the gate structure, and a storage conductive layer positioned on the dielectric layer. The drain region, the dielectric layer and the storage conductive layer form a storage structure.

8 Claims, 54 Drawing Sheets

SEMICONDUCTOR DEVICE WITH EMBEDDED STORAGE STRUCTURE AND METHOD FOR FABRICATING THE SAME

TECHNICAL FIELD

The present disclosure relates to a semiconductor device and a method for fabricating the semiconductor device, and more particularly, to a semiconductor device with embedded DRAM (Dynamic Random Access Memory) and a method for fabricating the semiconductor device with the embedded DRAM.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the demand for ever-increasing computing ability. However, a variety of issues arise during the down-scaling process, and such issues are continuously increasing in quantity and complexity. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a fin positioned on the substrate; a gate structure positioned on the fin; a pair of source/drain regions positioned on two sides of the fin; and a dielectric layer positioned above the drain region and adjacent to the gate structure; a storage conductive layer positioned on the dielectric layer; wherein the drain region, the dielectric layer and the storage conductive layer form a storage structure.

In some embodiments, the gate structure comprises a gate insulating layer positioned on the fin, a gate conductive layer positioned on the gate insulating layer, and a gate filler layer positioned on the gate conductive layer.

In some embodiments, the gate insulating layer and the dielectric layer are integrally formed, and the gate conductive layer and the conductive layer are integrally formed.

In some embodiments, the gate insulating layer and the dielectric layer are made of the same material, and the gate conductive layer and the storage conductive layer are made of the same material.

In some embodiments, the semiconductor device further comprises a gate spacer positioned on one side of the gate structure and a storage spacer positioned on one side of the storage structure.

In some embodiments, the gate spacer and the storage spacer separate the gate structure from the storage structure.

In some embodiments, the semiconductor device further comprises a gate spacer positioned on one side of the gate structure, and a bit line contact positioned on a source region of the pair of source/drain regions, and the gate spacer separates the gate structure from the bit line contact.

In some embodiments, the gate conductive layer and the storage conductive layer have the same height.

In some embodiments, the semiconductor device further comprises: a plurality of fins extending along a first direction; a plurality of gate structures positioned on the plurality of fins and extending along a second direction different from the first direction; and a plurality of storage structures separated by an insulating material along the second direction and positioned between two adjacent gate structures.

In some embodiments, the plurality of gate structures have flat top surfaces and protrusions towards the substrate between two adjacent fins.

Another aspect of the present disclosure provides a semiconductor device including a substrate; a plurality of nanowires positioned above and parallel to a top surface of the substrate, wherein the plurality of nanowires comprises channel regions and source/drain regions positioned on each of both sides of the channel regions; a gate stack positioned surrounding the channel regions; and a storage structure positioned above a drain region of the plurality of nanowires and positioned adjacent to the gate stack; wherein the storage structure comprises a bottom conductive layer positioned above the drain region, a dielectric layer positioned on the bottom conductive layer, and a top conductive layer positioned on the dielectric layer.

In some embodiments, the plurality of nanowires are arranged vertically.

In some embodiments, the semiconductor device further comprises a bottom electrode positioned below the bottom conductive layer and positioned adjacent to the gate stack, wherein a width of the bottom electrode is greater than a width of the bottom conductive layer.

In some embodiments, the semiconductor device further comprises two storage spacers positioned on two sides of the top conductive layer, two sides of the dielectric layer, and two sides of the bottom conductive layer.

In some embodiments, the semiconductor device further comprises two contacts positioned on two sides of the gate stack and surrounding the source/drain regions of the plurality of nanowires.

In some embodiments, the semiconductor device further comprises two gate spacers positioned between the two contacts and the gate stack.

In some embodiments, the semiconductor device further comprises: a plurality of coverage layers positioned between the channel regions of the plurality of nanowires and the gate stack, wherein a band gap of the plurality of coverage layers is smaller than a band gap of the plurality of nanowires.

In some embodiments, the semiconductor device comprises: a plurality of gate stacks positioned on the plurality of nanowires, wherein the plurality of nanowires extend along a first direction and the plurality of gate stacks extend along a second direction different from the first direction; and a plurality of storage structures separated by an insulating material along the second direction and positioned between two adjacent gate stacks.

In some embodiments, the plurality of gate stacks have flat top surfaces and protrusions towards the substrate between two adjacent fins.

Another aspect of the present disclosure provides a method for fabricating a semiconductor device, comprising: providing a substrate; forming a plurality of fins on the substrate; forming a plurality of source regions and a plurality of drain regions on sides of the plurality of fins; forming a plurality of dummy gate structures on the plurality of fins and forming a plurality of dummy storage structures on the plurality of drain regions; forming a plurality of gate spacers on sides of the plurality of dummy gate structures and a plurality of storage spacers on sides of the plurality of dummy storage structure; removing the plurality of dummy gate structures to form a plurality of first trenches in-situ and removing the plurality of dummy storage structures to form a plurality of second trenches in-situ; integrally forming a dielectric layer in the plurality of first trenches and in the plurality of second trenches; forming a conductive layer in the plurality of first trenches and in the plurality of second trenches; and forming a plurality of bit line contacts on the plurality of source regions.

Due to the design of the semiconductor device of the present disclosure, the compact design of the gate structure and the storage structure make the semiconductor device able to be integrated with transistors of a processor in a single chip. As a result, the complicated packaging process may be simplified. Hence, the cost of fabrication of the electronic equipment including the semiconductor device of the present disclosure may be reduced.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
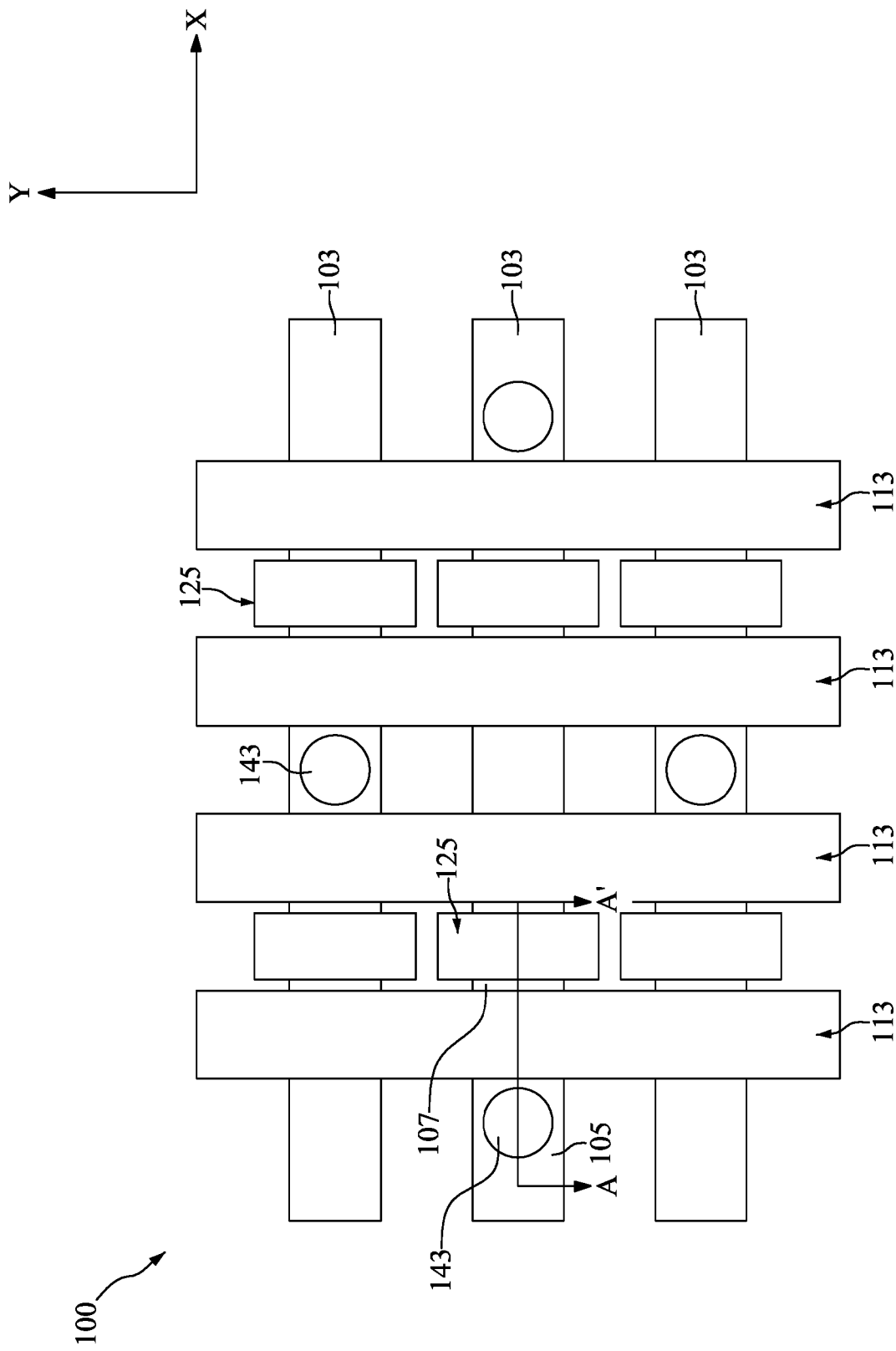
FIG. 1 illustrates, in a schematic top-view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, an integrated circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

Figure 2:
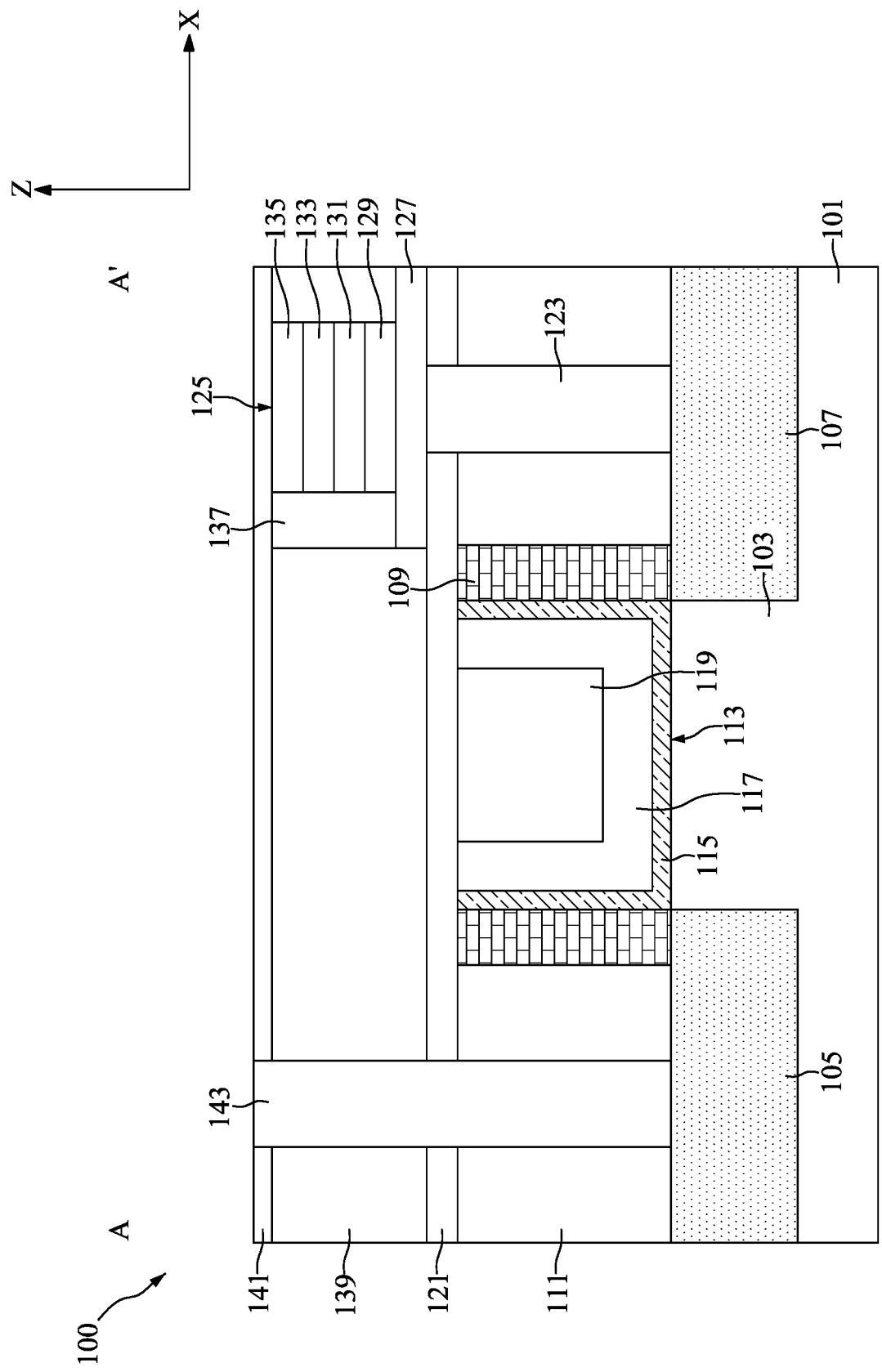
FIG. 2 is a schematic cross-sectional view diagram taken along a line A-A' in FIG. 1.
Figure 3:
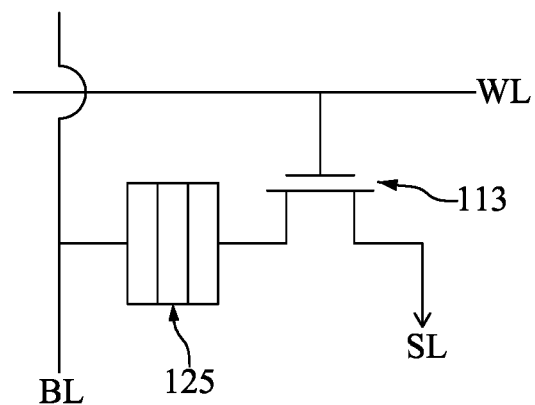
FIG. 3 illustrates, in a schematic circuit diagram, a semiconductor device in accordance with one embodiment of the present disclosure.

FIG. 1 illustrates, in a schematic top-view diagram, a semiconductor device 100 in accordance with one embodiment of the present disclosure. FIG. 2 is a schematic cross-sectional view diagram taken along a line A-A' in FIG. 1. FIG. 3 illustrates, in a schematic circuit diagram, a semiconductor device 100 in accordance with one embodiment of the present disclosure. Some elements of the semiconductor device 100 are not shown in FIG. 1 for clarity.

With reference to FIGS. 1 and 2, in the embodiment depicted, the semiconductor device 100 may include a substrate 101, a plurality of fins 103, pairs of source/drain regions, gate spacers 109, a first insulating layer 111, a plurality of gate structures 113, a second insulating layer 121, a plurality of storage node contacts 123, a plurality of storage structures 125, a plurality of storage spacers 137, a third insulating layer 139, a fourth insulating layer 141, and a plurality of bit line contacts 143.

With reference to FIGS. 1 and 2, in the embodiment depicted, the substrate 101 may be formed of, for example, silicon, silicon carbide, germanium silicon germanium, gallium arsenic, indium arsenide, indium, or other semiconductor materials including group III, group IV, or group V elements. The substrate 101 may include a silicon-on-insulator structure. For example, the substrate 101 may include a buried oxide layer formed using a process such as separation by implanted oxygen.

A stop layer (not shown in FIG. 2) may be optionally disposed on the substrate 101. The stop layer may have a thickness between about 1 nm and about 50 nm. The stop layer may be formed of, for example, silicon germanium, silicon oxide, silicon germanium oxide, silicon phosphide, or silicophosphates.

With reference to FIGS. 1 and 2, in the embodiment depicted, the plurality of fins 103 may be disposed on the substrate 101. The plurality of fins 103 may provide active regions for the semiconductor device 100 in which channels are formed according to voltages applied to the plurality of gate structures 113. From a top-view perspective, each of the plurality of fins 103 may extend along a first direction X. From a top-view perspective, the plurality of fins 103 may be spaced apart from each other along a second direction Y crossing the first direction X. From a cross-sectional perspective, each of the plurality of fins 103 may have a plurality of protruding portions protruding from the substrate 101 in the direction Z perpendicular to the first direction X and the second direction Y. The plurality of fins 103 may be formed of, for example, silicon, silicon carbide, germanium silicon germanium, gallium arsenic, indium arsenide, indium, or other semiconductor materials including group III, group IV, or group V elements. For convenience of description, only one fin 103 is described. It should be understood that where attributes of one fin 103 are described, embodiments based on a plurality of fins 103 may have the same attributes for each of the plurality of fins 103.

It should be noted that the plurality of fins 103 include three fins, but the number of fins 103 is not limited thereto. For example, the number of the fins 103 may be less than three or greater than three.

Alternatively, in another embodiment, the semiconductor device may include a plurality of nanowires instead of the plurality of fins 103 to provide active regions.

A plurality of isolation layers (not shown in FIG. 2) may be optionally disposed on the substrate 101 and between the plurality of fins 103. The plurality of isolation layers may be disposed between adjacent pairs of the plurality of fins 103 and isolate the plurality of fins 103 from each other to prevent electrical leakage between adjacent semiconductor components. The plurality of isolation layers may be formed of, for example, silicon nitride, silicon oxide, silicon oxynitride, or silicon nitride oxide.

It should be noted that, in the present disclosure, silicon oxynitride refers to a substance which contains silicon, nitrogen and oxygen and in which a proportion of oxygen is greater than that of nitrogen. Silicon nitride oxide refers to a substance which contains silicon, oxygen and nitrogen and in which a proportion of nitrogen is greater than that of oxygen.

With reference to FIGS. 1 and 2, in the embodiment depicted, each of the pairs of source/drain regions may include a source region 105 and a drain region 107. The source region 105 and the drain region 107 may be respectively correspondingly disposed on two sides, parallel to an YZ plane, of the protruding portion of the fin 103. Top surfaces of the source region 105 and the drain region 107 may be even with a top surface of the protruding portion of the fin 103. The source region 105 and the drain region 107 may doped with a dopant such as phosphorus, arsenic, antimony, or boron.

A plurality of silicide layers (not shown in FIG. 2) may be optionally disposed on the pairs of source/drain regions. The plurality of silicide layers may be formed of, for example, titanium silicide, nickel silicide, nickel platinum silicide, tantalum silicide, or cobalt silicide. The plurality of silicide layers may serve to reduce contact resistance between the pairs of source/drain regions and the bit line contact 143, as described below.

With reference to FIGS. 1 and 2, in the embodiment depicted, the first insulating layer 111 may be disposed over the substrate and may cover the plurality of fins 103 and the pairs of source/drain regions. The first insulating layer 111 may also enclose the gate structure 113 and the two gate spacers 109, as described below. The first insulating layer 111 may be formed of, for example, silicon oxynitride, silicon nitride oxide, silicon carbon, silicon oxide, or silicon nitride. Alternatively, in another embodiment, the first insulating layer 111 may be formed of, for example, a low-k dielectric material having atoms of Si, C, O, B, P, N, or H. For example, the dielectric constant of the low-k dielectric material may be between about 2.4 and about 3.5 depending upon mole fractions of the aforementioned atoms.

With reference to FIGS. 1 and 2, in the embodiment depicted, the plurality of gate structures 113 may be disposed on the plurality of fins 103. Each of the plurality of gate structures 113 may extend along the second direction Y. In other words, the plurality of gate structures 113 may intersect the plurality of fins 103 from a top-view perspective. In addition, the plurality of gate structures 113 may be disposed on sides, parallel to an XZ plane, of the protruding portions of the plurality of fins 103 from a cross-sectional perspective (not shown in FIG. 2). From a top-view perspective, the plurality of gate structures 113 may be spaced apart from each other along the first direction X. For convenience of description, only one gate structure 113 is described. It should be understood that where attributes of one gate structure 113 are described, embodiments based on a plurality of gate structures 113 may have the same attributes for each of the plurality of gate structures 113. The gate structure 113 may include a gate insulating layer 115, a gate conductive layer 117, and a gate filler layer 119.

With reference to FIGS. 1 and 2, in the embodiment depicted, the gate insulating layer 115 may have a U-shaped cross-sectional profile. The gate insulating layer 115 may be disposed on the top surface of the protruding portion of the fin 103. The gate insulating layer 115 may have a thickness between about 0.5 nm and about 5.0 nm. In some embodiments, the thickness of the gate insulating layer 115 may be between about 0.5 nm and about 2.5 nm. The gate insulating layer 115 may be formed of, for example, a high-k dielectric material such as metal oxide, metal nitride, metal silicate, transition metal-oxide, transition metal-nitride, transition metal-silicate, oxynitride of metal, metal aluminate, zirconium silicate, zirconium aluminate, or a combination thereof. Specifically, the gate insulating layer 115 may be formed of hafnium oxide, hafnium silicon oxide, hafnium silicon oxynitride, hafnium tantalum oxide, hafnium titanium oxide, hafnium zirconium oxide, hafnium lanthanum oxide, lanthanum oxide, zirconium oxide, titanium oxide, tantalum oxide, yttrium oxide, strontium titanium oxide, barium titanium oxide, barium zirconium oxide, lanthanum silicon oxide, aluminum silicon oxide, aluminum oxide, silicon nitride, silicon oxynitride, silicon nitride oxide, or a combination thereof. In other embodiments, the gate insulating layer 115 may be a multilayer structure that includes, for example, one layer of silicon oxide and another layer of high-k dielectric material.

With reference to FIGS. 1 and 2, in the embodiment depicted, the gate conductive layer 117 may have a U-shaped cross-sectional profile. The gate conductive layer 117 may be disposed on the gate insulating layer 115. The gate conductive layer 117 may have a thickness between about 10 angstroms and about 200 angstroms. Top surfaces of the gate conductive layer 117 may be at a same vertical level as the top surfaces of the gate insulating layer 115. In some embodiments, the gate conductive layer 117 may be a single layer formed of, for example, aluminum, silver, titanium, titanium nitride, titanium aluminum, titanium carbide aluminum, titanium nitride aluminum, titanium silicon aluminum, tantalum nitride, tantalum carbide, tantalum silicon nitride, manganese, zirconium, or tungsten nitride, or ruthenium. In some embodiments, the gate conductive layer 117 may be a multilayer formed of one or more of the materials mentioned above. In some embodiments, the gate conductive layer 117 may be formed of, for example, a conductive material such as polycrystalline silicon, polycrystalline silicon germanium, metal nitride, metal silicide, metal oxide, metal, or a combination thereof. Metal nitride may be, for example, tungsten nitride, molybdenum nitride, titanium nitride or tantalum nitride. Metal silicide may be, for example, tungsten silicide, titanium silicide, cobalt silicide, nickel silicide, platinum silicide or erbium silicide. Metal oxide may be, for example, ruthenium oxide or indium tin oxide. Metal may be, for example, tungsten, titanium, aluminum, copper, molybdenum, nickel or platinum. The gate conductive layer 117 may serve to adjust a work function of the gate structure 113.

With reference to FIGS. 1 and 2, in the embodiment depicted, the gate filler layer 119 may be disposed on the gate conductive layer 117. A top surface of the gate filler layer 119 may be at a same vertical level as the top surfaces of the gate conductive layer 117. The gate filler layer 119 may be formed of, for example, tungsten or aluminum. The gate filler layer 119 may serve to fill a space formed by the gate conductive layer 117.

With reference to FIGS. 1 and 2, in the embodiment depicted, the two gate spacers 109 may be disposed on two sides, parallel to the YZ plane, of the gate structure 113 and respectively correspondingly disposed on the source region 105 and the drain region 107. The two gate spacers 109 may be formed of, for example, silicon oxide, silicon oxynitride, silicon nitride oxide, or silicon nitride. The two gate spacers 109 may insulate the gate structure 113 from neighboring conductive elements.

With reference to FIGS. 1 and 2, in the embodiment depicted, the second insulating layer 121 may be disposed on the first insulating layer 111, the two gate spacers 109, and the gate structure 113. The second insulating layer 121 may be formed of a same material as the first insulating layer 111, but is not limited thereto. In some embodiments, the second insulating layer 121 may be formed of an extremely low-k dielectric material with a dielectric constant of less than 2.0. The storage node contact 123 may be disposed so as to penetrate the second insulating layer 121 and the first insulating layer 111. The storage node contact 123 may be disposed on the drain region 107 and electrically coupled to the drain region 107. The storage node contact 123 may be formed of, for example, tungsten, copper, cobalt, ruthenium, or molybdenum.

With reference to FIGS. 1 and 2, from a cross-sectional perspective, the storage structure 125 may be disposed on the second insulating layer 121 and on the storage node contact 123. The storage structure 125 may be adjacent to the gate structure 113. Specifically, the storage structure 125 may be disposed at a vertical level slightly higher than a vertical level of the gate structure 113 and may be offset from the gate structure 113. A difference between the vertical level of the storage structure 125 and the vertical level of the gate structure 113 may be less than 0.5 micrometers. It should be noted that the storage structure 125 is not formed at the back end of line (BEOL) stage. From a top-view perspective, the storage structure 125 may be disposed between an adjacent pair of the plurality of gate structures 113. The plurality of storage structures 125 disposed along a line parallel to the second direction Y may be discrete. The storage structure 125 may be electrically coupled to the storage node contact 123. The storage structure 125 may include a bottom electrode 127, a bottom ferromagnetic layer 129, a tunnel barrier layer 131, a top ferromagnetic layer 133, and a top electrode 135, serving as a magnetic random access memory (MRAM).

In some embodiments, the storage structure 125 serves as dynamic random access memory (DRAM), comprising a bottom conductive layer 129 positioned above the drain region 107, a dielectric layer 131 positioned on the bottom conductive layer 129, and a top conductive layer 133 positioned on the dielectric layer 131.

With reference to FIGS. 1 and 2, in the embodiment depicted, the bottom electrode 127 may be disposed on the second insulating layer 121 and on the storage node contact 123. The bottom electrode 127 may have a thickness between about 10 nanometers and about 100 nanometers. The bottom electrode 127 may be electrically coupled to the storage node contact 123. The bottom electrode 127 may be formed of, for example, titanium nitride, tantalum nitride, titanium, tantalum, or a combination thereof.

With reference to FIGS. 1 and 2, in the embodiment depicted, the bottom ferromagnetic layer 129 may be disposed on the bottom electrode 127. The bottom ferromagnetic layer 129 may have a variable magnetic polarity. The bottom ferromagnetic layer 129 may have a thickness between about 8 angstroms and about 13 angstroms. The bottom ferromagnetic layer 129 may have a width less than a width of the bottom electrode 127. The bottom ferromagnetic layer 129 may be formed of, for example, iron-platinum (FePt) or alloy of cobalt, iron, and boron (CoFeB). The variable magnetic polarity may switch between a first state and a second state to respectively represent a binary "0" and a binary "1." In some embodiments, the width of the bottom ferromagnetic layer 129 may be equal to the width of the bottom electrode 127.

With reference to FIGS. 1 and 2, in the embodiment depicted, the tunnel barrier layer 131 may be disposed on the bottom ferromagnetic layer 129. The tunnel barrier layer 131 may have a thickness between about 0.5 nanometer and about 2.0 nanometers. The tunnel barrier layer 131 may be formed of, for example, magnesium oxide or aluminum oxide. The tunnel barrier layer 131 may electrically isolate the top ferromagnetic layer 133 and the bottom ferromagnetic layer 129, while still allowing electrons to tunnel through the tunnel barrier layer 131 under proper conditions.

With reference to FIGS. 1 and 2, in the embodiment depicted, the top ferromagnetic layer 133 may be disposed on the tunnel barrier layer 131. The top ferromagnetic layer 133 may have a fixed magnetic polarity. The top ferromagnetic layer 133 may be a single layer or a multilayer formed of, for example, cobalt, nickel, or ruthenium. An anti-ferromagnetic layer may be disposed between the top ferromagnetic layer 133 and the tunnel barrier layer 131. The anti-ferromagnetic layer may constrain the top ferromagnetic layer 133 to a permanent or fixed magnetic polarity. In some embodiments, a width of the top ferromagnetic layer 133 may be equal to the width of the bottom ferromagnetic layer 129. In some embodiments, the width of the top ferromagnetic layer 133 may be less than the width of the bottom ferromagnetic layer 129. The greater width of the bottom ferromagnetic layer 129 may minimize a stray field impact of the top ferromagnetic layer 133 on the bottom ferromagnetic layer 129.

With reference to FIGS. 1 and 2, in the embodiment depicted, the top electrode 135 may be disposed on the top ferromagnetic layer 133. The top electrode 135 may have a thickness between about 10 nanometers and about 100 nanometers. The top electrode 135 may be formed of, for example, titanium nitride, tantalum nitride, titanium, tantalum, or a combination thereof. The top electrode 135, the top ferromagnetic layer 133, the tunnel barrier layer 131, and the bottom ferromagnetic layer 129 may have a same width.

During operation, the variable magnetic polarity of the bottom ferromagnetic layer 129 may be determined by measuring the resistance of the storage structure 125. Due to the magnetic tunnel effect, the resistance of the storage structure 125 may change with the variable magnetic polarity. Specifically, the variable magnetic polarity may be changed or toggled by the spin-transfer torque effect. According to the spin-transfer torque effect, a current may be passed across the storage structure 125 to induce a flow of electrons from the top ferromagnetic layer 133 (fixed magnetic polarity) to the bottom ferromagnetic layer 129 (variable magnetic polarity). As electrons pass through the top ferromagnetic layer 133, the spins of the electrons are polarized. When the spin-polarized electrons reach the bottom ferromagnetic layer 129, the spin-polarized electrons apply a torque to the variable magnetic polarity and toggle the state of the variable magnetic polarity. Alternative approaches to determining or changing the variable magnetic polarity are also within the scope of the present disclosure. In some embodiments, magnetic polarities of the bottom ferromagnetic layer 129 and the top ferromagnetic layer 133 are perpendicular to an interface between the tunnel barrier layer 131, and the top ferromagnetic layer 133 or the bottom ferromagnetic layer 129, making the storage structure 125 a perpendicular magnetic tunnel junction.

With reference to FIGS. 1 and 2, in the embodiment depicted, the two storage spacers 137 may be disposed on two sides of the top electrode 135, two sides of the top ferromagnetic layer 133, two sides of the tunnel barrier layer 131, and two sides of the bottom ferromagnetic layer 129. The two storage spacers 137 may be disposed on the bottom electrode 127. The two storage spacers 137 may be formed of, for example, silicon oxide, silicon oxynitride, silicon nitride oxide, or silicon nitride. The two storage spacers 137 may electrically isolate the top electrode 135, the top ferromagnetic layer 133, the tunnel barrier layer 131, and the bottom ferromagnetic layer 129 from neighboring conductive elements. A protection layer (not shown in FIG. 2) may be optionally disposed so as to cover sides of the bottom electrode 127, sides of the two storage spacers 137, top surfaces of the two storage spacers 137, and a top surface of the top electrode 135 to protect the storage structure 125 from damage during subsequent semiconductor processes.

With reference to FIGS. 1 and 2, in the embodiment depicted, the third insulating layer 139 may be disposed on the second insulating layer 121 and may enclose the storage structure 125 and the two storage spacers 137. A top surface of the third insulating layer 139 may be even with the top surfaces of the two storage spacers 137 or the top surface of the top electrode 135. The third insulating layer 139 may be formed of a same material as the first insulating layer 11, but is not limited thereto. The fourth insulating layer 141 may be disposed on the third insulating layer 139, the two storage spacers 137, and the top electrode 135. The fourth insulating layer 141 may be formed of a same material as the first insulating layer 111, but is not limited thereto. The bit line contact 143 may be disposed so as to penetrate the fourth insulating layer 141, the third insulating layer 139, the second insulating layer 121, and the first insulating layer 111. The bit line contact 143 may be disposed on the source region 105 and may be electrically coupled to the source region 105. The bit line contact 143 may be formed of, for example, a conductive material such as doped polysilicon, metal, or metal nitride. The metal may be aluminum, copper, tungsten, or cobalt.

Referring to FIG. 1 and FIG. 2, in some embodiments, the plurality of gate structures 113 extend along one direction (the direction Y in FIG. 1), and the plurality of storage structures 125 are separated along the direction and positioned between two adjacent gate structures 113 along another direction (the direction X in FIG. 1). In some embodiments, the gate structures 113 have flat top surfaces; in addition, the gate structures 113 have protrusions towards the substrate 101 between two adjacent fins 103.

With reference to FIG. 3, the gate structure 113 may be electrically coupled to a word line WL for cell selection. The pair of source/drain regions may be electrically coupled to a source line SL, the storage structure 125, and a bit line BL. The storage structure 125 may be used to store data.

It should be noted that the terms "forming," "formed" and "form" may mean and include any method of creating, building, patterning, implanting, or depositing an element, a dopant or a material. Examples of forming methods may include, but are not limited to, atomic layer deposition, chemical vapor deposition, physical vapor deposition, sputtering, co-sputtering, spin coating, diffusing, depositing, growing, implantation, photolithography, dry etching and wet etching.

Figure 4:
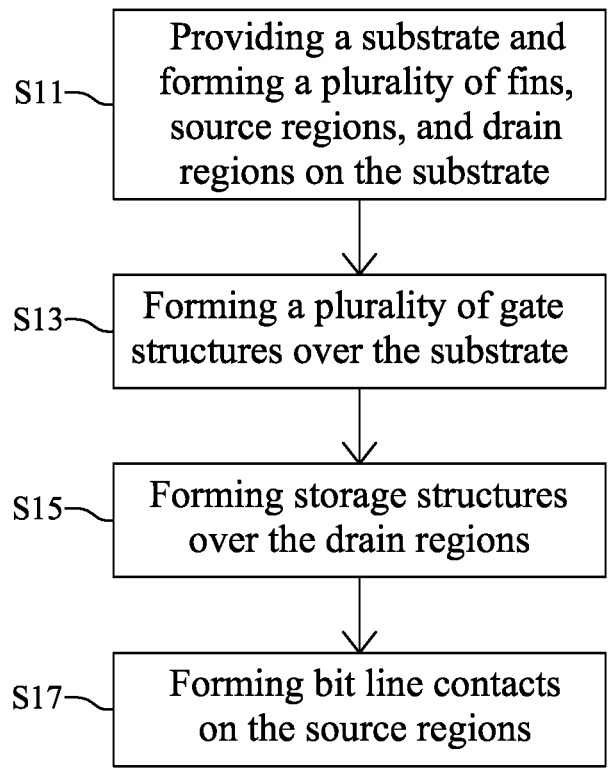
FIG. 4 illustrates, in a flowchart diagram form, a method for fabricating a semiconductor device in accordance with one embodiment of the present disclosure.
Figure 5:
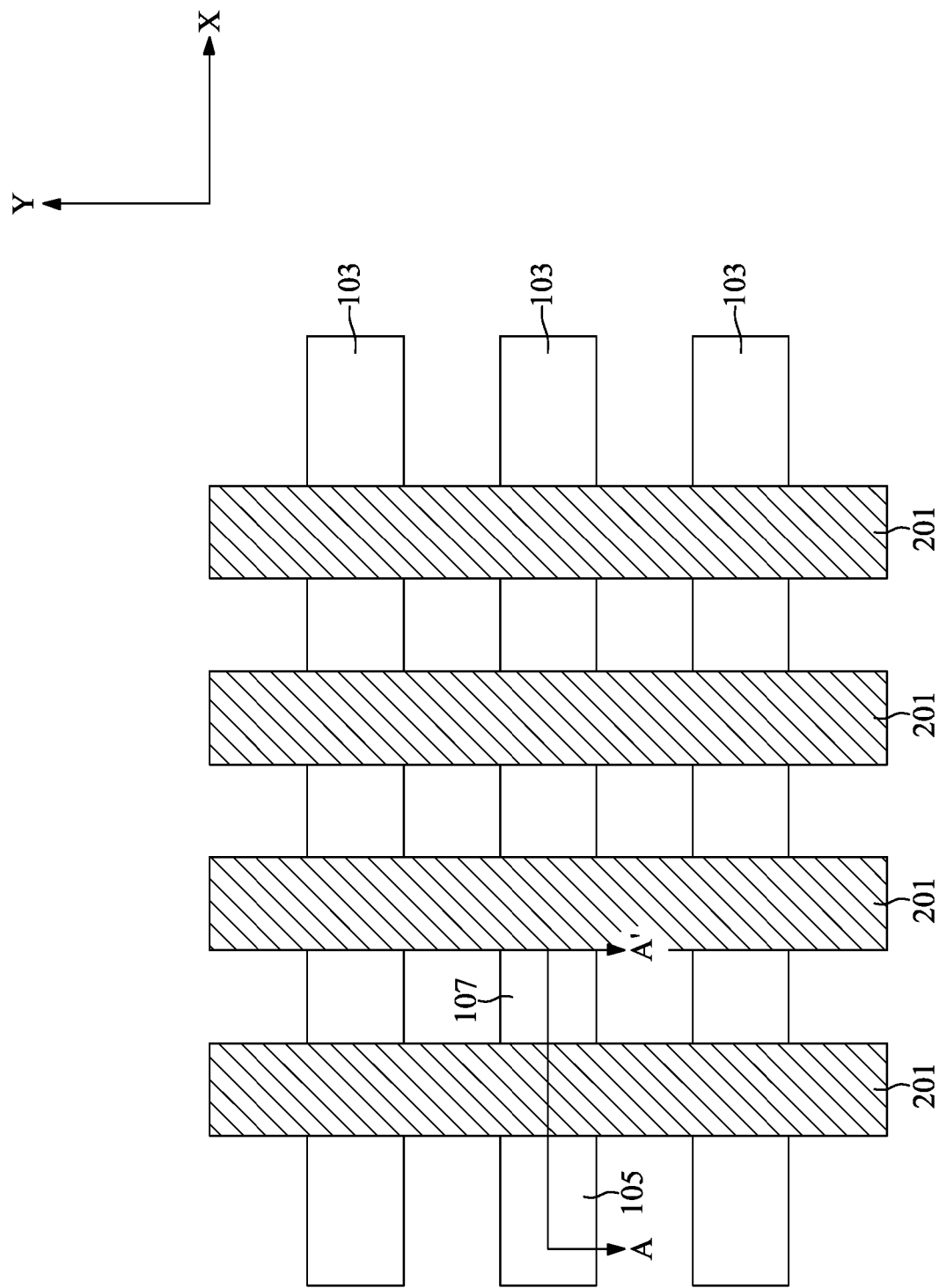
FIG. 5 illustrates, in a schematic top-view diagram, an intermediate semiconductor device in accordance with one embodiment of the present disclosure.
Figure 6:
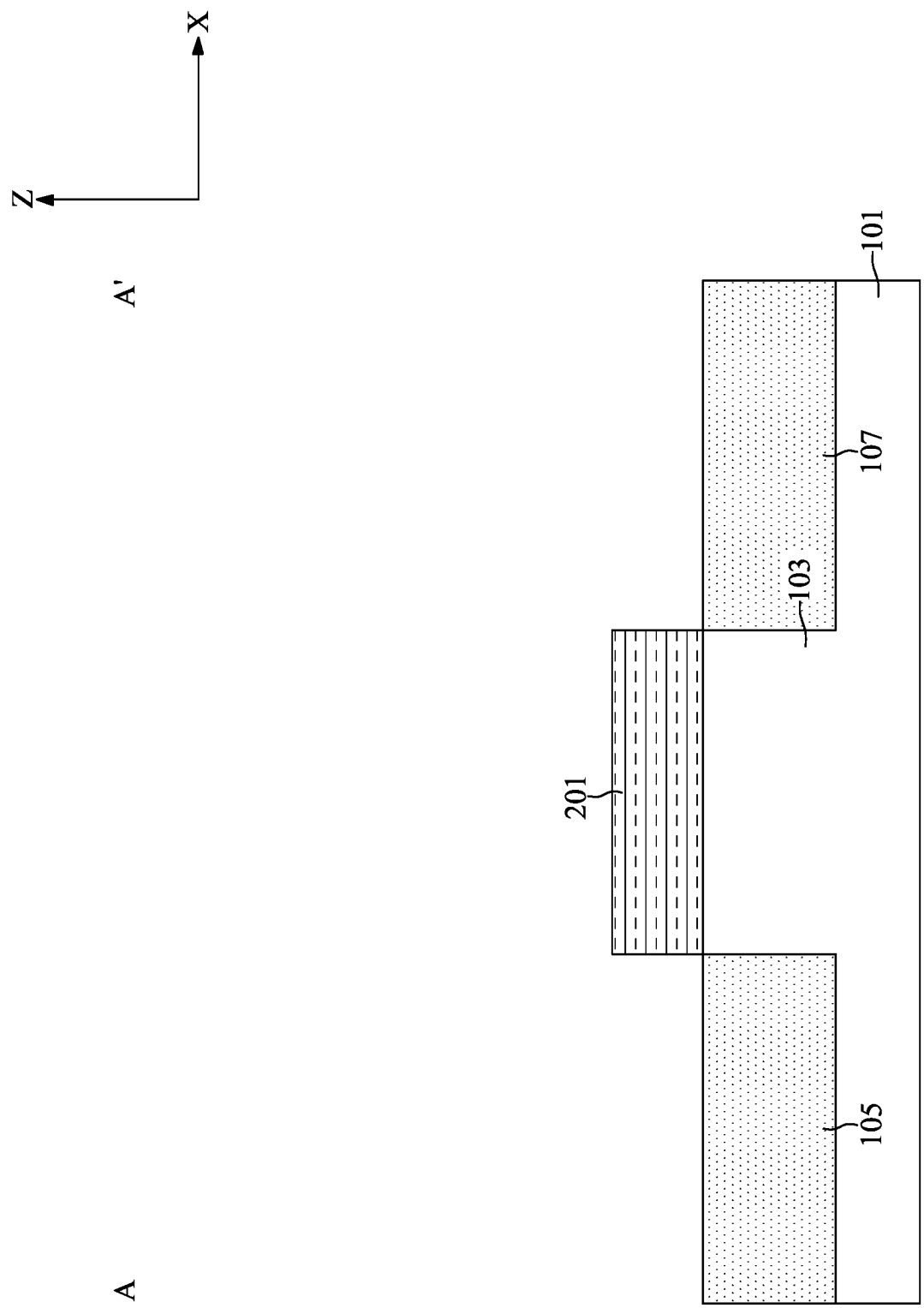
FIG. 6 is a schematic cross-sectional view diagram taken along a line A-A' in FIG. 5.

FIG. 4 illustrates, in a flowchart diagram form, a method 10 for fabricating a semiconductor device 100 in accordance with one embodiment of the present disclosure. FIG. 5 illustrates, in a schematic top-view diagram, an intermediate semiconductor device in accordance with one embodiment of the present disclosure. FIG. 6 is a schematic cross-sectional view diagram taken along a line A-A' in FIG. 5. Some elements of the intermediate semiconductor device are not shown in FIG. 5 for clarity.

With reference to FIGS. 4 to 6, at step S11, in the embodiment depicted, a substrate 101 may be provided, and a plurality of fins 103, source regions 105, and drain regions 107 may be formed on the substrate 101. A semiconductor layer (not shown) may be formed on the substrate 101. A photolithography-etch process may be performed to etch the semiconductor layer until a top surface of the substrate 101 is exposed to form the plurality of fins 103 extending along a first direction X. A plurality of first mask layers 201 may be formed over the plurality of fins 103 and the substrate 101. The plurality of first mask layers 201 may be formed so as to extend along a second direction Y. An implantation process may be performed to implant dopants such as phosphorus, arsenic, antimony, or boron into both sides of the plurality of first mask layers 201 and turn portions of the plurality of fins 103 into the source regions 105 and the drain regions 107. After the implantation process, the plurality of first mask layers 201 may be removed. In some embodiments, portions of the plurality of fins 103 may be removed and the source regions 105 and the drain regions 107 may be formed at the places previously occupied by the removed portions of the plurality of fins 103.

Figure 7:
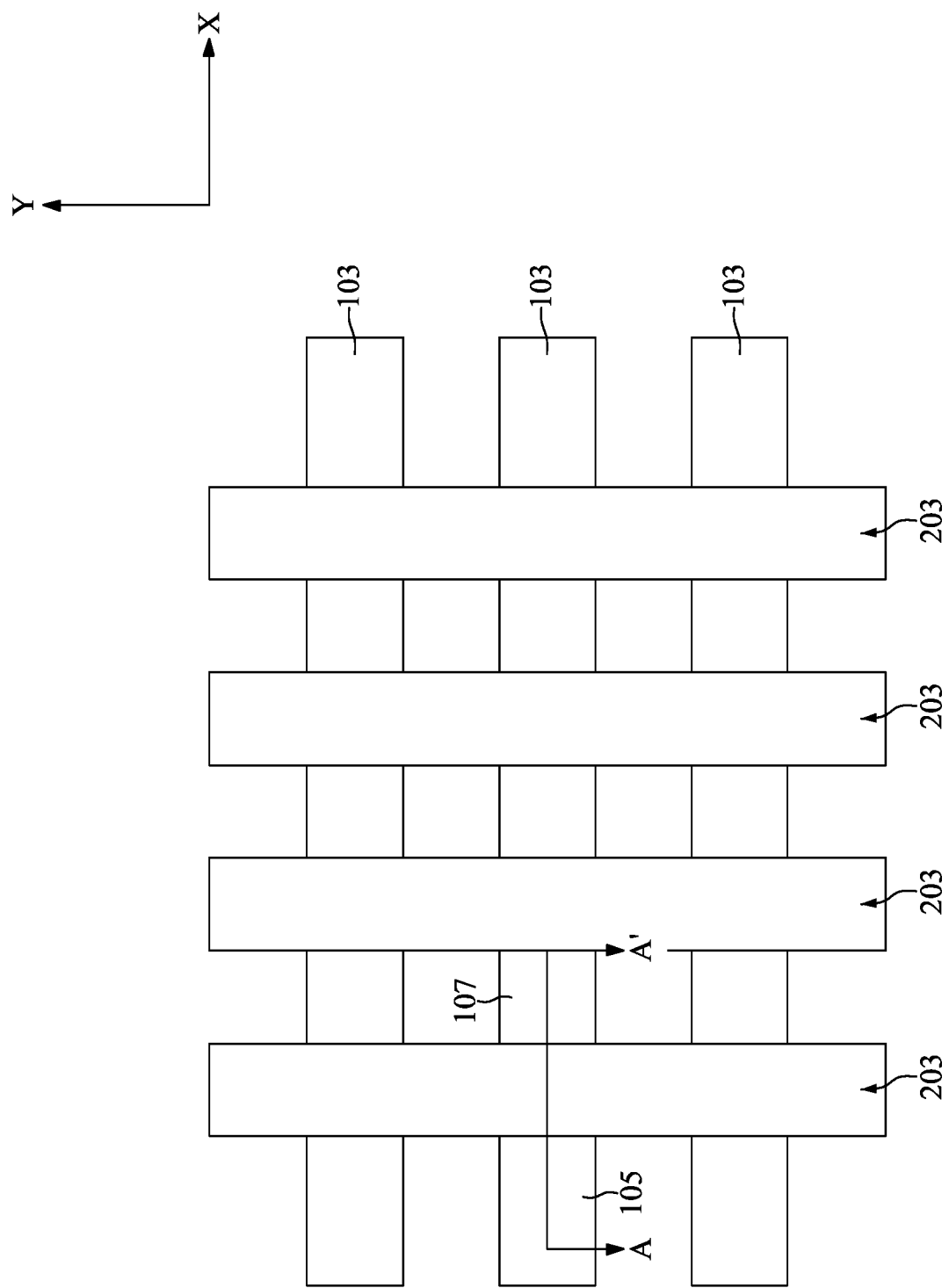
FIG. 7 illustrates, in a schematic top-view diagram, an intermediate semiconductor device in accordance with one embodiment of the present disclosure.
Figure 8:
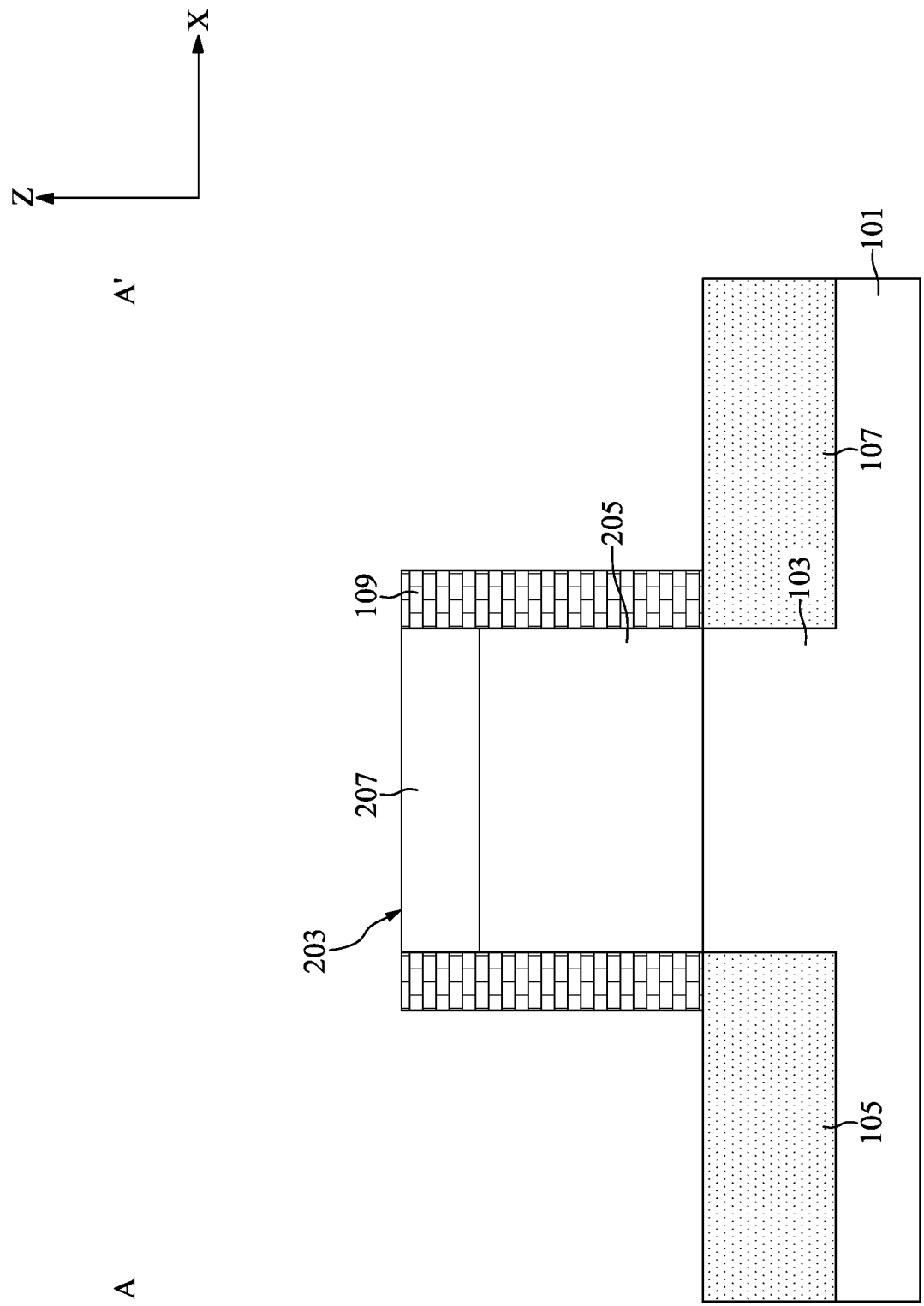
FIG. 8 is a schematic cross-sectional view diagram taken along a line A-A' in FIG. 7.

FIG. 7 illustrates, in a schematic top-view diagram, an intermediate semiconductor device in accordance with one embodiment of the present disclosure. FIG. 8 is a schematic cross-sectional view diagram taken along a line A-A' in FIG. 7. FIGS. 9 to 13 are schematic cross-sectional view diagrams taken along the line A-A' in FIG. 7 illustrating part of a flow for fabricating the semiconductor device in accordance with one embodiment of the present disclosure. Some elements of the intermediate semiconductor device are not shown in FIG. 7 for clarity.

With reference to FIG. 4 and FIGS. 7 to 13, at step S13, in the embodiment depicted, a plurality of gate structures 113 may be formed over the substrate 101. With reference to FIG. 8, a plurality of dummy gate structures 203 may be formed on and over the plurality of fins 103 and the substrate 101. The plurality of dummy gate structures 203 may be formed so as to extend along the second direction Y. For convenience of description, only one dummy gate structure 203 is described. The dummy gate structure 203 may include a bottom sacrificial layer 205 and a top sacrificial layer 207. The bottom sacrificial layer 205 may be formed over the plurality of fins 103 and the substrate 101 and may extend along the second direction Y. The bottom sacrificial layer 205 may be formed of, for example, polysilicon. The top sacrificial layer 207 may be formed on the bottom sacrificial layer 205. The top sacrificial layer 207 may be formed of, for example, silicon nitride, silicon oxynitride, silicon nitride oxide, or silicon oxide. The top sacrificial layer 207 may serve as a protection layer to prevent the underlying bottom sacrificial layer 205 from being damaged during subsequent semiconductor processes.

With reference to FIG. 8, a layer of insulating material may be formed over the intermediate semiconductor. The insulating material may be silicon nitride, silicon oxynitride, silicon nitride oxide, or silicon oxide. An etch process, such as an anisotropic dry etch process, may be performed to remove portions of the layer of insulating material and concurrently form two gate spacers 109 on two sides of the dummy gate structure 203.

Figure 9:
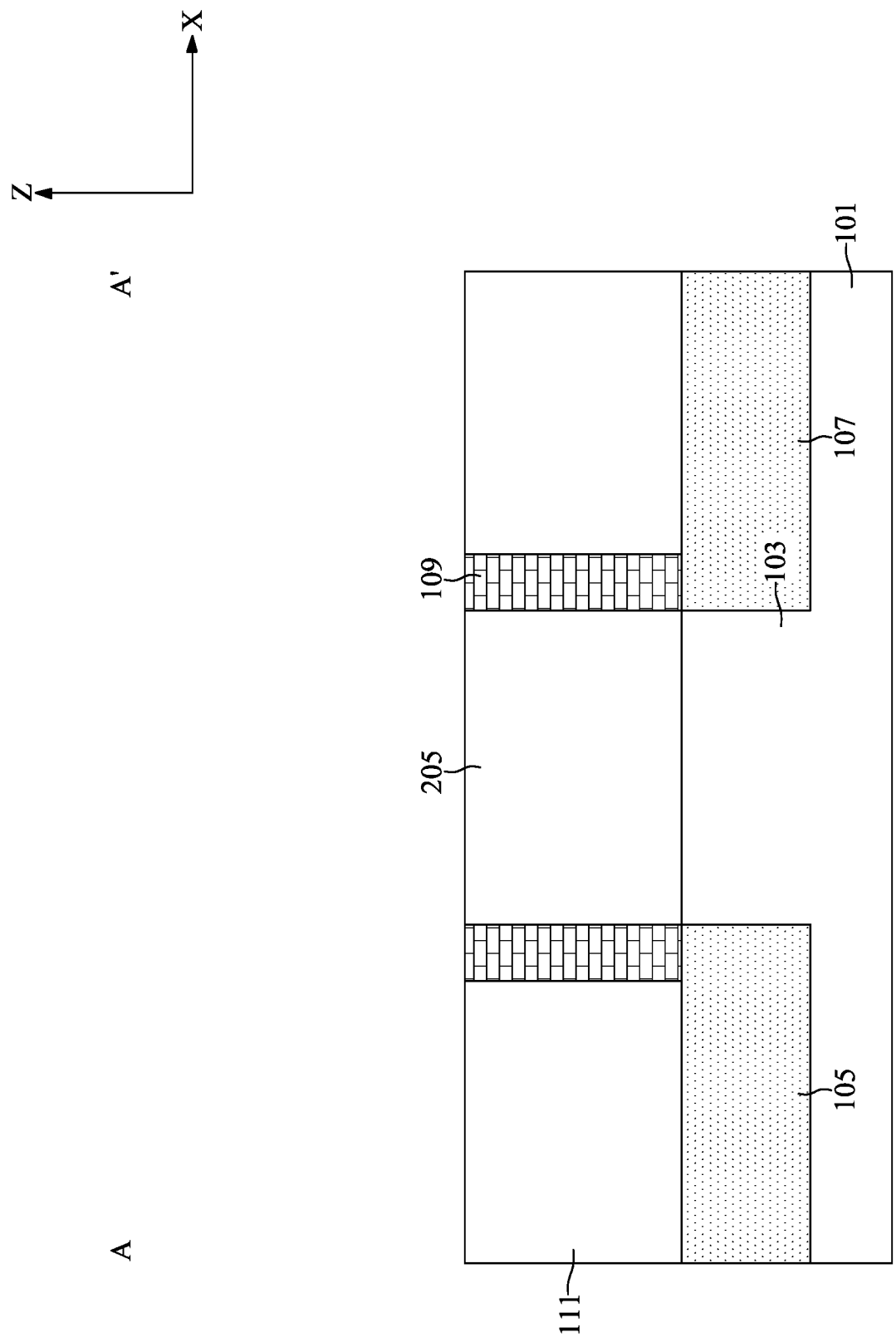
FIGS. 9 to 19 are schematic cross-sectional view diagrams taken along the line A-A' in FIG. 7 illustrating part of a flow for fabricating the semiconductor device in accordance with one embodiment of the present disclosure.

With reference to FIG. 9, a layer of insulating material may be formed over the intermediate semiconductor. The insulating material may be silicon oxynitride, silicon nitride oxide, silicon carbon, silicon oxide, or silicon nitride. Alternatively, the insulating material may be a low-k dielectric material. A planarization process, such as chemical mechanical polishing, may be performed until a top surface of the bottom sacrificial layer 205 is exposed to remove excess material, provide a substantially flat surface for subsequent processing steps, and concurrently form a first insulating layer 111.

Figure 10:
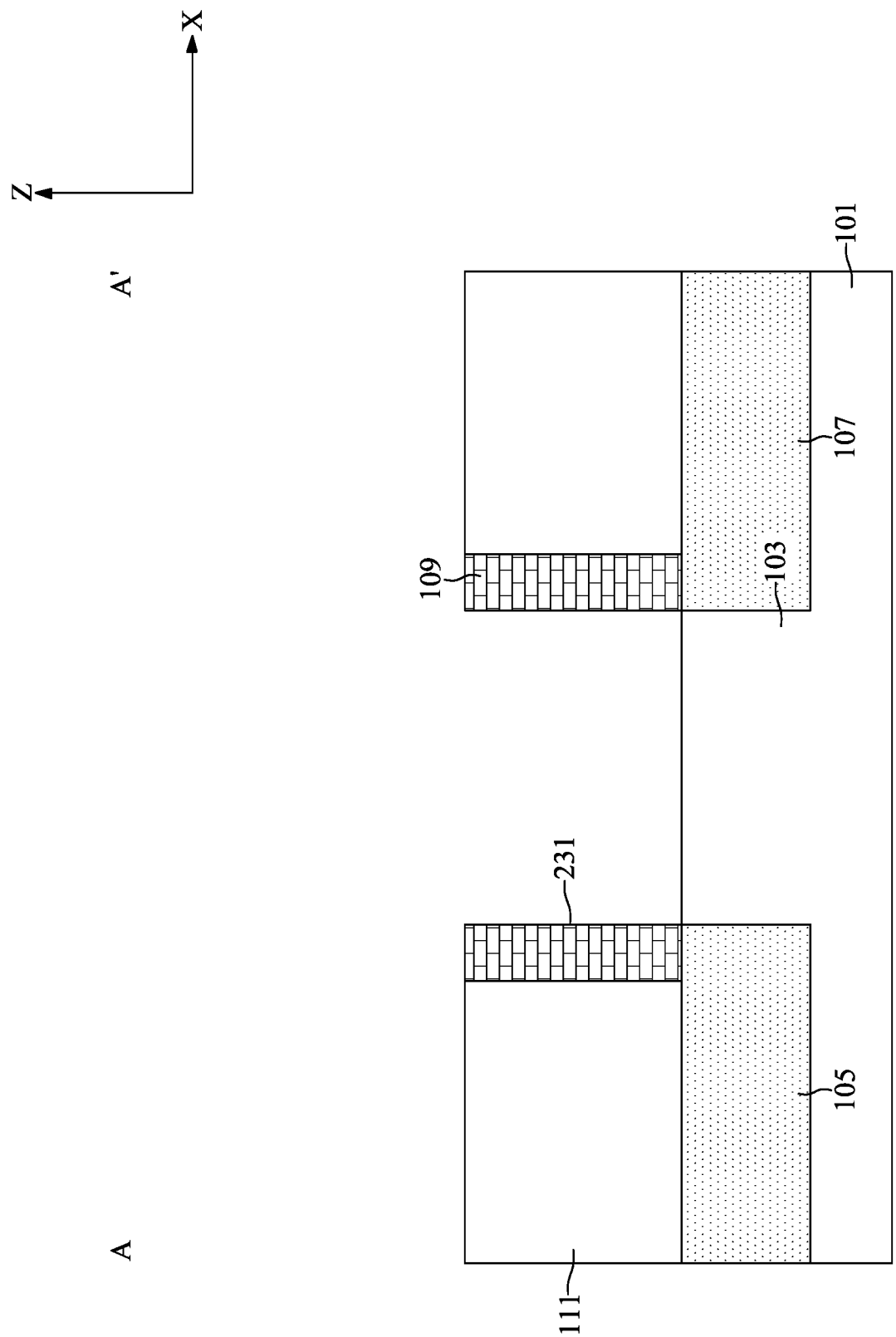

With reference to FIG. 10, an etch process, such as a wet etch process, may be performed to remove the bottom sacrificial layer 205 and concurrently form a first trench 231 in the place previously occupied by the bottom sacrificial layer 205.

Figure 11:
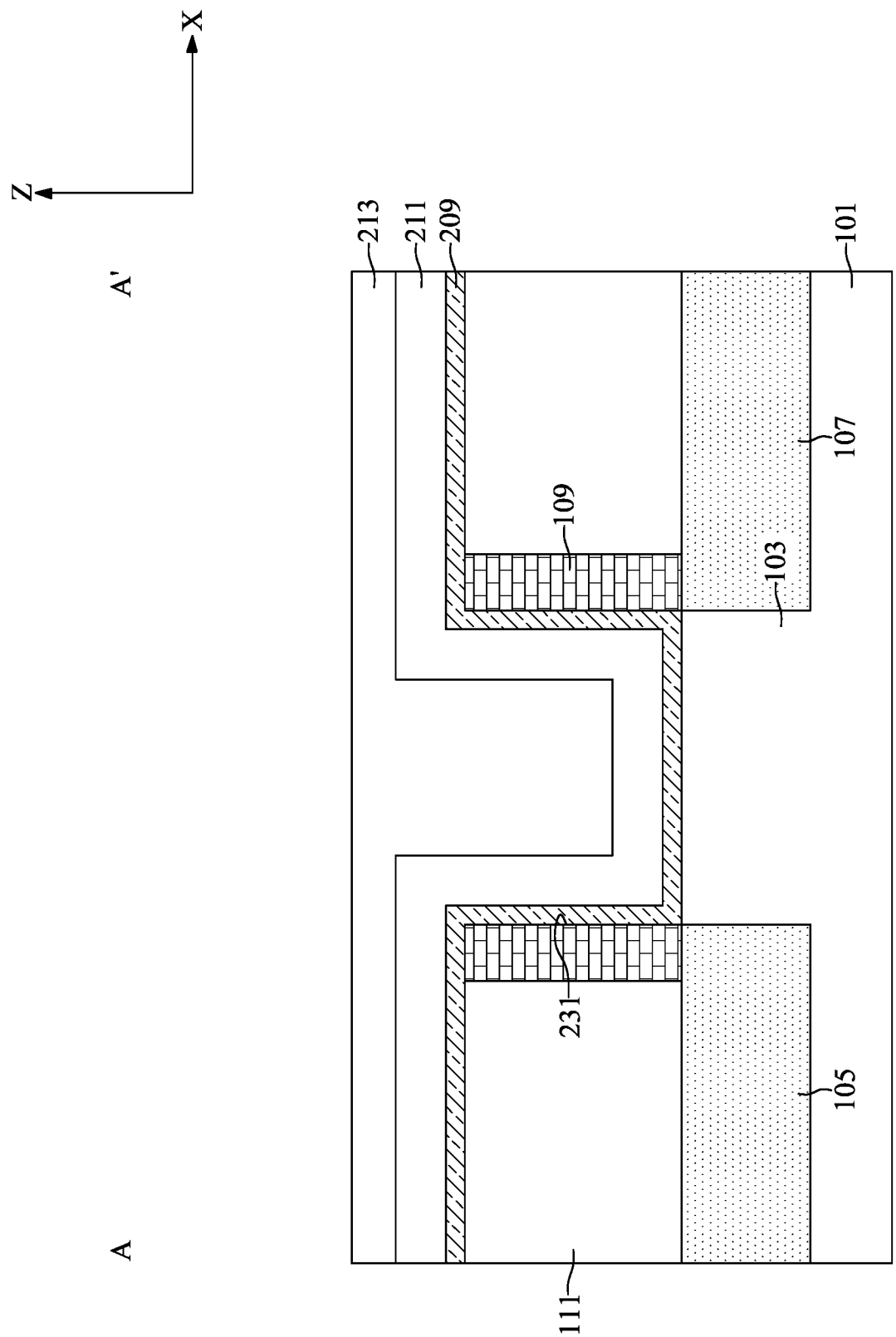

With reference to FIG. 11, a layer of first insulating material 209, a layer of first conductive material 211, and a layer of second conductive material 213 may be sequentially formed in the first trench 231, and over the two gate spacers 109 and the first insulating layer 111. The first insulating material 209 may be a high-k dielectric material. The first conductive material 211 may be aluminum, silver, titanium, titanium nitride, titanium aluminum, titanium carbide aluminum, titanium nitride aluminum, titanium silicon aluminum, tantalum nitride, tantalum carbide, tantalum silicon nitride, manganese, zirconium, tungsten nitride, or ruthenium. The second conductive material 213 may be aluminum or tungsten.

Figure 12:
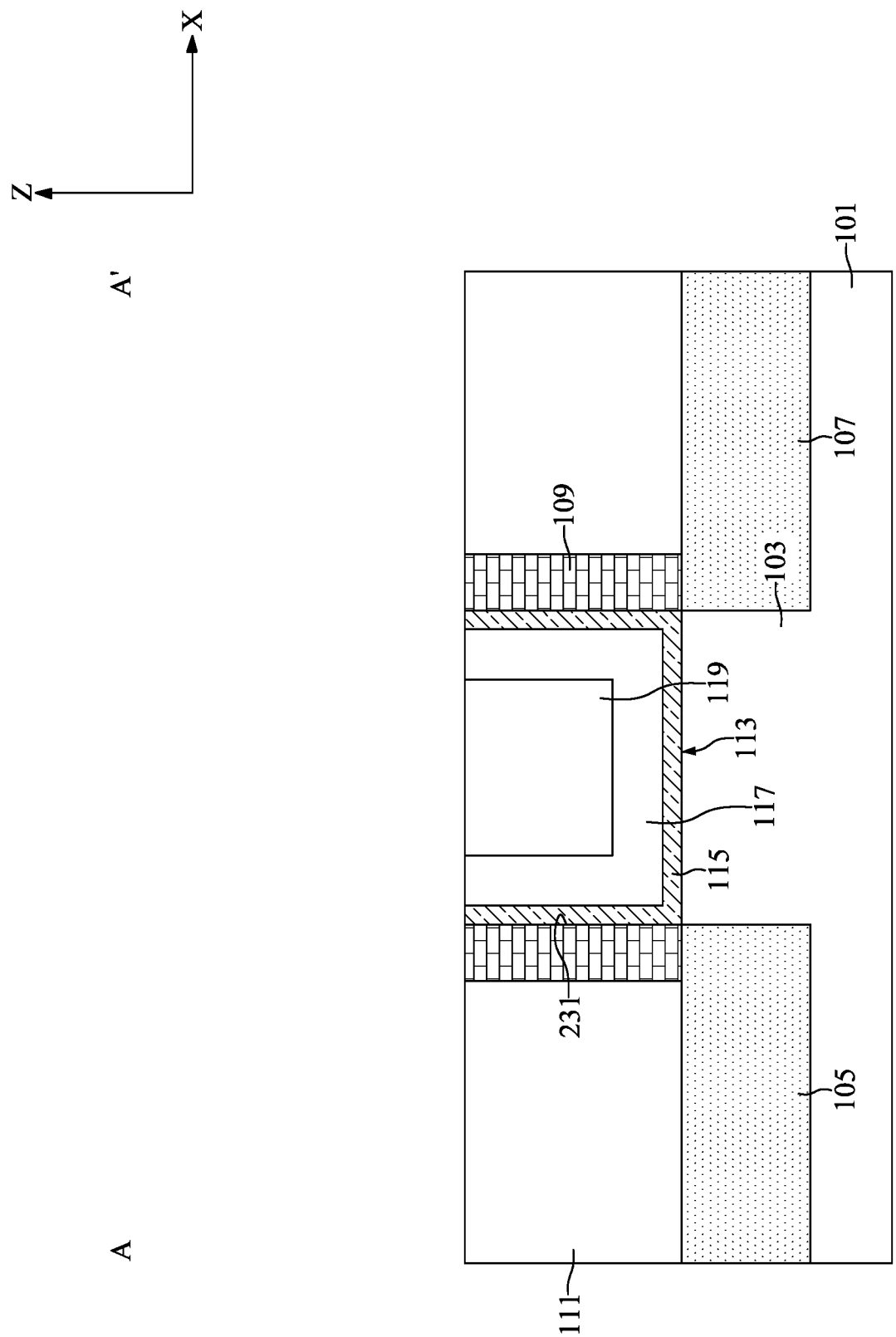

With reference to FIG. 12, a planarization process, such as chemical mechanical polishing, may be performed until a top surface of the first insulating layer 111 is exposed to turn the layer of first insulating material 209 into a gate insulating layer 115, the layer of first conductive material 211 into a gate conductive layer 117, and the layer of second conductive material 213 into the gate filler layer 119. The gate insulating layer 115, the gate conductive layer 117, and the gate filler layer 119 together form the gate structure 113.

Figure 13:
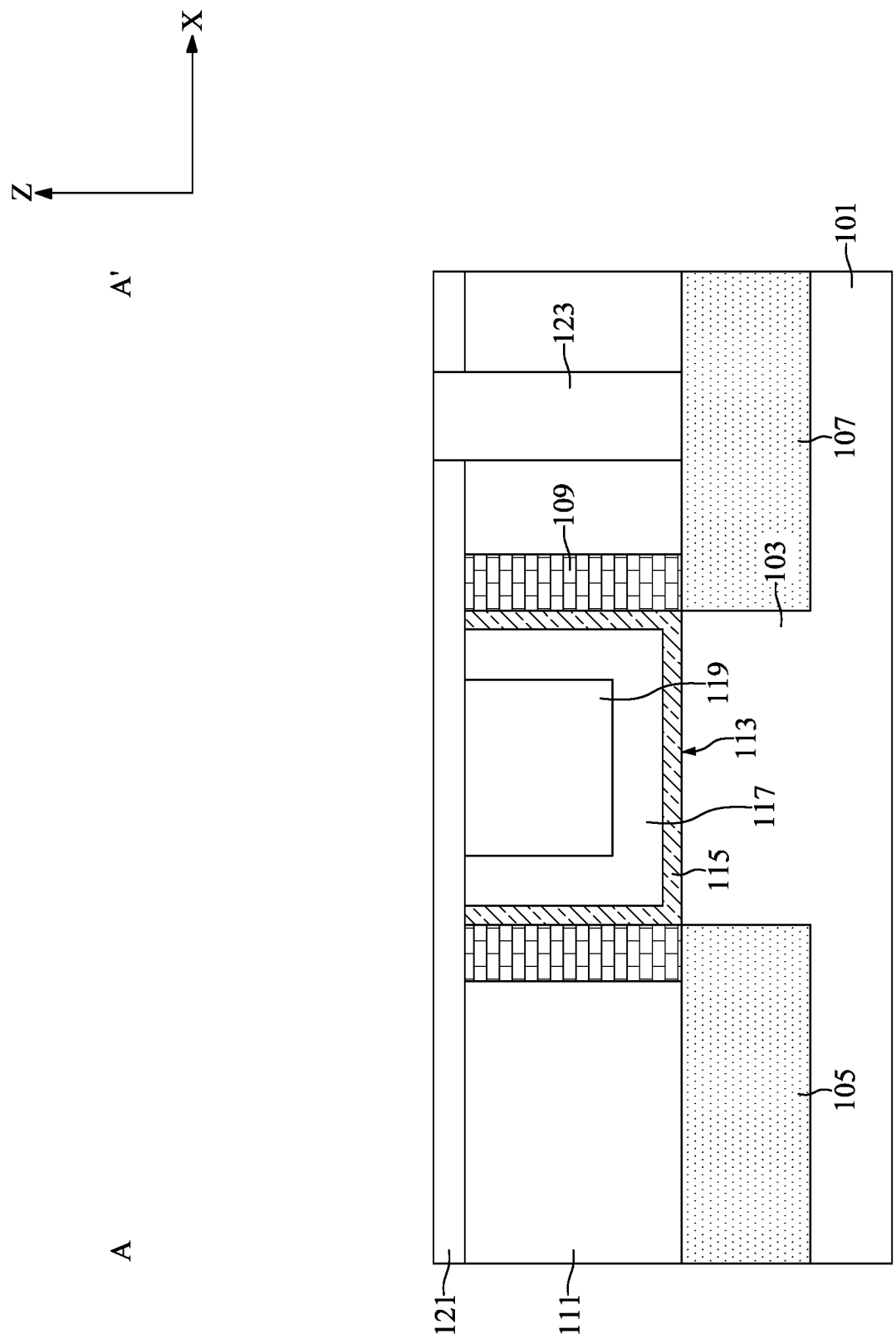

With reference to FIG. 13, a second insulating layer 121 may be formed on the two gate spacers 109, the first insulating layer 111, and the gate structure 113. A storage node contact 123 may be formed so as to penetrate the second insulating layer 121 and the first insulating layer 111 and may be formed on the drain region 107.

Figure 20:
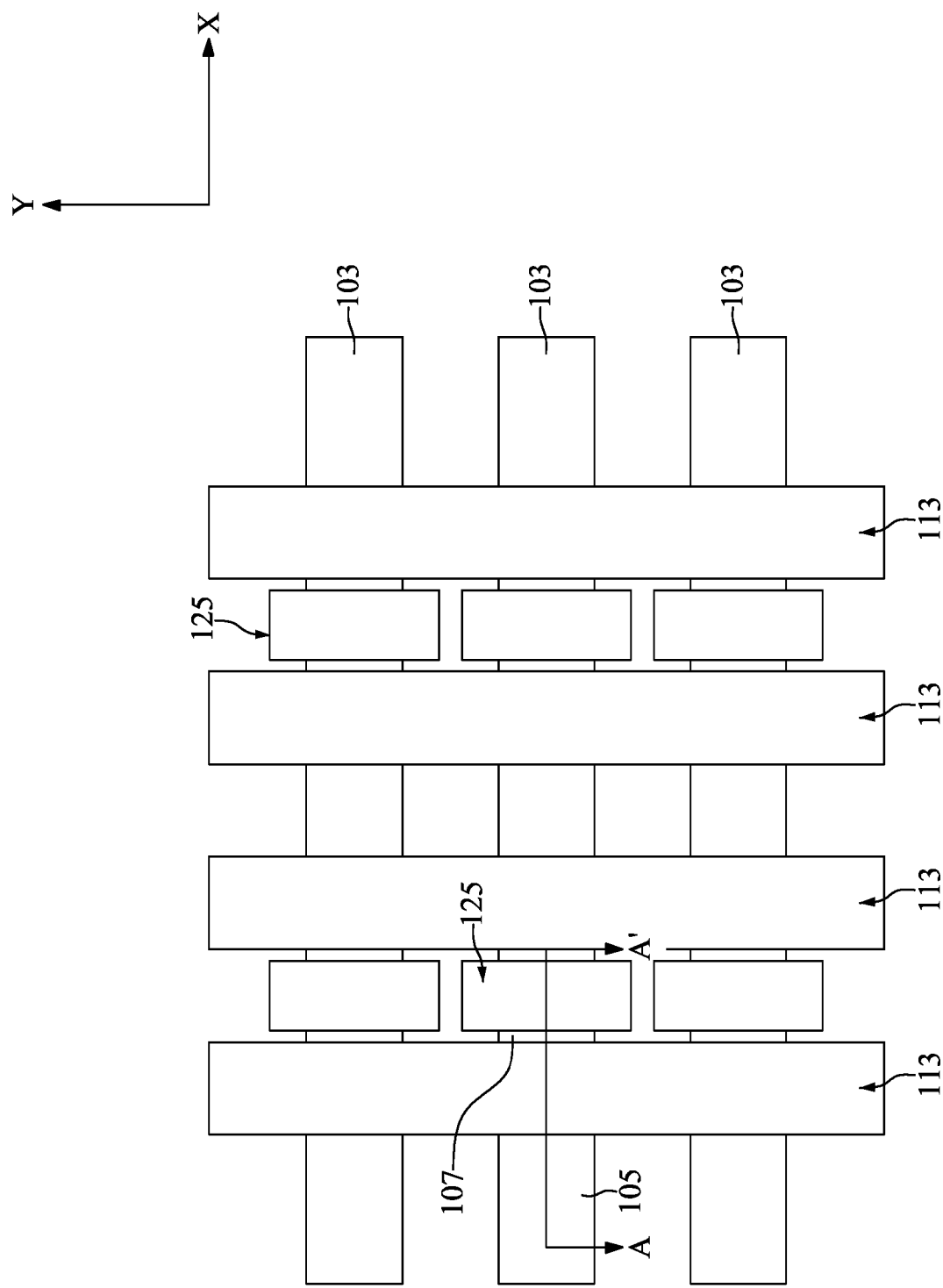
FIG. 20 illustrates, in a schematic top-view diagram, an intermediate semiconductor device in accordance with one embodiment of the present disclosure.
Figure 21:
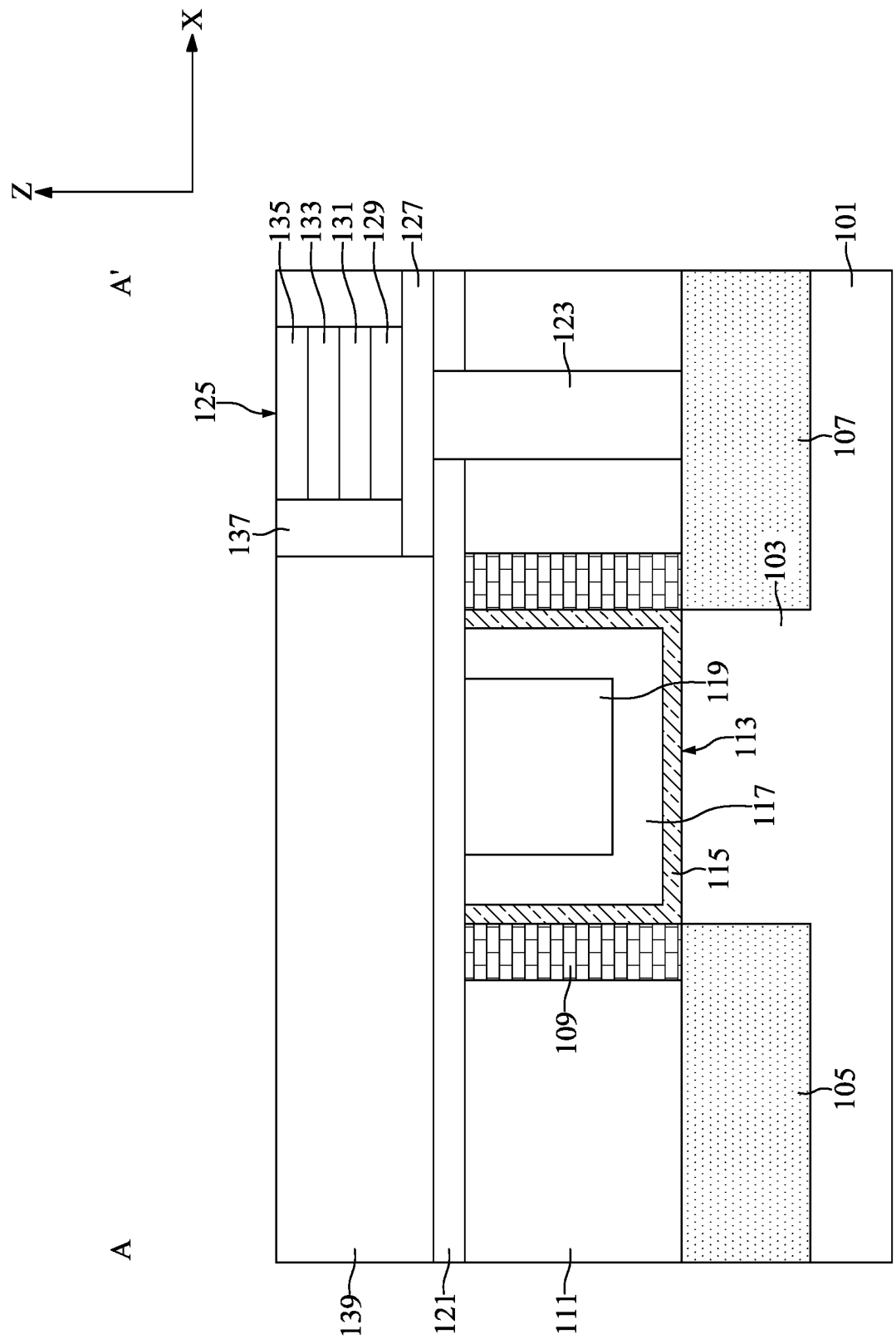
FIG. 21 is a schematic cross-sectional view diagram taken along a line A-A' in FIG. 20.

FIGS. 14 to 19 are schematic cross-sectional view diagrams taken along the line A-A' in FIG. 7 illustrating part of a flow for fabricating the semiconductor device in accordance with one embodiment of the present disclosure. FIG. 20 illustrates, in a schematic top-view diagram, an intermediate semiconductor device in accordance with one embodiment of the present disclosure. FIG. 21 is a schematic cross-sectional view diagram taken along a line A-A' in FIG. 20. Some elements of the intermediate semiconductor device are not shown in FIG. 20 for clarity.

Figure 14:
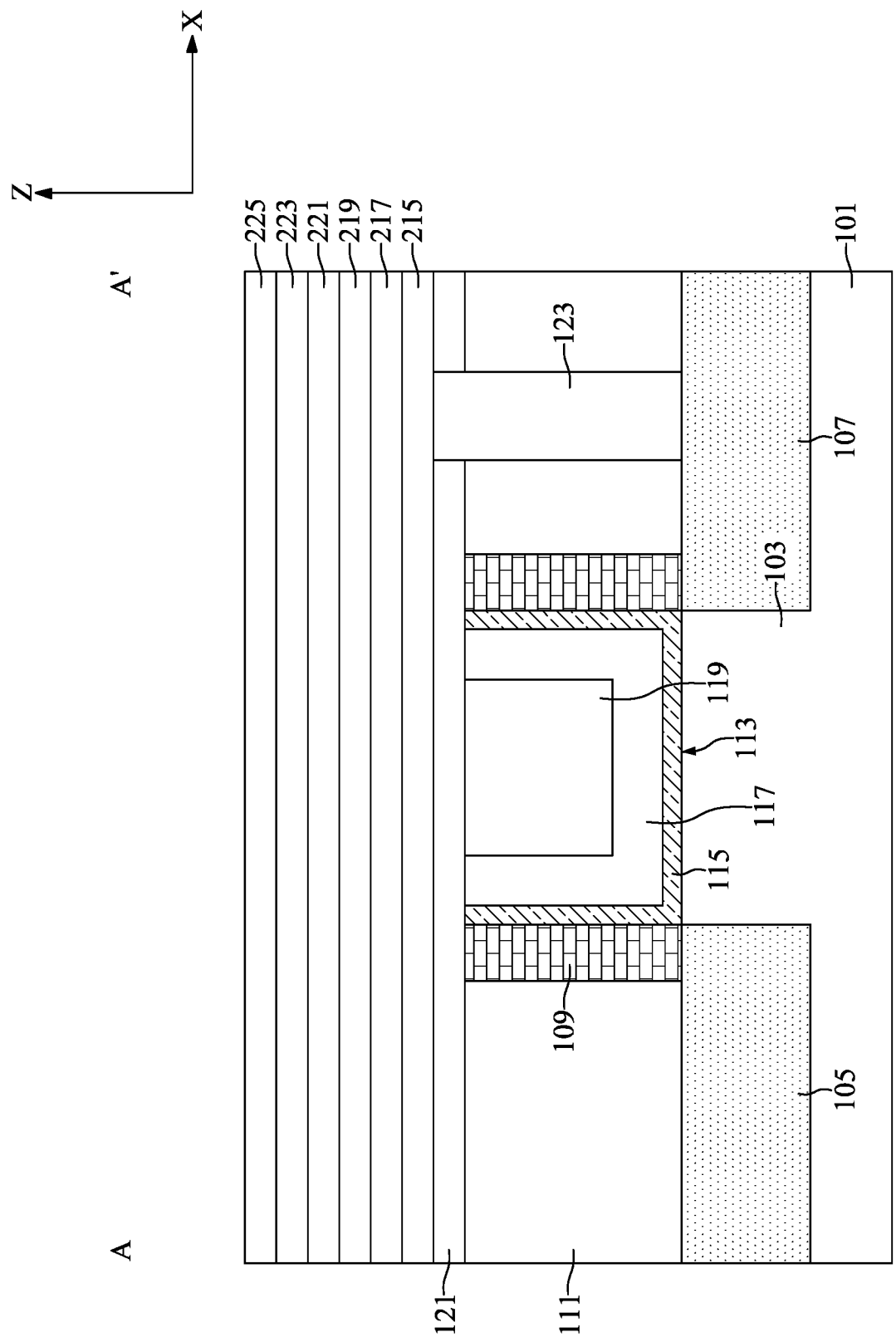

With reference to FIG. 4 and FIGS. 14 to 21, at step S15, in the embodiment depicted, a storage structure 125 may be formed over the drain region 107. With reference to FIG. 14, a layer of third conductive material 215, a layer of first ferromagnetic material 217, a layer of second insulating material 219, a layer of second ferromagnetic material 221, a layer of fourth conductive material 223, and a layer of third insulating material 225 may be sequentially formed over the second insulating layer 121 and the storage node contact 123.

The third conductive material 215 may be titanium nitride, tantalum nitride, titanium, or tantalum. The first ferromagnetic material 217 may be iron-platinum or an alloy of cobalt, iron, and boron. The second insulating material 219 may be magnesium oxide or aluminum oxide. The second ferromagnetic material 221 may be cobalt, nickel, or ruthenium. The fourth conductive material 223 may be titanium nitride, tantalum nitride, titanium, or tantalum. The third insulating material 225 may be silicon oxide, silicon oxynitride, silicon nitride oxide, or silicon nitride.

Figure 15:
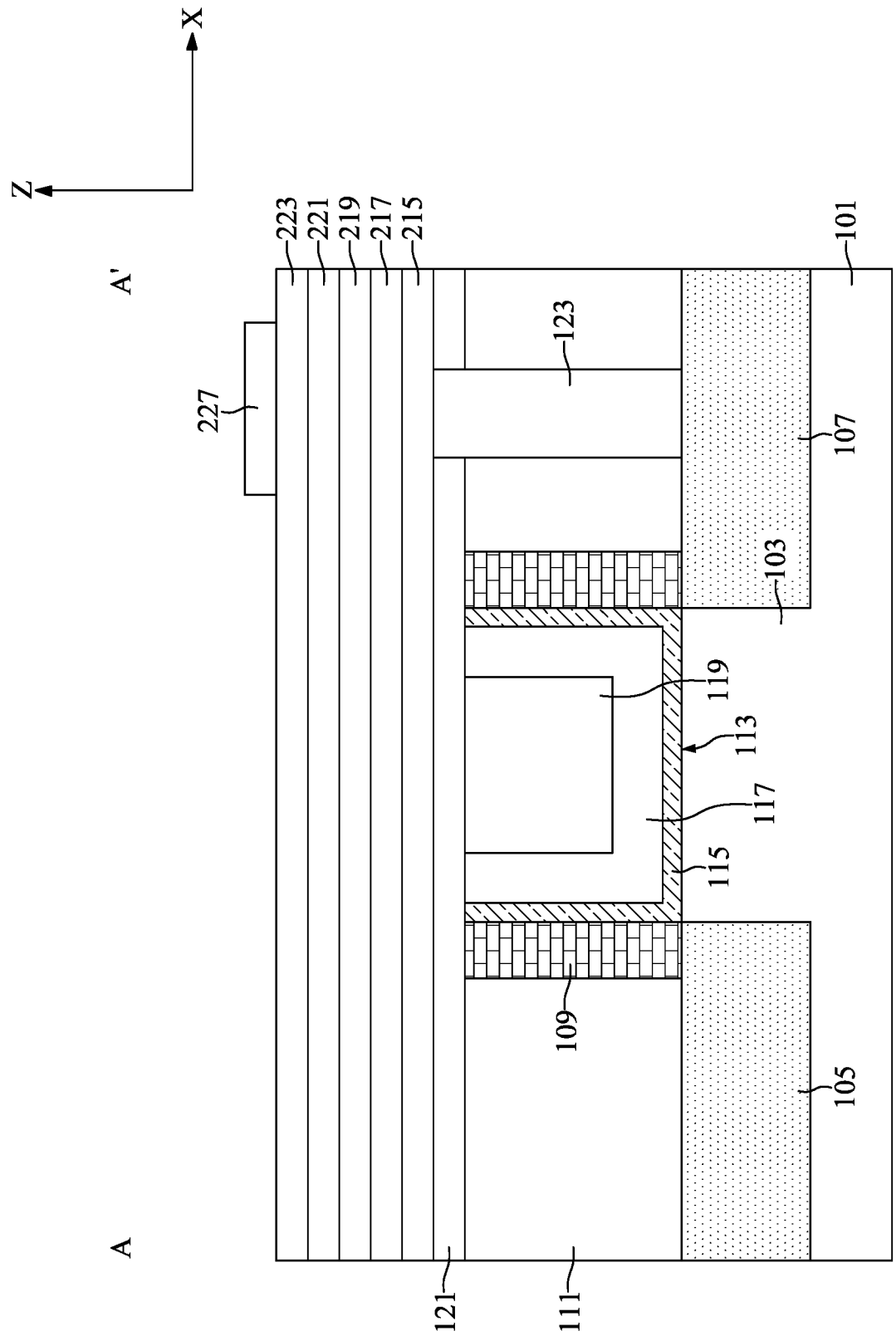
Figure 16:
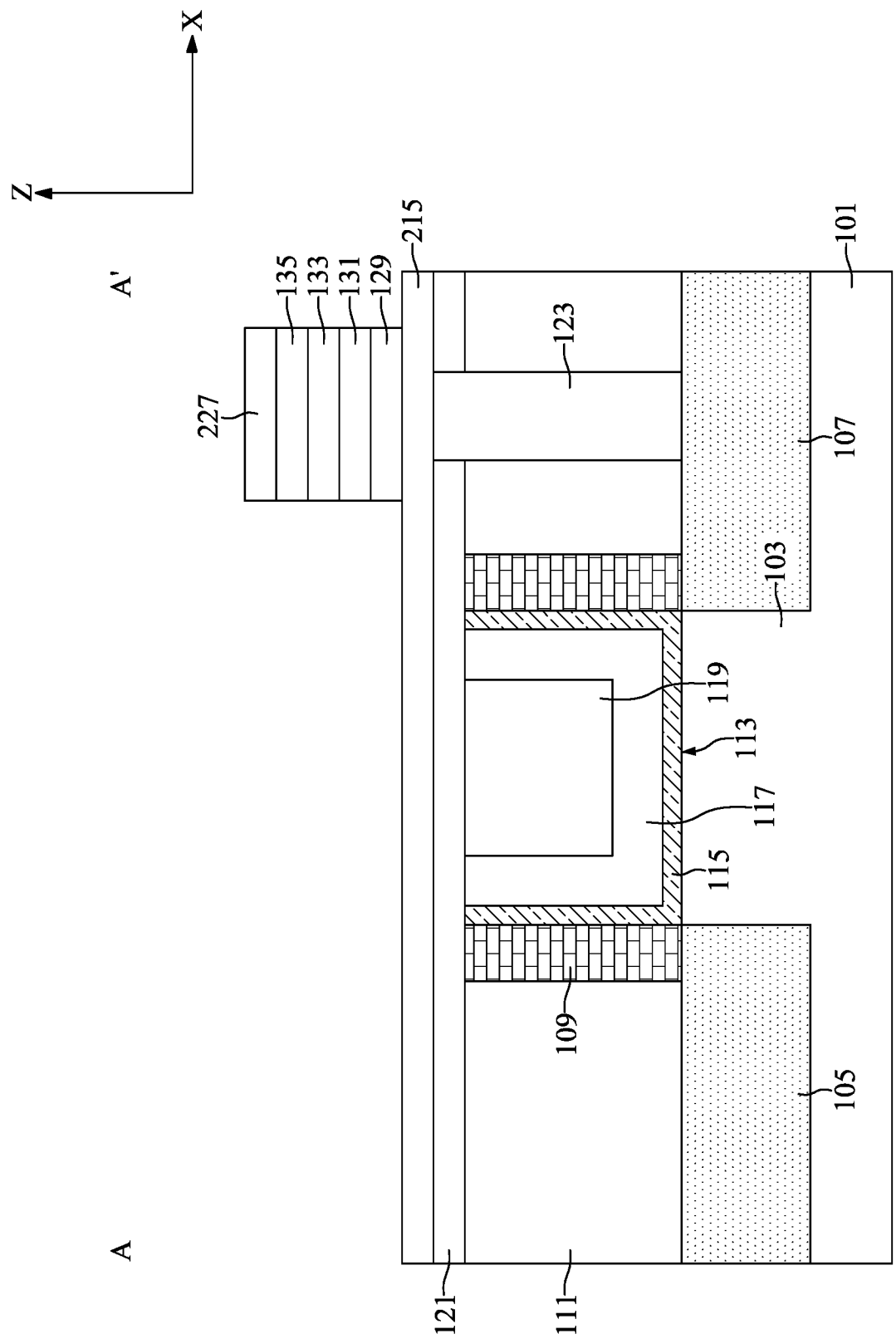

With reference to FIG. 15, a photolithography-etch process may be performed to turn the layer of third insulating material 225 into a second mask layer 227. With reference to FIG. 16, an etch process, such as an anisotropic dry etch process, may be performed with the second mask layer 227 as a mask to remove portions of the layer of fourth conductive material 223, the layer of second ferromagnetic material 221, the layer of second insulating material 219, and the layer of first ferromagnetic material 217. After the etch process, the remaining portions of the layer of fourth conductive material 223, the remaining portions of the layer of second ferromagnetic material 221, the remaining portions of the layer of second insulating material 219, and the remaining portions of the layer of first ferromagnetic material 217 may be turned into a top electrode 135, a top ferromagnetic layer 133, a tunnel barrier layer 131, and a bottom ferromagnetic layer 129, respectively.

Figure 17:
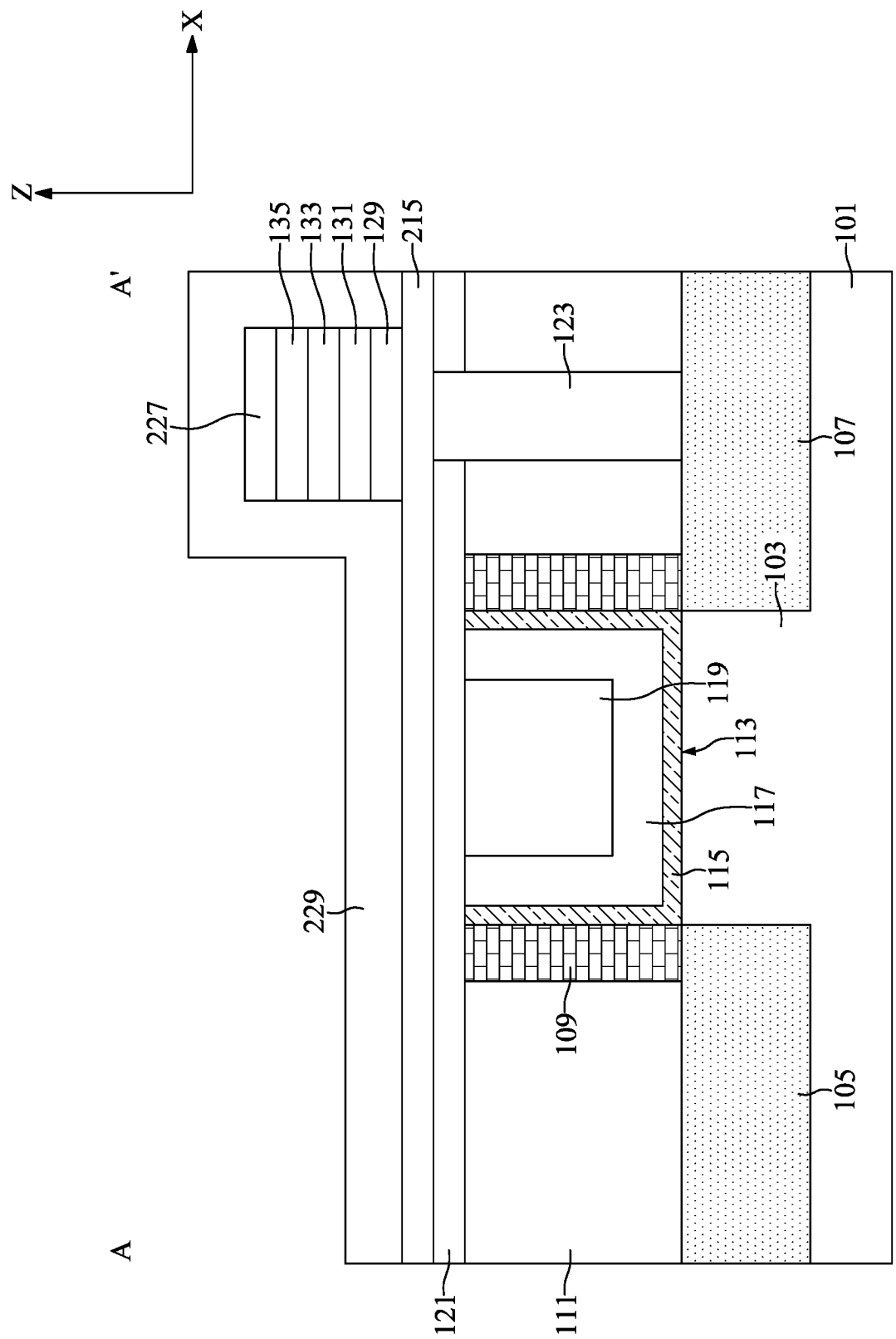
Figure 18:
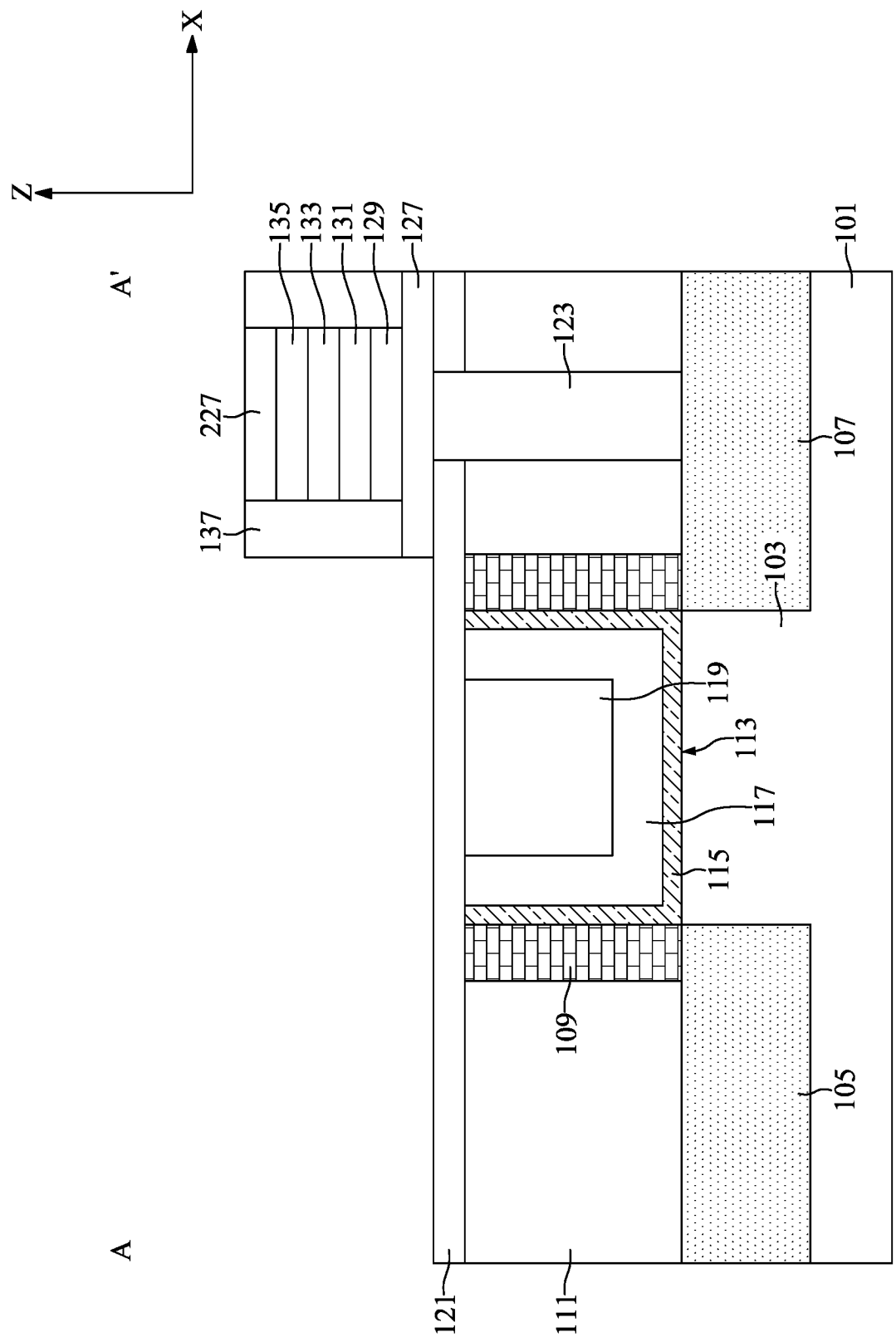

With reference to FIG. 17, a layer of fourth insulating material 229 may be formed over the intermediate semiconductor device in FIG. 16. The fourth insulating material 229 may be silicon oxide, silicon oxynitride, silicon nitride oxide, or silicon nitride. With reference to FIG. 18, an etch process, such as an anisotropic dry etch process, may be performed until a top surface of the second insulating layer 121 is exposed to turn the layer of third conductive material 215 and the layer of fourth insulating material 229 into a bottom electrode 127 and two storage spacers 137, respectively. The bottom electrode 127, the bottom ferromagnetic layer 129, the tunnel barrier layer 131, the top ferromagnetic layer 133, and the top electrode 135 together form the storage structure 125.

Figure 19:
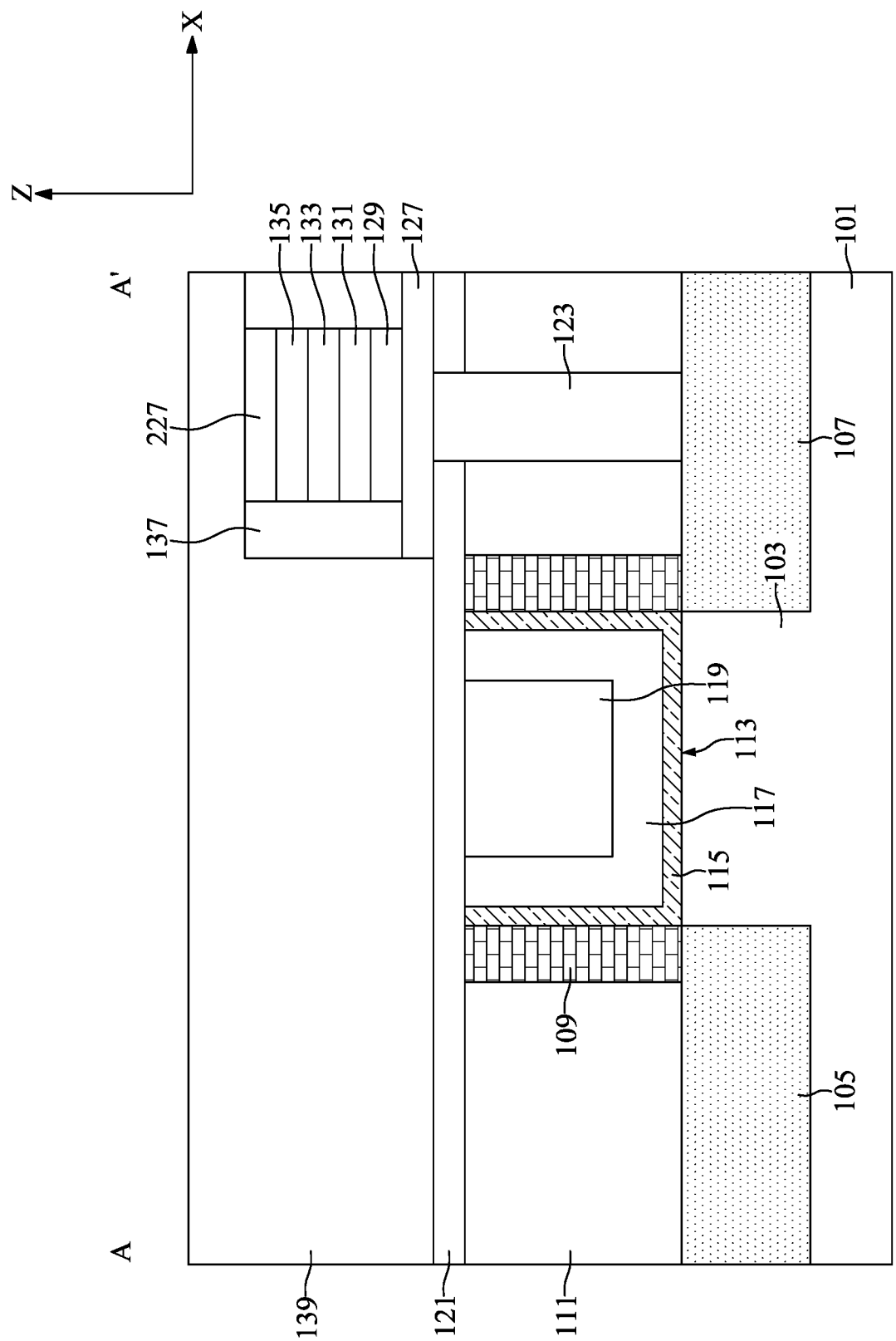

With reference to FIG. 19, a third insulating layer 139 may be formed over the intermediate semiconductor device in FIG. 18. With reference to FIGS. 20 and 21, a planarization process, such as chemical mechanical polishing, may be performed until the top surface of the top electrode 135 is exposed to provide a substantially flat surface for subsequent processing steps.

Figure 22:
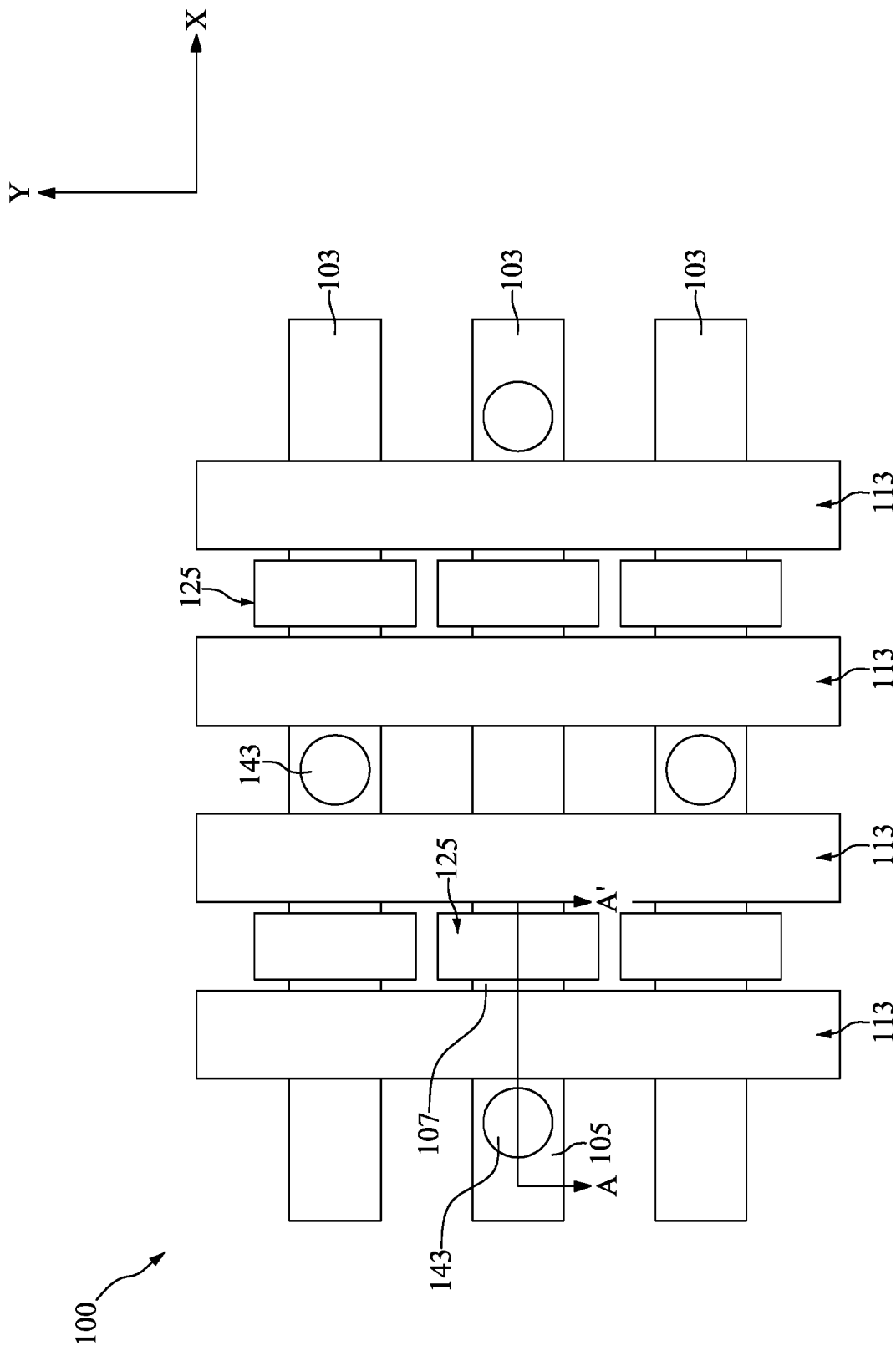
FIG. 22 illustrates, in a schematic top-view diagram, an intermediate semiconductor device in accordance with one embodiment of the present disclosure.
Figure 23:
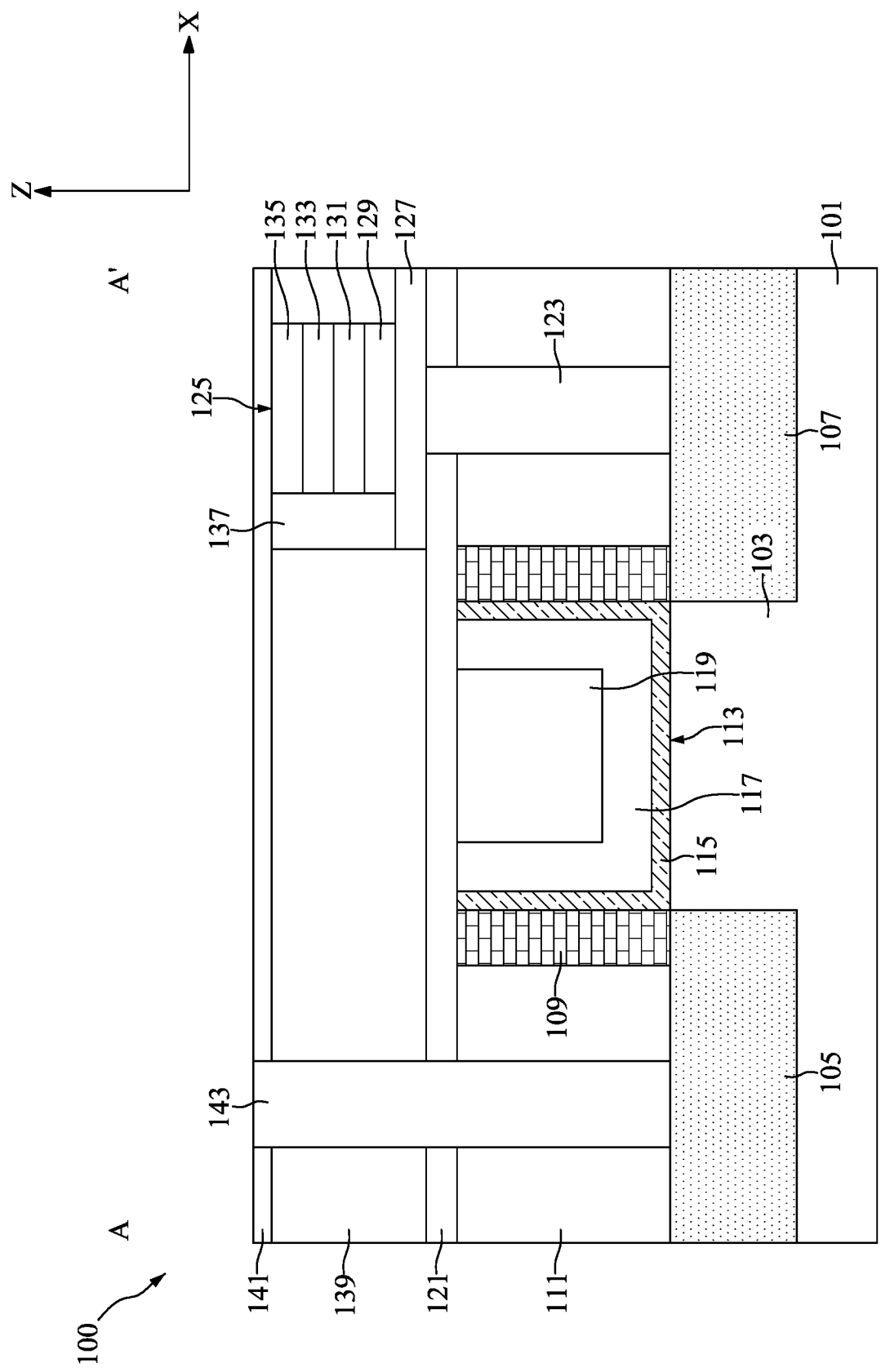
FIG. 23 is a schematic cross-sectional view diagram taken along a line A-A' in FIG. 22.

FIG. 22 illustrates, in a schematic top-view diagram, an intermediate semiconductor device in accordance with one embodiment of the present disclosure. FIG. 23 is a schematic cross-sectional view diagram taken along a line A-A' in FIG. 22. Some elements of the intermediate semiconductor device are not shown in FIG. 22 for clarity.

With reference to FIGS. 4, 22, and 23, at step S17, in the embodiment depicted, a bit line contact 143 may be formed to electrically couple to the source region 105. A fourth insulating layer 141 may be formed on the storage structure 125, the two storage spacers 137, and the third insulating layer 139. The bit line contact 143 may be formed so as to penetrate the fourth insulating layer 141, the third insulating layer 139, the second insulating layer 121, and the first insulating layer 111 and may be formed on the source region 105.

Figure 24:
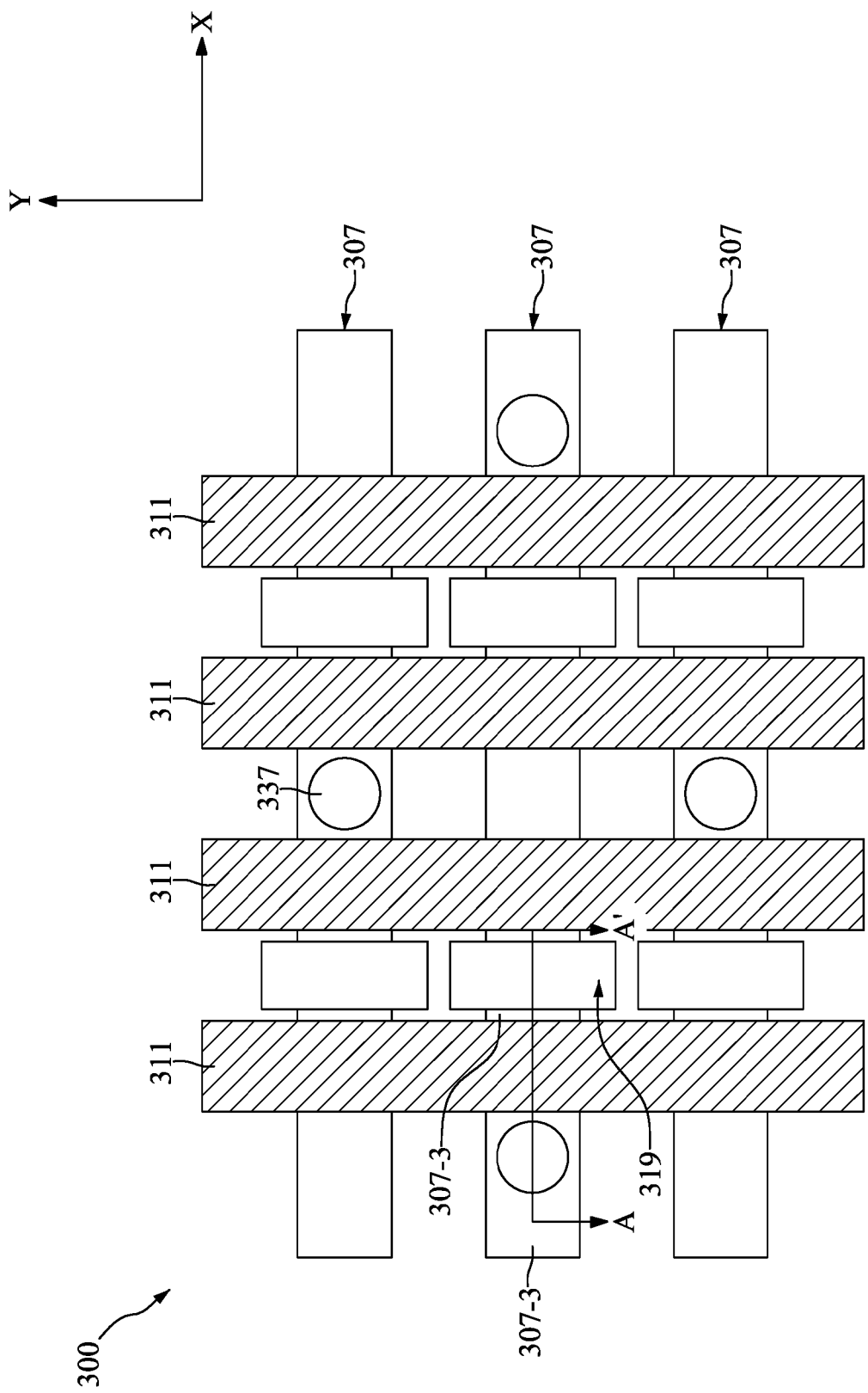
FIG. 24 illustrates, in a schematic top-view diagram, a semiconductor device in accordance with one embodiment of the present disclosure.
Figure 25:
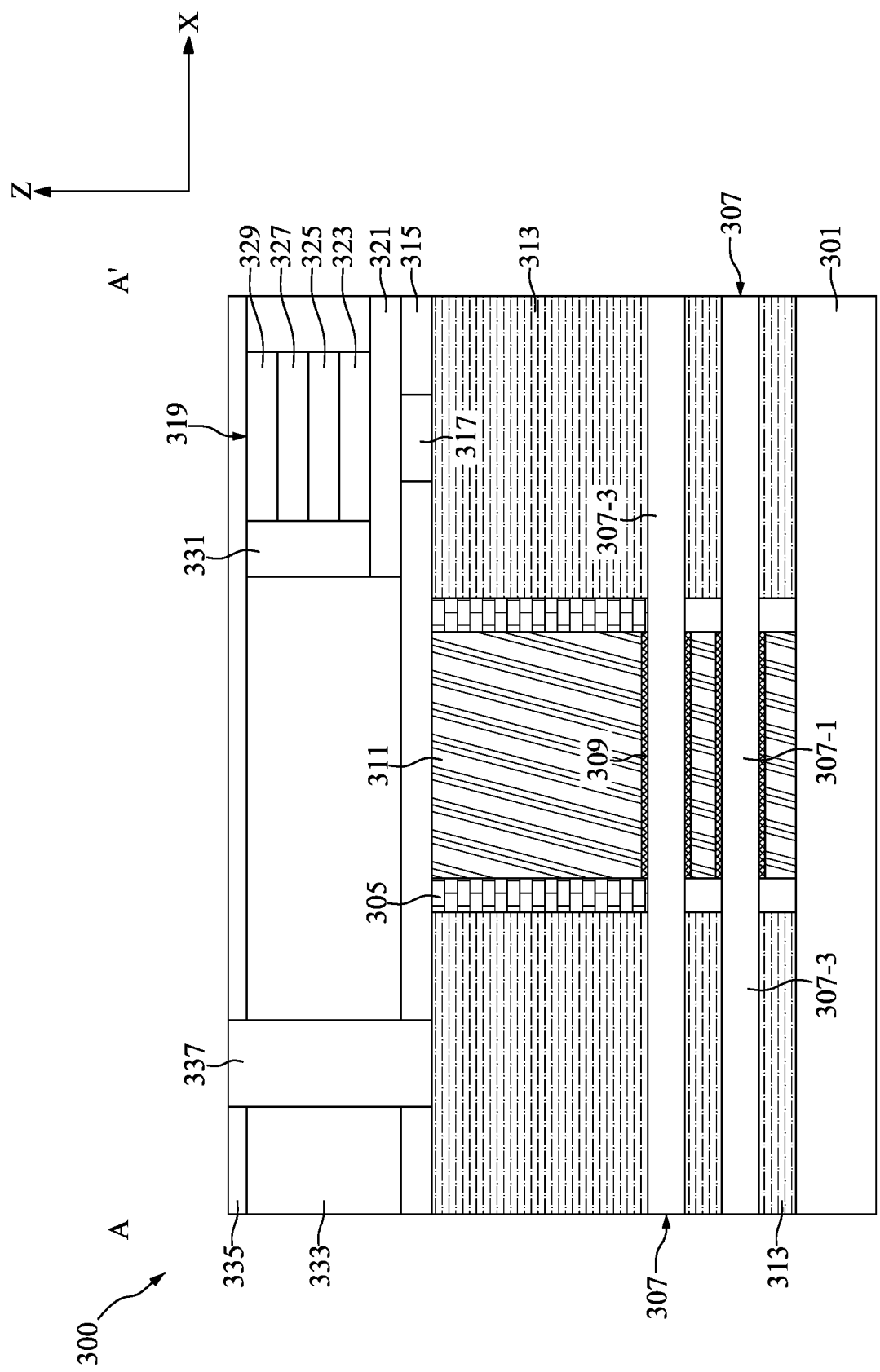
FIG. 25 is a schematic cross-sectional view diagram taken along a line A-A' in FIG. 24.

FIG. 24 illustrates, in a schematic top-view diagram, a semiconductor device 300 in accordance with one embodiment of the present disclosure. FIG. 25 is a schematic cross-sectional view diagram taken along a line A-A' in FIG. 24. Some elements of the semiconductor device 300 are not shown in FIG. 24 for clarity.

With reference to FIGS. 24 and 25, the semiconductor device 300 may include a substrate 301, gate spacers 305, a plurality of nanowires 307, a plurality of coverage layers 309, a plurality of gate stacks 311, a plurality of contacts 313, a first insulating layer 315, a plurality of storage node contacts 317, a plurality of storage structures 319, a plurality of storage spacers 331, a second insulating layer 333, a third insulating layer 335, and a plurality of bit line contacts 337.

With reference to FIGS. 24 and 25, the substrate 301 may be formed of a same material as the substrate 101 but is not limited thereto. The plurality of nanowires 307 may be disposed above the substrate 301 and may extend along a first direction X. In some embodiments, the plurality of nanowires 307 may be arranged vertically and discrete; in other words, the plurality of nanowires 307 may be disposed on an XZ plane and spaced apart from each other. In some embodiments, the plurality of nanowires 307 may be arranged horizontally and discrete. In some embodiments, a plurality of intervening nanowires may be respectively correspondingly disposed between adjacent pairs of the plurality of nanowires 307 and disposed between the substrate 101 and the bottommost nanowire 307. In some embodiments, the bottommost nanowire 307 may be disposed on the substrate 101. For convenience of description, only one nanowire 307 is described. The nanowire 307 may include a channel region 307-1 and a pair of source/drain regions 307-3. The pair of source/drain regions 307-3 may be disposed on sides of the channel region 307-1.

With reference to FIGS. 24 and 25, the plurality of coverage layers 309 may respectively correspondingly surround the perimeters of the channel regions 307-1. The plurality of coverage layers 309 may have thicknesses between about 50 angstroms and about 100 angstroms. In some embodiments, the plurality of nanowires 307 may have a band gap larger than that of the plurality of coverage layers 309. In some embodiments, the plurality of nanowires 307 and the plurality of coverage layers 309 may be formed of group IV material or group III-V material. For example, the channel region 307-1 may be formed of InP, AlGaAs, AlInSb, or Si. The plurality of coverage layers 309 may be formed of InGaAs, InAs, InSb, GaAs, or Ge.

Since the material of the plurality of nanowires 307 has a larger band gap and larger band offsets than the plurality of coverage layers 309, current flow may be prevented in the channel regions 307-1 of the plurality of nanowires 307. That is, current flow may be limited to the plurality of coverage layers 309. Such coverage layers 309 may be optimized for the carrier mobility, effective mass and on-state performance of a nanowire-based semiconductor device with reduced off-state issues. In addition, the channel regions 307-1 of the plurality of nanowires 307 may be optimized to reduce the current flow therethrough, such as by increasing a band gap and band offsets of the channel regions 307-1 relative to the plurality of coverage layers 309.

With reference to FIGS. 24 and 25, from a top-view perspective, the plurality of gate stacks 311 may be disposed over the plurality of nanowires 307 and the substrate 101. The plurality of gate stacks 311 may extend along a second direction Y and separated from each other. From a cross-sectional perspective, the gate stack 311 (for convenience of description, only one gate stack 311 is described) may surround the perimeters of the plurality of coverage layers 309. The gate stack 311 may include a gate dielectric and a gate electrode. The gate electrode may surround the perimeters of the plurality of coverage layers 309 with the gate dielectric interposed therebetween. In some embodiments, the gate dielectric may be formed of, for example, a high-k dielectric material. In some embodiments, the gate dielectric may be composed of a bottom portion, disposed adjacent to the channel region 307-1 and formed of silicon oxide or silicon oxynitride, and a top portion, disposed on the bottom portion and formed of a high-k dielectric material. In some embodiments, the gate electrode may be formed of, for example, metal nitrides, metal carbides, metal silicides, metal aluminides, hafnium, zirconium, titanium, tantalum, aluminum, ruthenium, palladium, platinum, cobalt, nickel or conductive metal oxides.

With reference to FIGS. 24 and 25, the two gate spacers 305 (for convenience of description, only two gate spacers 305 are described) may be disposed on both sides of the gate stack 311. The two gate spacers 305 may also be disposed on sides, parallel to the XZ plane, of the plurality of nanowires 307. It should be noted that, when the plurality of nanowires 307 are arranged vertically, no gate spacer 305 is present between adjacent pairs of the plurality of nanowires 307. When the nanowires 307 are arranged vertically, the two gate spacers 305 are disposed on only the topmost nanowire 307. The two gate spacers 305 may be formed of, for example, silicon oxide, silicon oxynitride, silicon nitride oxide, or silicon nitride.

With reference to FIGS. 24 and 25, the two contacts 313 (for convenience of description, only two contacts 313 are described) may respectively correspondingly surround the perimeters of the source/drain regions 307-3. The two contacts 313 may be formed of, for example, a conductive material such as metal, metal-metal alloy, or metal-semiconductor alloy. The metal may be nickel or cobalt. The metal-semiconductor alloy may be metal silicide. The top surfaces of the two contacts 313, the top surfaces of the two gate spacers 305, and the top surface of the gate stack 311 may be even.

With reference to FIGS. 24 and 25, the first insulating layer 315 may be disposed on the two gate spacers 305, the gate stack 311, and the two contacts 313. The first insulating layer 315 may be formed of a same material as the second insulating layer 121, but is not limited thereto. The storage node contact 317 may be disposed in the first insulating layer 315 and electrically coupled to one of the two contacts 313. The storage structure 319 may be disposed on the first insulating layer 315 and electrically coupled to the storage node contact 317.

The storage structure 319 may have a configuration similar to that of the storage structure 125 illustrated in FIGS. 1 and 2. The storage structure 319 may include a bottom electrode 321, a bottom ferromagnetic layer 323, a tunnel barrier layer 325, a top ferromagnetic layer 327, and a top electrode 329, serving as a magnetic random access memory (MRAM). The bottom electrode 321, the bottom ferromagnetic layer 323, the tunnel barrier layer 325, the top ferromagnetic layer 327, the top electrode 329, the two storage spacers 331, the second insulating layer 333, and the third insulating layer 335 may be arranged in a manner similar to that of the bottom electrode 127, the bottom ferromagnetic layer 129, the tunnel barrier layer 131, the top ferromagnetic layer 133, the top electrode 135, the two storage spacers 137, the third insulating layer 139, and the fourth insulating layer 141 illustrated in FIGS. 1 and 2. The bit line contact 337 may be disposed so as to penetrate the third insulating layer 335, the second insulating layer 333, and the first insulating layer 315. The bit line contact 337 may be disposed on another one of the two contacts 313 and electrically coupled thereto.

It should be noted that the storage structure 319 may be disposed at a vertical level slightly higher than a vertical level of the gate stack 311 and may be offset from the gate stack 311. A difference between the vertical level of the storage structure 319 and the vertical level of the gate stack 311 may be less than 0.5 micrometers. The storage structure 319 is not formed at the BEOL stage.

In some embodiments, the storage structure 319 serves as dynamic random access memory (DRAM), comprising a bottom conductive layer 323 positioned above one of source/drain regions 307-3, a dielectric layer 325 positioned on the bottom conductive layer 323, and a top conductive layer 327 positioned on the dielectric layer 325.

Figure 26:
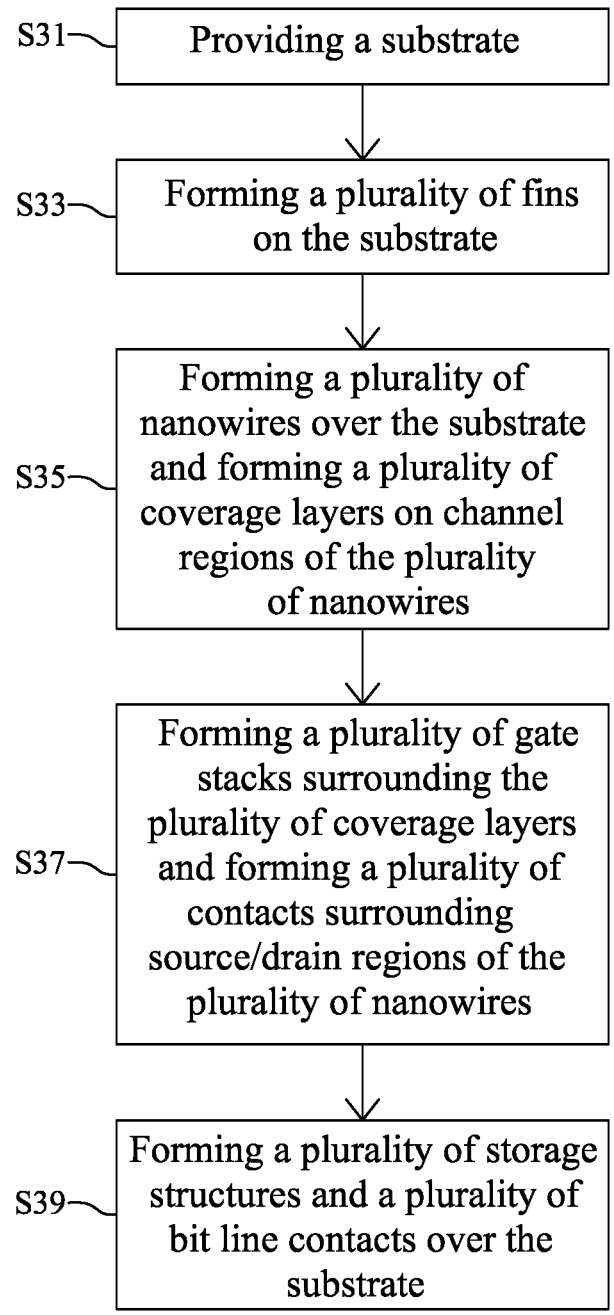
FIG. 26 illustrates, in a flowchart diagram form, a method for fabricating a semiconductor device in accordance with one embodiment of the present disclosure.
Figure 27:
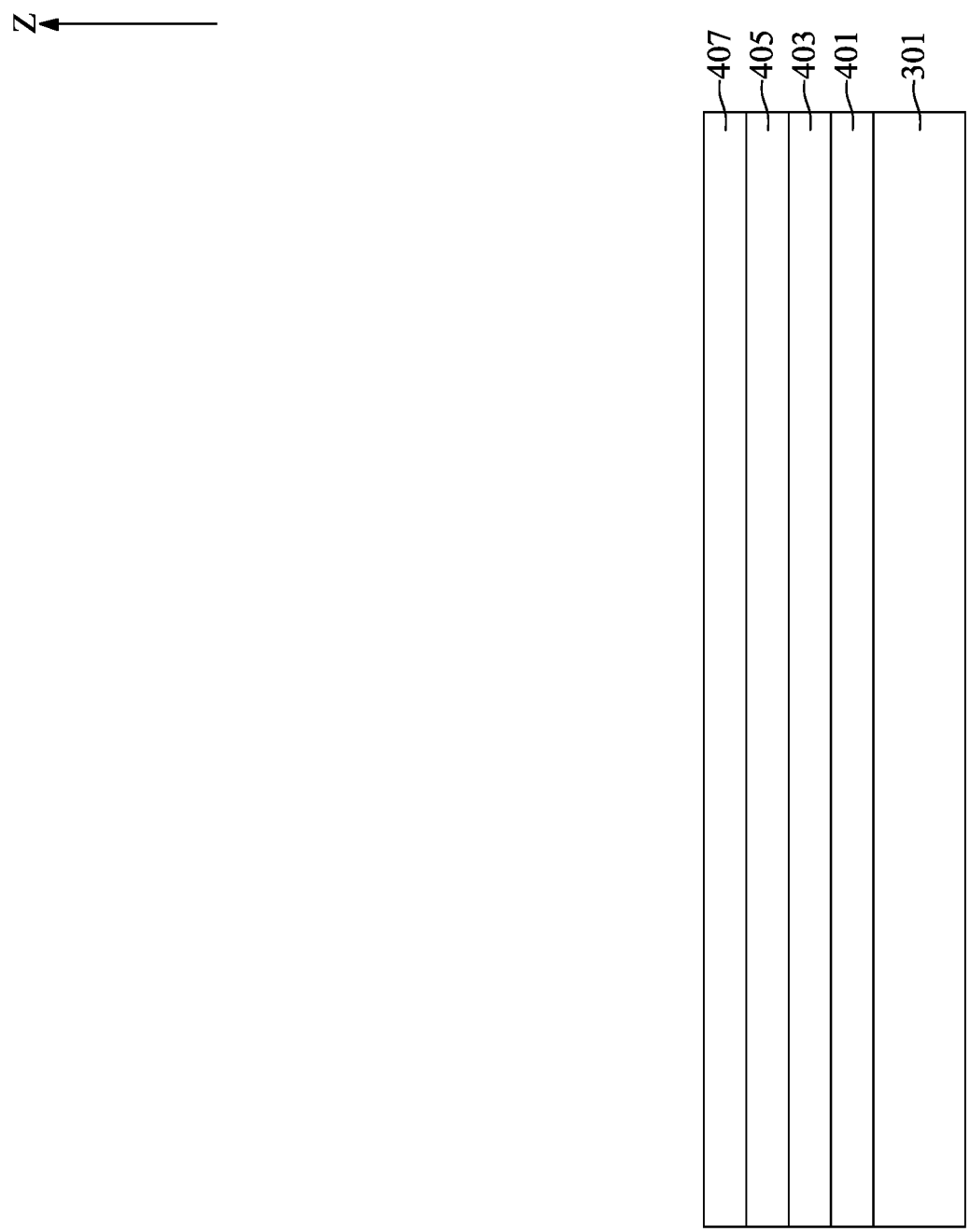
FIG. 27 illustrates, in a schematic cross-sectional view diagram, part of a flow for fabricating the semiconductor device in accordance with one embodiment of the present disclosure.

FIG. 26 illustrates, in a flowchart diagram form, a method 30 for fabricating a semiconductor device 300 in accordance with one embodiment of the present disclosure. FIG. 27 illustrates, in a schematic cross-sectional view diagram, part of a flow for fabricating the semiconductor device 300 in accordance with one embodiment of the present disclosure.

With reference to FIGS. 26 and 27, at step S31, in the embodiment depicted, a substrate 301 may be provided and a layer of first semiconductor material 401, a layer of second semiconductor material 403, a layer of third semiconductor material 405, and a layer of fourth semiconductor material 407 may be sequentially formed on the substrate 301. The first semiconductor material 401 and the third semiconductor material 405 may be formed of a same material. The second semiconductor material 403 and the fourth semiconductor material 407 may be formed of a same material. The first semiconductor material 401 and the second semiconductor material 403 may be formed of different materials. The third semiconductor material 405 and the fourth semiconductor material 407 may be formed of, for example, group IV material or group III-V material.

Figure 28:
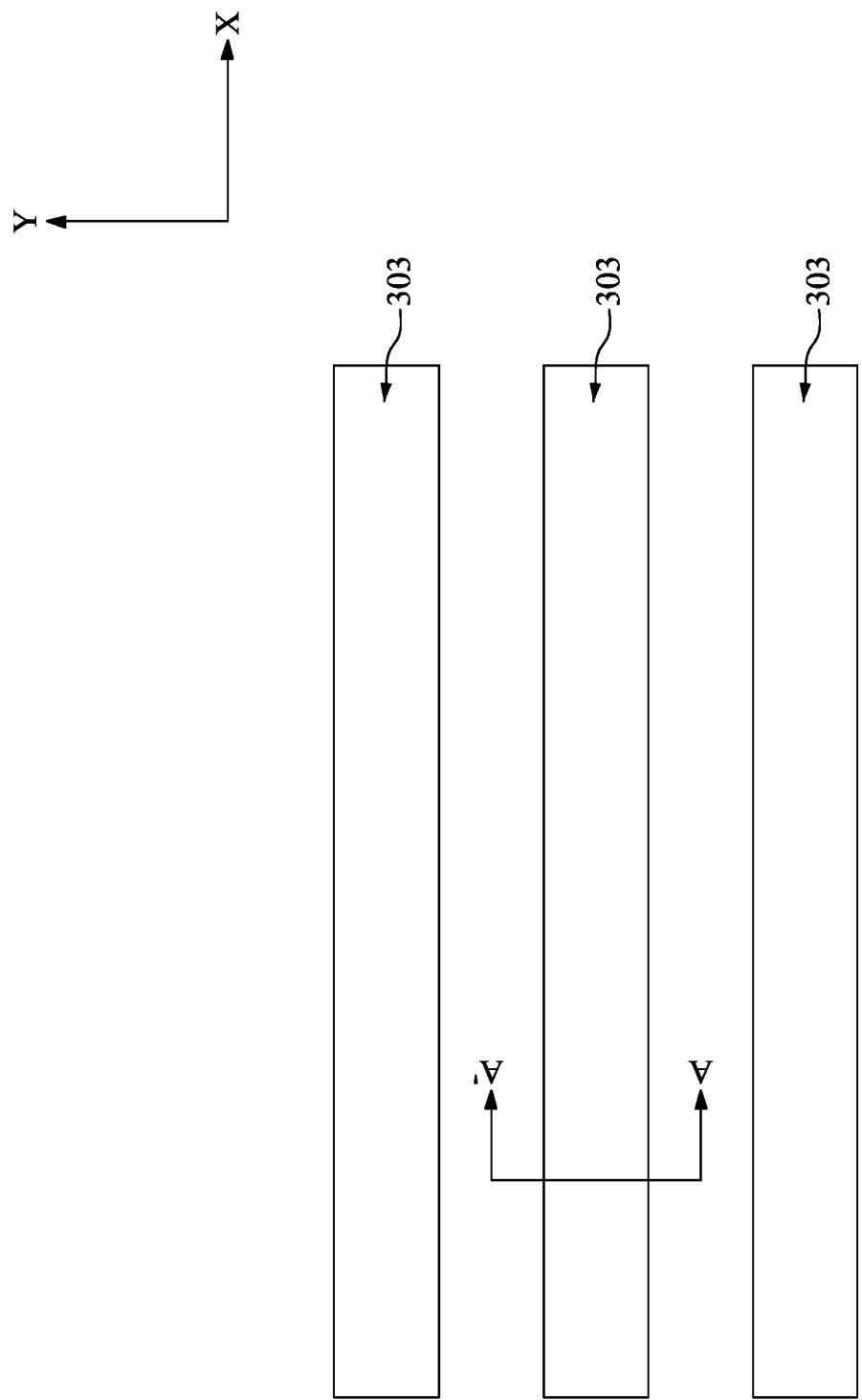
FIG. 28 illustrates, in a schematic top-view diagram, an intermediate semiconductor device in accordance with one embodiment of the present disclosure.
Figure 29:
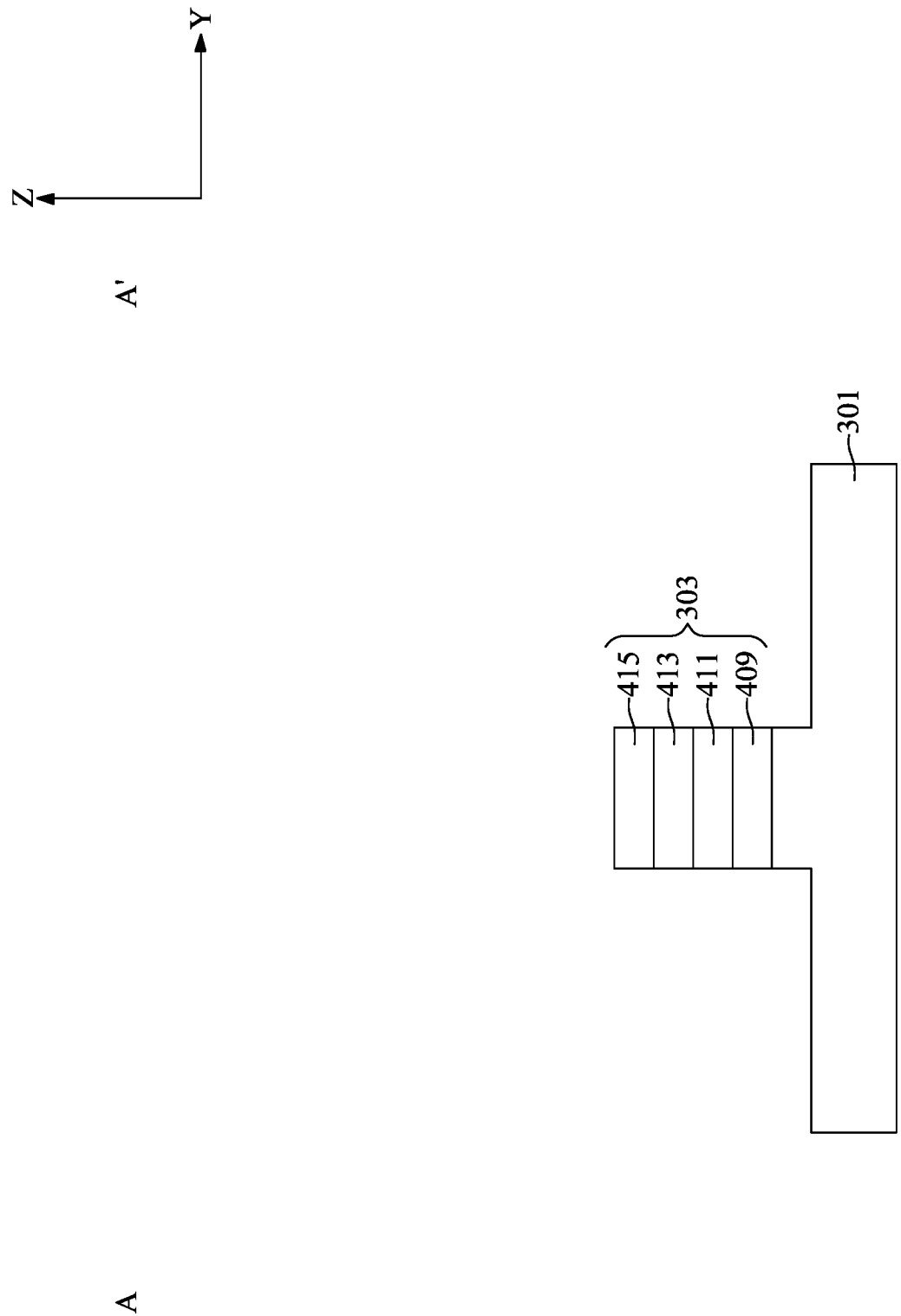
FIG. 29 is a schematic cross-sectional view diagram taken along a line A-A' in FIG. 28.

FIG. 28 illustrates, in a schematic top-view diagram, an intermediate semiconductor device in accordance with one embodiment of the present disclosure. FIG. 29 is a schematic cross-sectional view diagram taken along a line A-A' in FIG. 28. Some elements of the intermediate semiconductor device are not shown in FIG. 28 for clarity.

With reference to FIGS. 26, 28, and 29, at step S33, in the embodiment depicted, a plurality of fins 303 may be formed on the substrate 101. A photolithography-etch process may be performed to remove portions of the layer of first semiconductor material 401, portions of the layer of second semiconductor material 403, portions of the layer of third semiconductor material 405, and portions of the layer of fourth semiconductor material 407 and concurrently form a first semiconductor layer 409, a second semiconductor layer 411, a third semiconductor layer 413, and a fourth semiconductor layer 415. The first semiconductor layer 409, the second semiconductor layer 411, the third semiconductor layer 413, and the fourth semiconductor layer 415 together form a fin 303 (for convenience of description, only one fin 303 is described).

Figure 30:
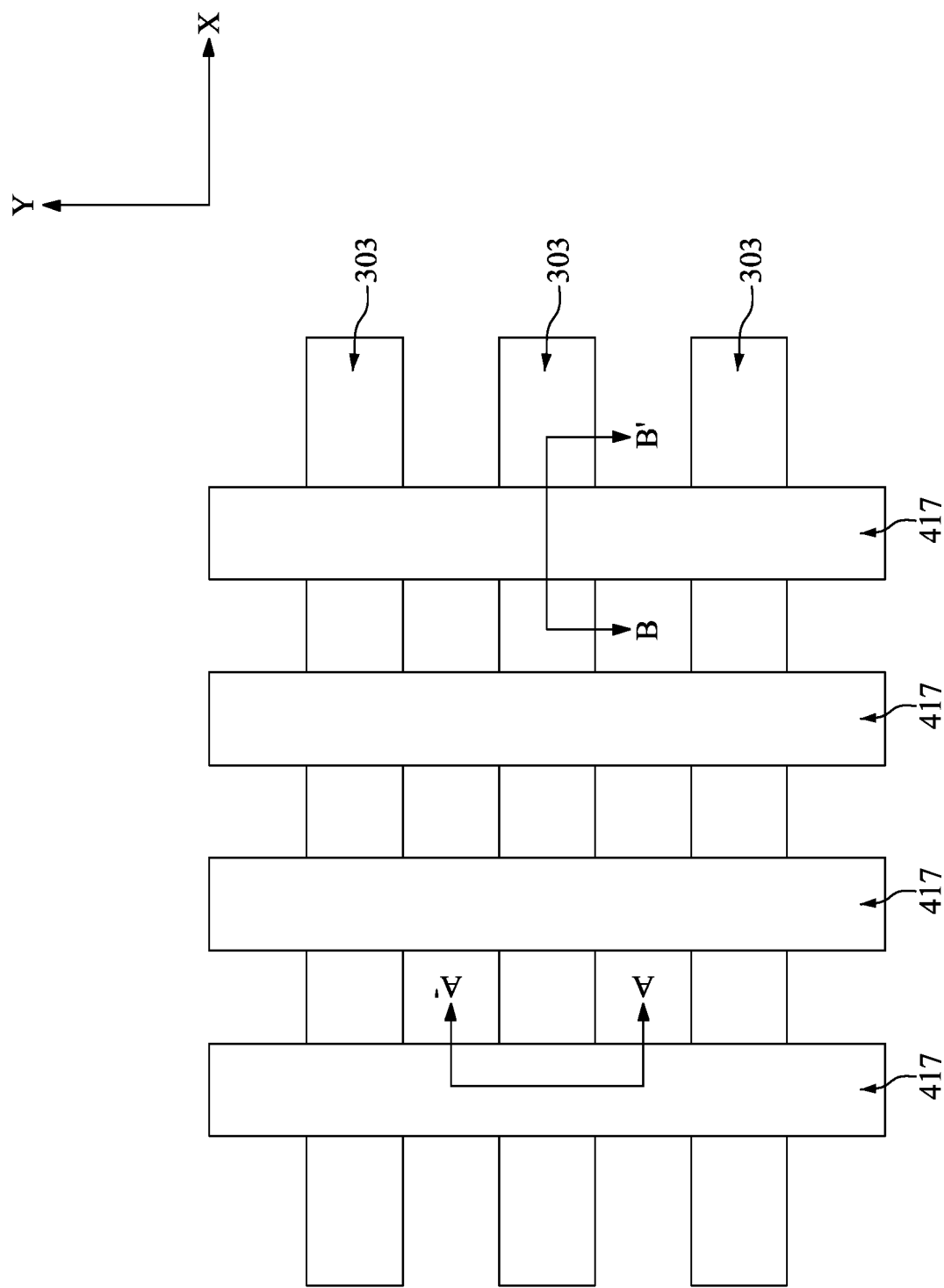
FIG. 30 illustrates, in a schematic top-view diagram, an intermediate semiconductor device in accordance with one embodiment of the present disclosure.
Figure 31:
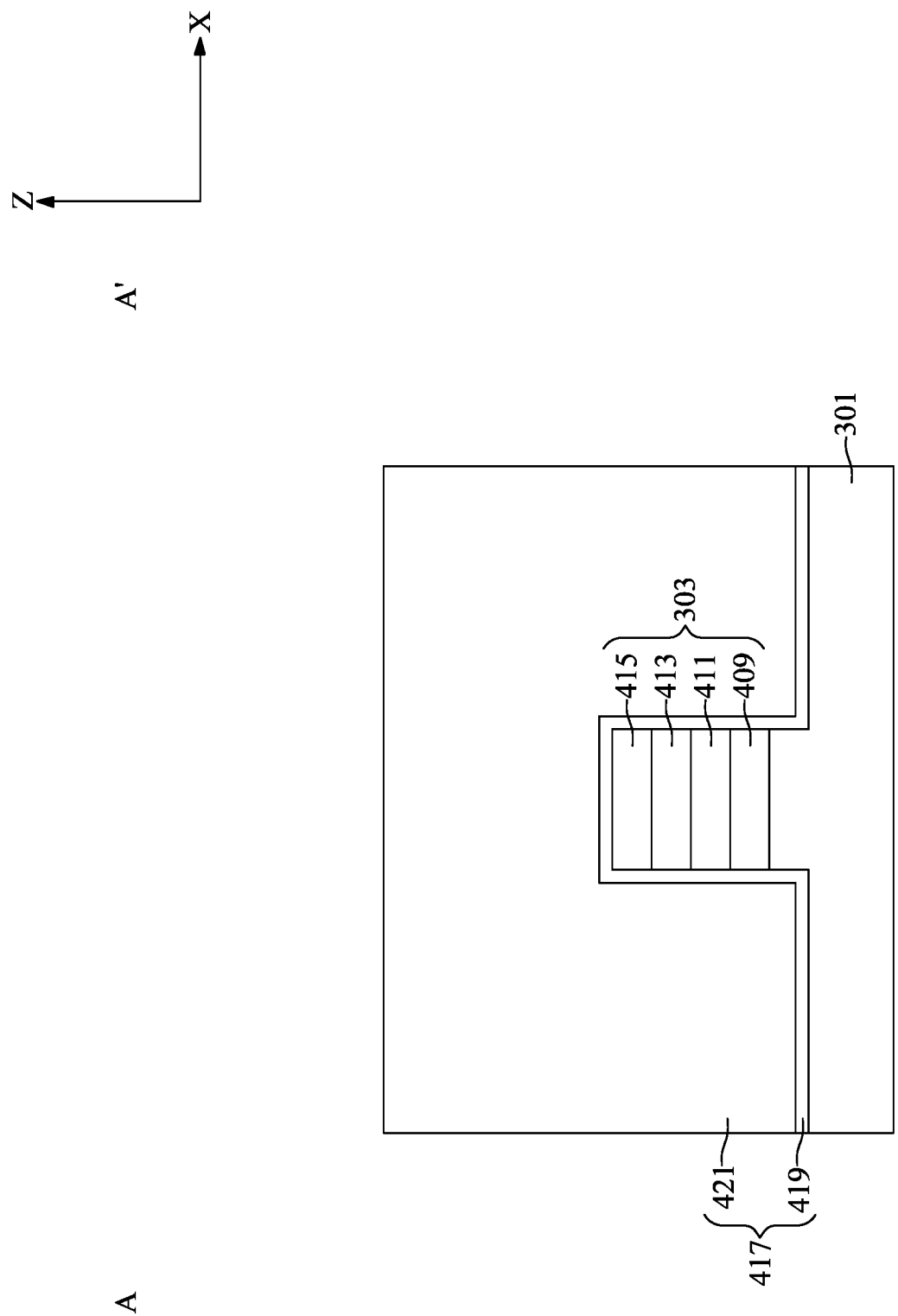
FIG. 31 is a schematic cross-sectional view diagram taken along a line A-A' in FIG. 30.
Figure 32:
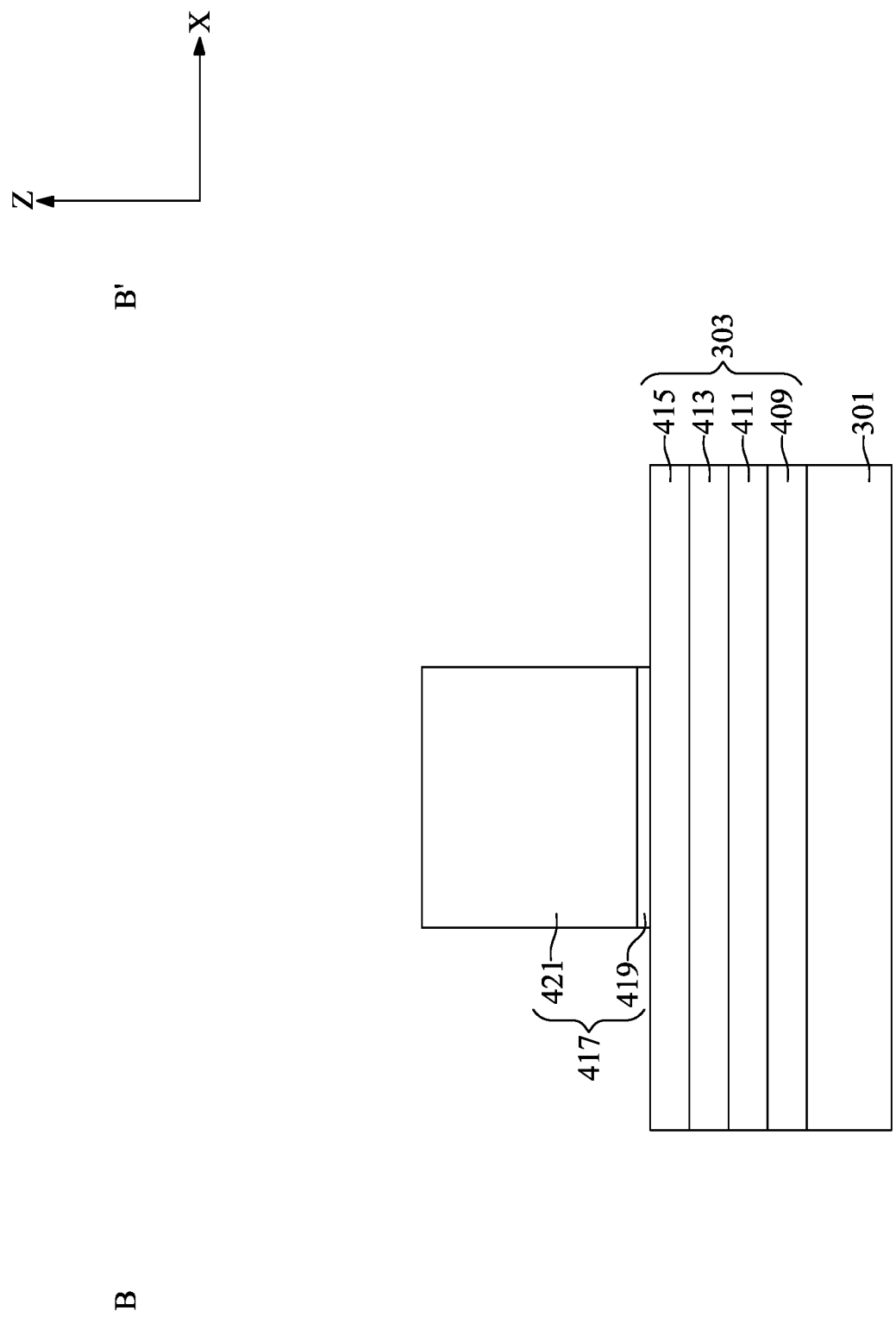
FIGS. 32 and 33 are schematic cross-sectional view diagrams taken along the line B-B' in FIG. 30 illustrating part of a flow for fabricating the semiconductor device in accordance with one embodiment of the present disclosure.
Figure 33:
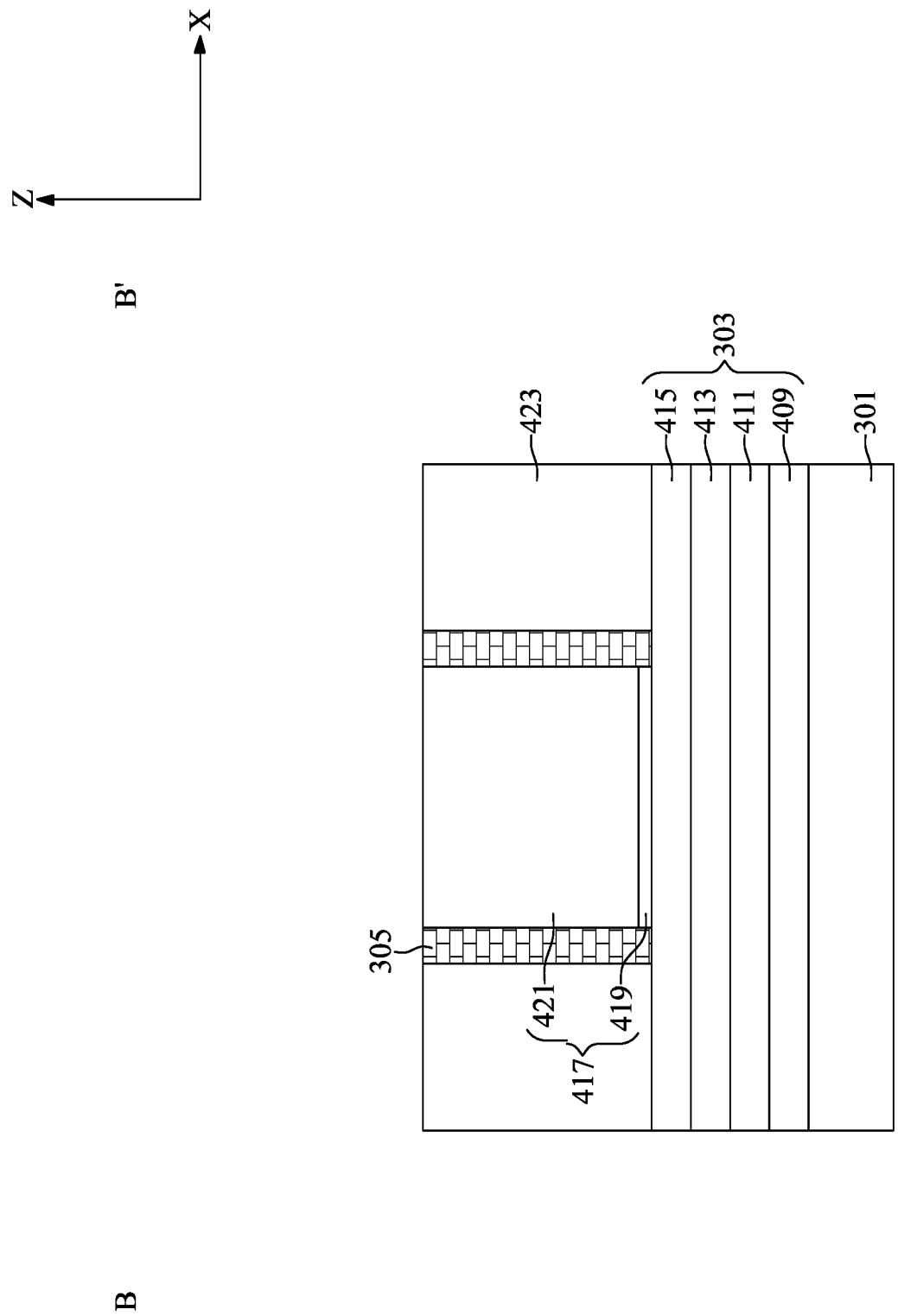
Figure 34:
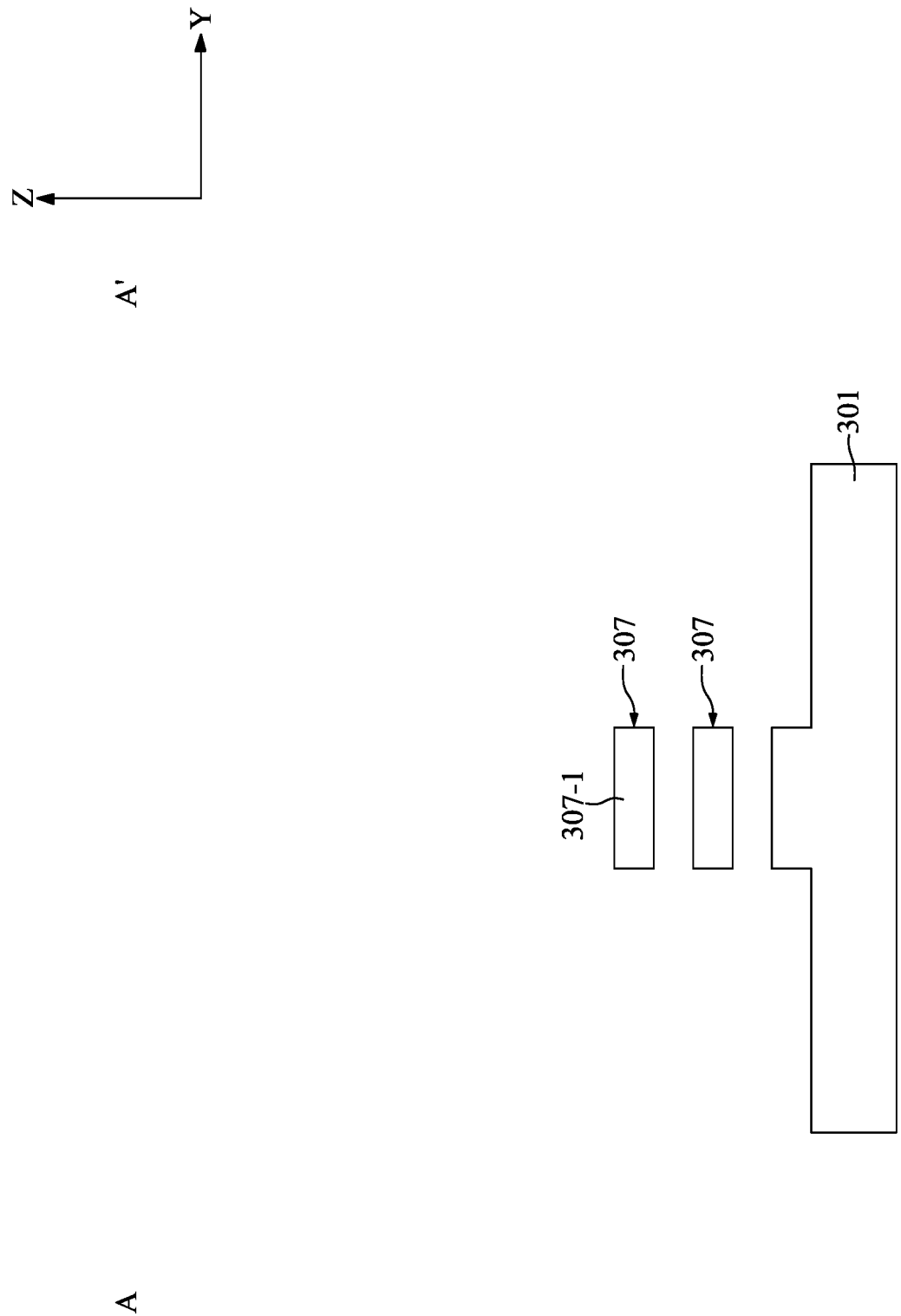
FIG. 34 is a schematic cross-sectional view diagram taken along the line A-A' in FIG. 30 illustrating part of a flow for fabricating the semiconductor device in accordance with one embodiment of the present disclosure.
Figure 35:
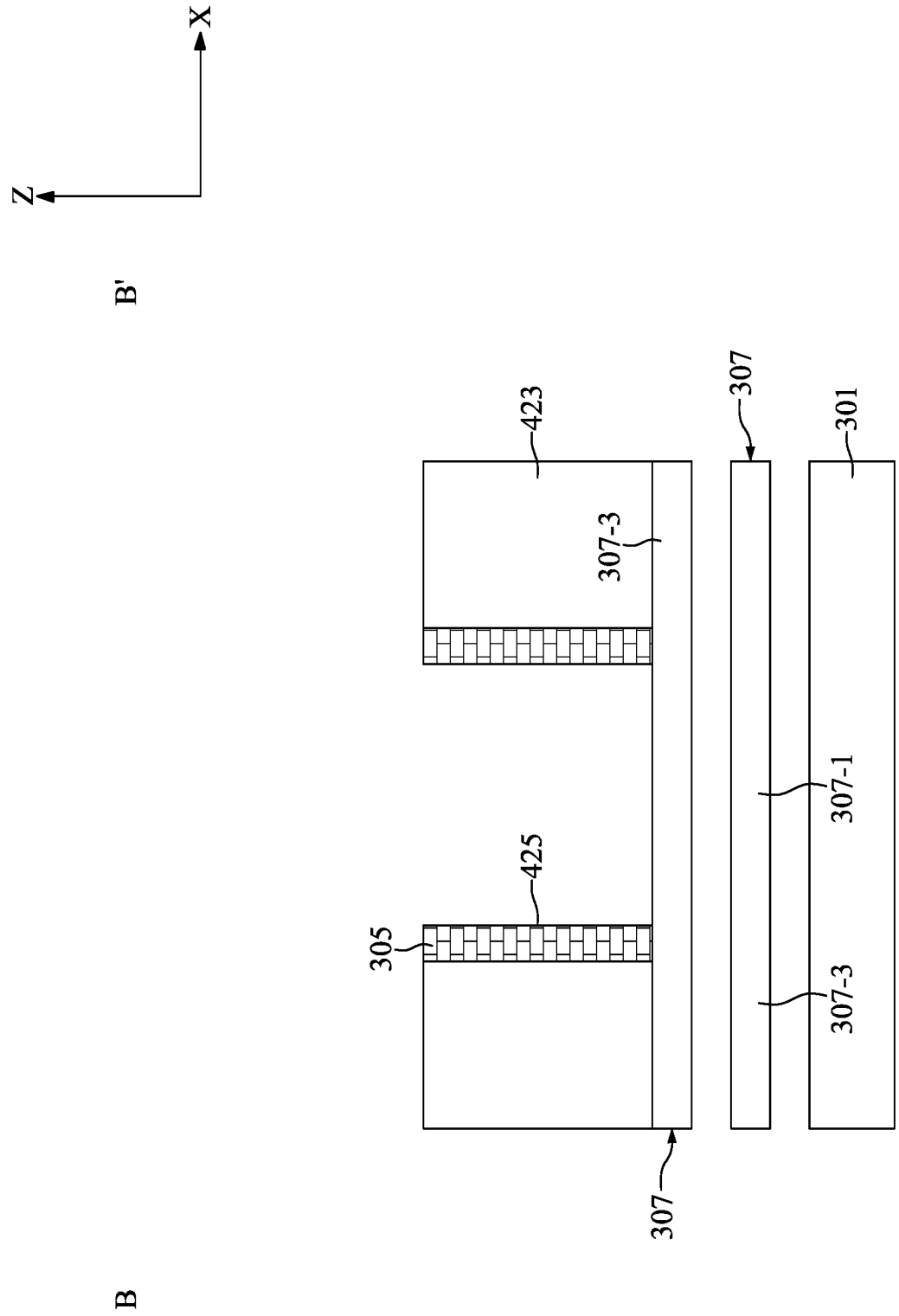
FIG. 35 is a schematic cross-sectional view diagram taken along the line B-B' in FIG. 30 illustrating part of a flow for fabricating the semiconductor device in accordance with one embodiment of the present disclosure.
Figure 36:
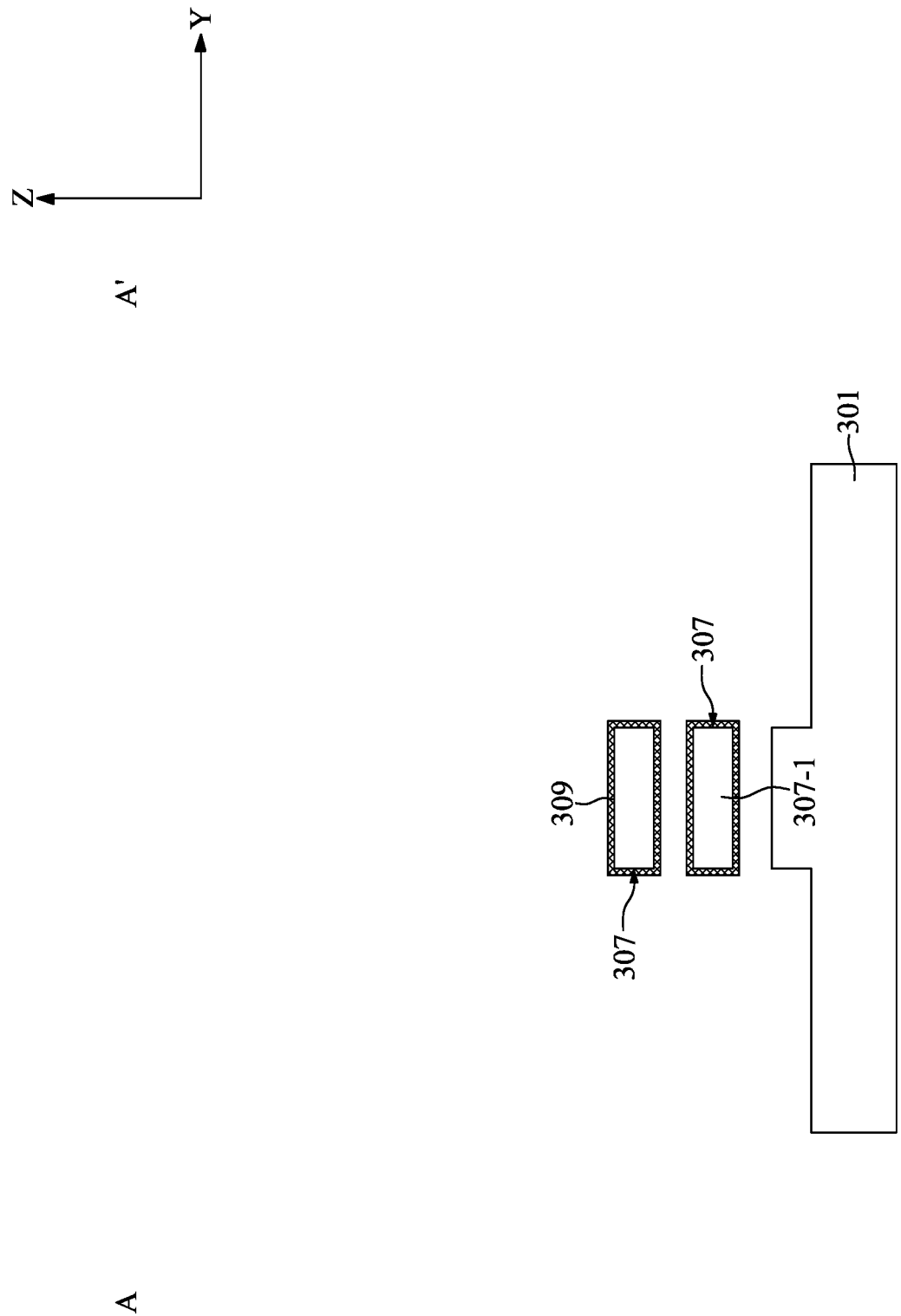
FIG. 36 is a schematic cross-sectional view diagram taken along the line A-A' in FIG. 30 illustrating part of a flow for fabricating the semiconductor device in accordance with one embodiment of the present disclosure.
Figure 37:
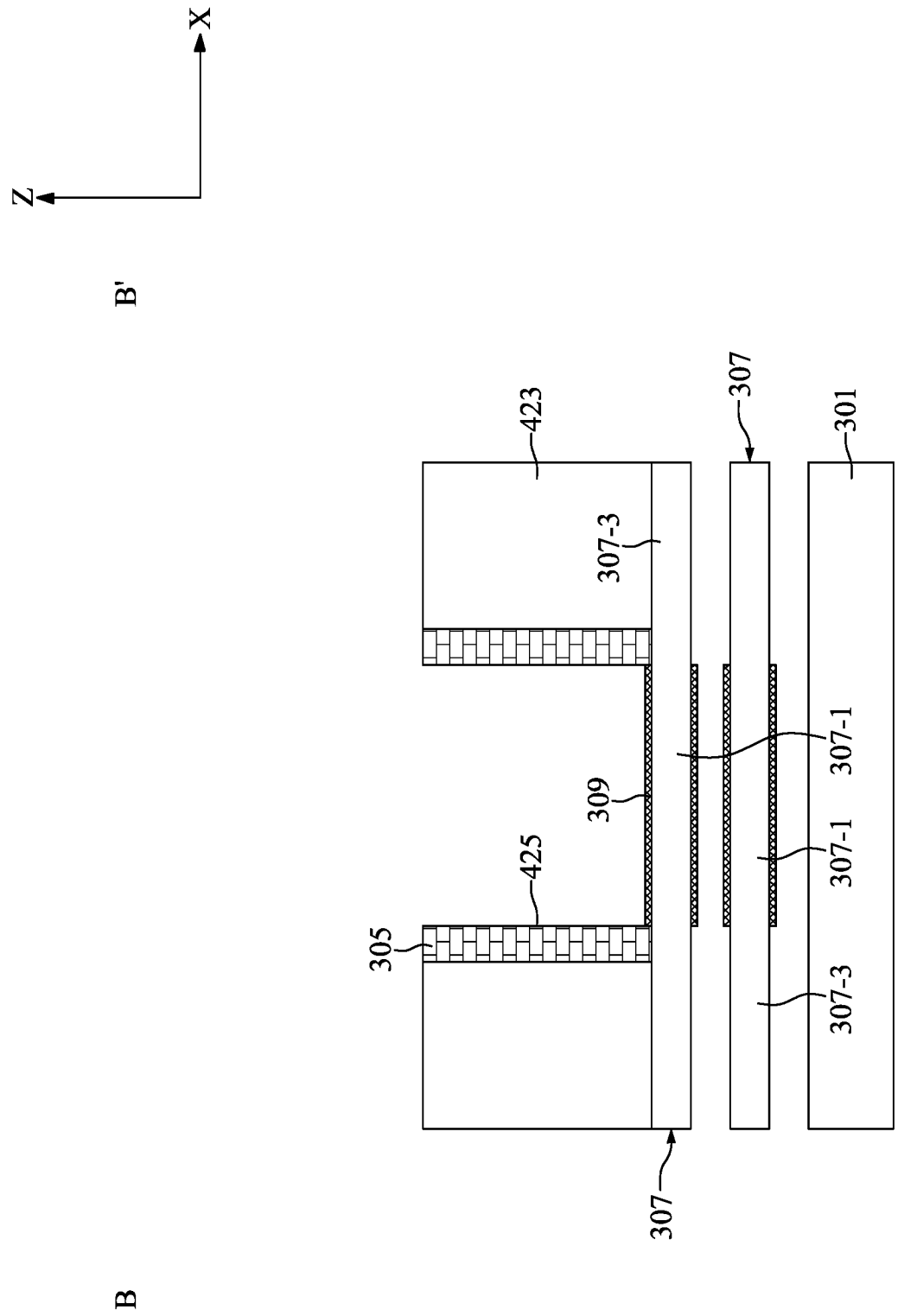
FIG. 37 is a schematic cross-sectional view diagram taken along the line B-B' in FIG. 30 illustrating part of a flow for fabricating the semiconductor device in accordance with one embodiment of the present disclosure.

FIG. 30 illustrates, in a schematic top-view diagram, an intermediate semiconductor device in accordance with one embodiment of the present disclosure. FIG. 31 is a schematic cross-sectional view diagram taken along a line A-A' in FIG. 30. FIGS. 32 and 33 are schematic cross-sectional view diagrams taken along the line B-B' in FIG. 30 illustrating part of a flow for fabricating the semiconductor device 300 in FIG. 24 in accordance with one embodiment of the present disclosure. FIG. 34 is a schematic cross-sectional view diagram taken along the line A-A' in FIG. 30 illustrating part of a flow for fabricating the semiconductor device 300 in accordance with one embodiment of the present disclosure. FIG. 35 is a schematic cross-sectional view diagram taken along the line B-B' in FIG. 30 illustrating part of a flow for fabricating the semiconductor device 300 in accordance with one embodiment of the present disclosure. FIG. 36 is a schematic cross-sectional view diagram taken along the line A-A' in FIG. 30 illustrating part of a flow for fabricating the semiconductor device 300 in accordance with one embodiment of the present disclosure. FIG. 37 is a schematic cross-sectional view diagram taken along the line B-B' in FIG. 30 illustrating part of a flow for fabricating the semiconductor device 300 in accordance with one embodiment of the present disclosure. Some elements of the intermediate semiconductor device are not shown in FIG. 30 for clarity.

With reference to FIG. 26 and FIGS. 30 to 37, at step S35, in the embodiment depicted, a plurality of nanowires 307 may be formed over the substrate 101 and a plurality of coverage layers 309 may be formed on channel regions 307-1 of the plurality of nanowires 307. With reference to FIGS. 30 to 32, a plurality of dummy gate structures 417 may be formed over the plurality of fins 303 and the substrate 301. The plurality of dummy gate structures 417 may extend along the second direction Y and may be spaced apart from each other. Each of the plurality of dummy gate structures 417 may include a bottom sacrificial layer 419 and a top sacrificial layer 421. The bottom sacrificial layer 419 may be formed on the substrate 101, sides of the fin 303, and a top surface of the fin 303. The bottom sacrificial layer 419 may be formed of, for example, polysilicon. The top sacrificial layer 421 may be formed on the bottom sacrificial layer 419. The top sacrificial layer 421 may be formed of, for example, silicon oxide or other suitable oxide.

With reference to FIG. 33, a spacer insulating layer (not shown) may be formed over the intermediate semiconductor device in FIG. 32. An etch process, such as an anisotropic dry etch process, may be performed to remove portions of the spacer insulating layer and concurrently form a gate spacer 305 on each of both sides of the dummy gate structure 417. A layer of first insulating material 423 may be formed over the fin 303, the dummy gate structure 417, the two gate spacers 305, and the substrate 101. A planarization process, such as chemical mechanical polishing, may be performed until the top surface of the top sacrificial layer 421 is exposed to provide a substantially flat surface for subsequent processing steps.

With reference to FIGS. 34 and 35, a selective etch process may be performed to remove the dummy gate structure 417, the first semiconductor layer 409, and the third semiconductor layer 413 and concurrently form a first trench 425. It should be noted that the selective etch process may include a single step or multiple steps. After the selective etch process, the remaining second semiconductor layer 411 and the remaining fourth semiconductor layer 415 may be referred to as the plurality of nanowires 307. In such case, the bottommost nanowire 307 may be formed above the substrate 301.

Alternatively, in another embodiment, the selective etch process may be performed to remove the second semiconductor layer 411 and the fourth semiconductor layer 415 instead of the first semiconductor layer 409 and the third semiconductor layer 413. The remaining first semiconductor layer 409 and the remaining third semiconductor layer 413 may be referred to as the plurality of nanowires 307. In this embodiment, the bottommost nanowire 307 may be formed on the substrate 301.

With reference to FIGS. 36 and 37, the plurality of coverage layers 309 may be formed on the channel regions 307-1 of the plurality of nanowires 307 by a deposition process such as atomic layer deposition.

Figure 38:
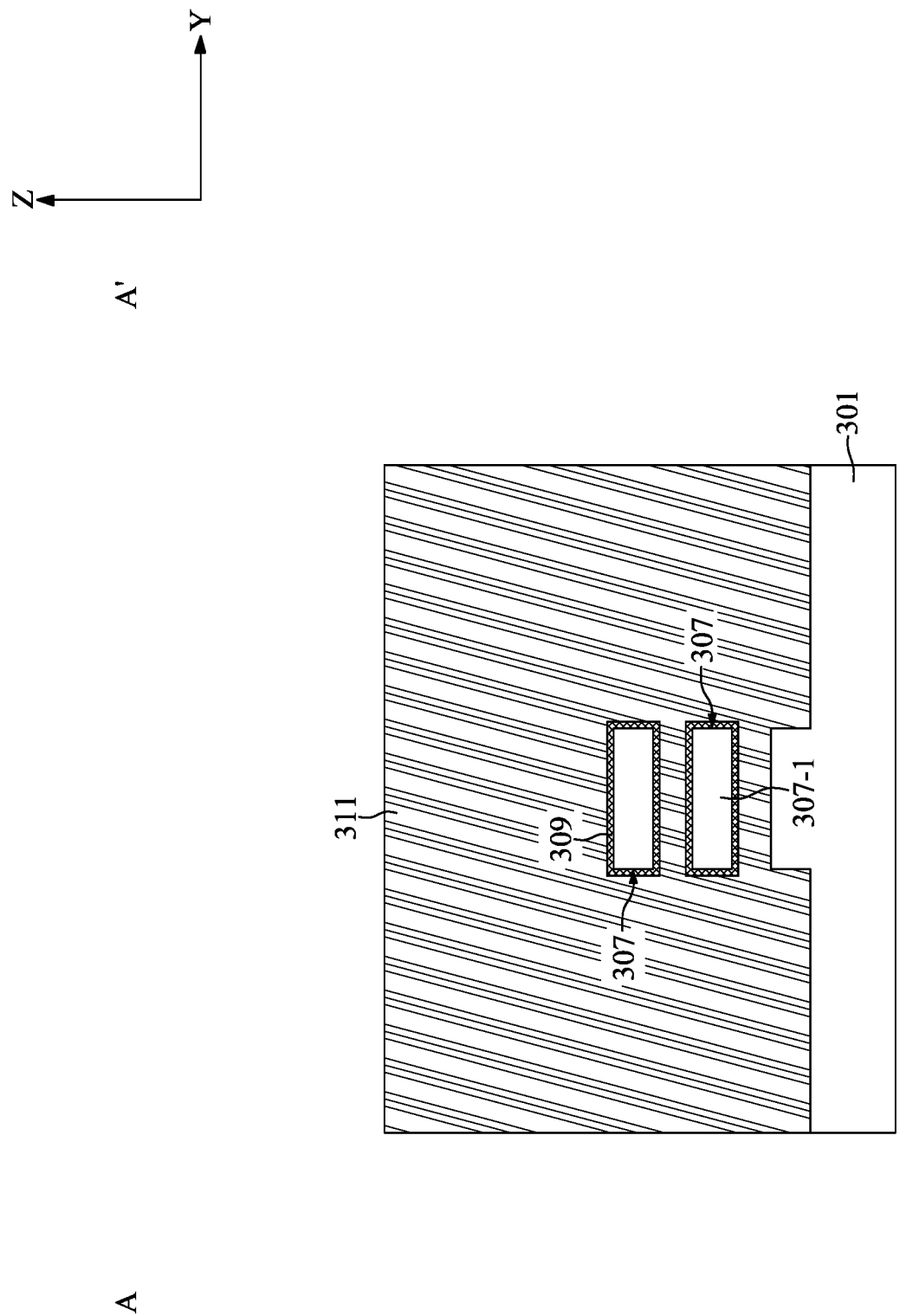
FIG. 38 is a schematic cross-sectional view diagram taken along the line A-A' in FIG. 30 illustrating part of a flow for fabricating the semiconductor device in accordance with one embodiment of the present disclosure.
Figure 39:
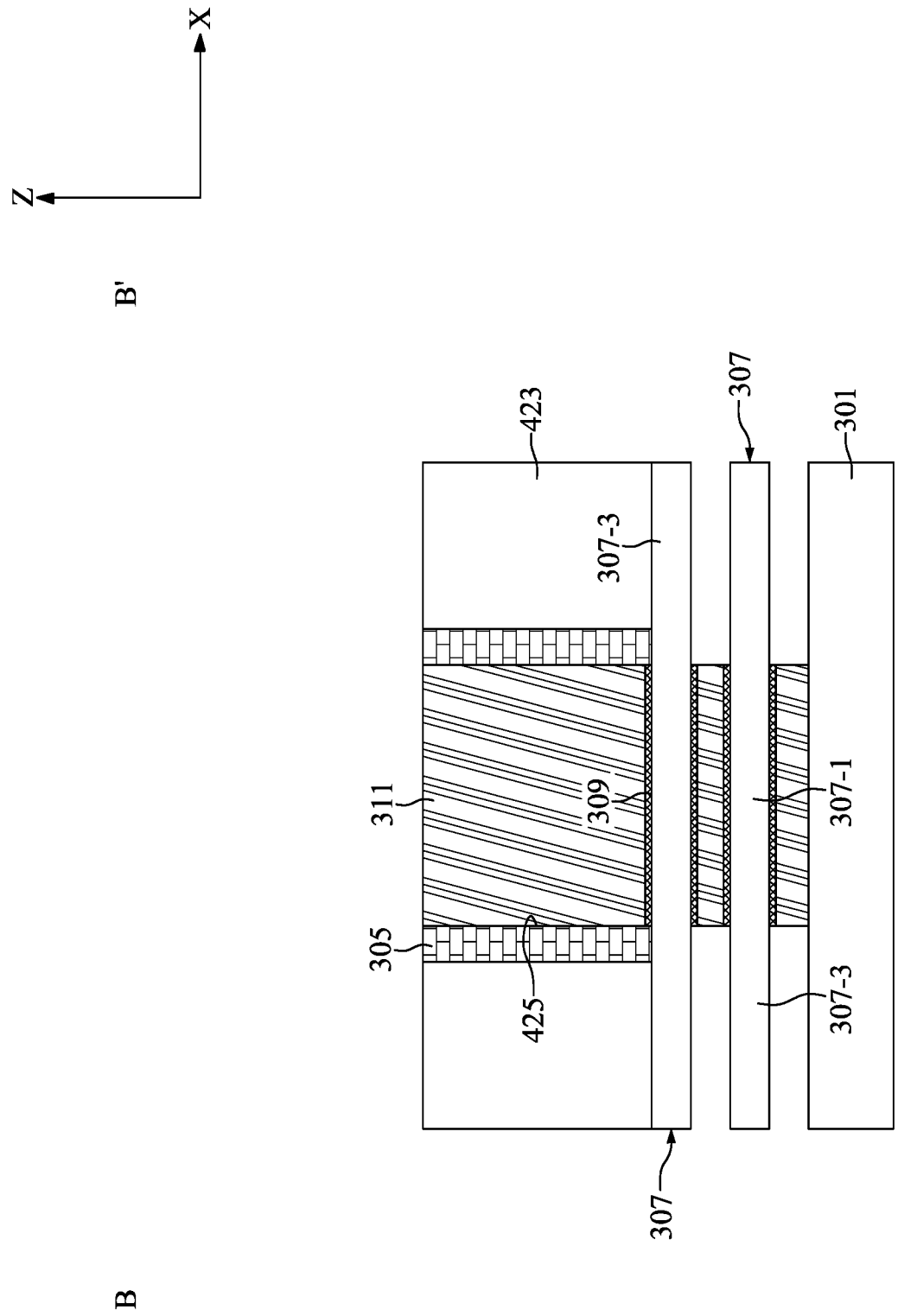
FIGS. 39 to 41 are schematic cross-sectional view diagrams taken along the line B-B' in FIG. 30 illustrating part of a flow for fabricating the semiconductor device in accordance with one embodiment of the present disclosure.
Figure 40:
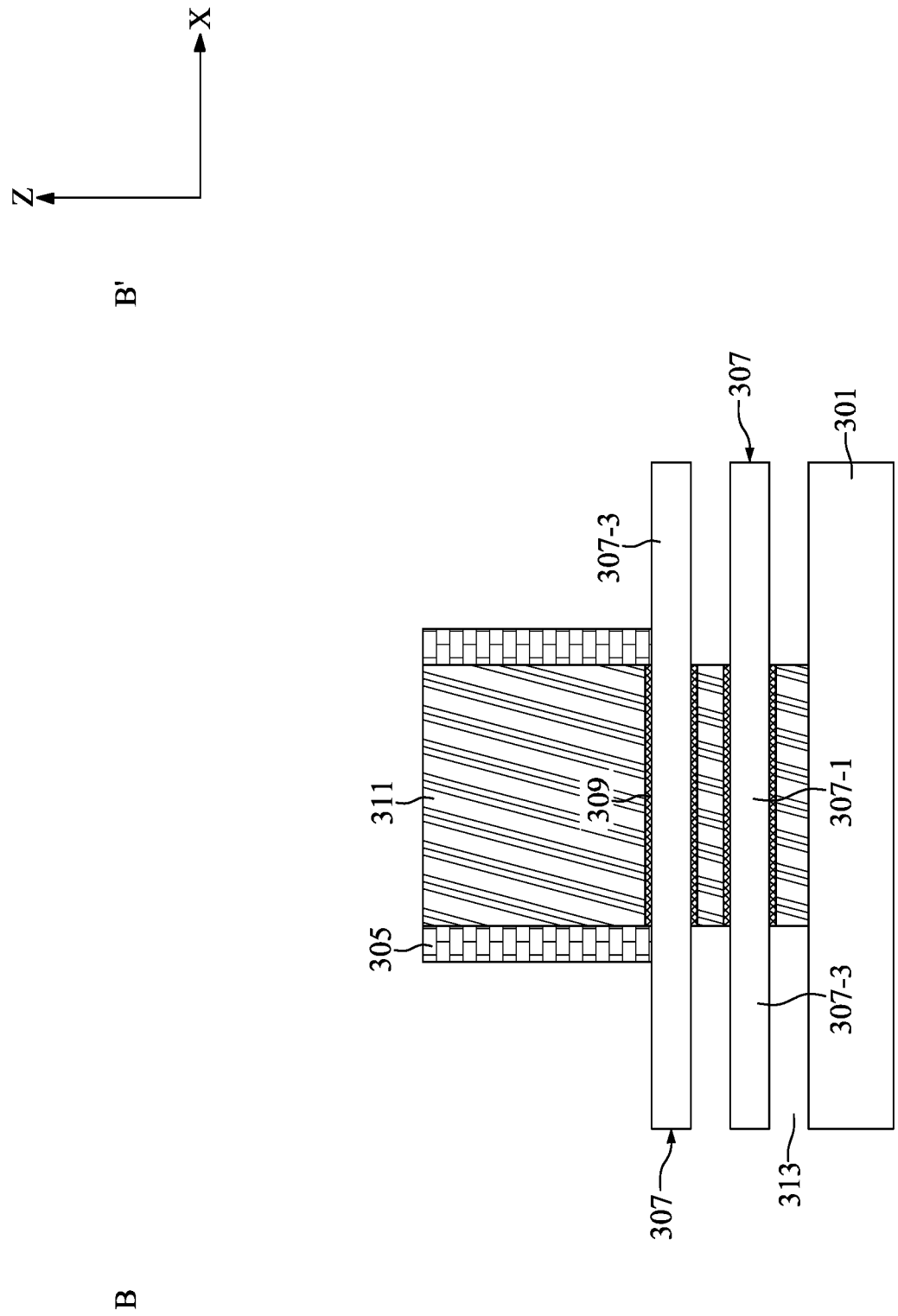
Figure 41:
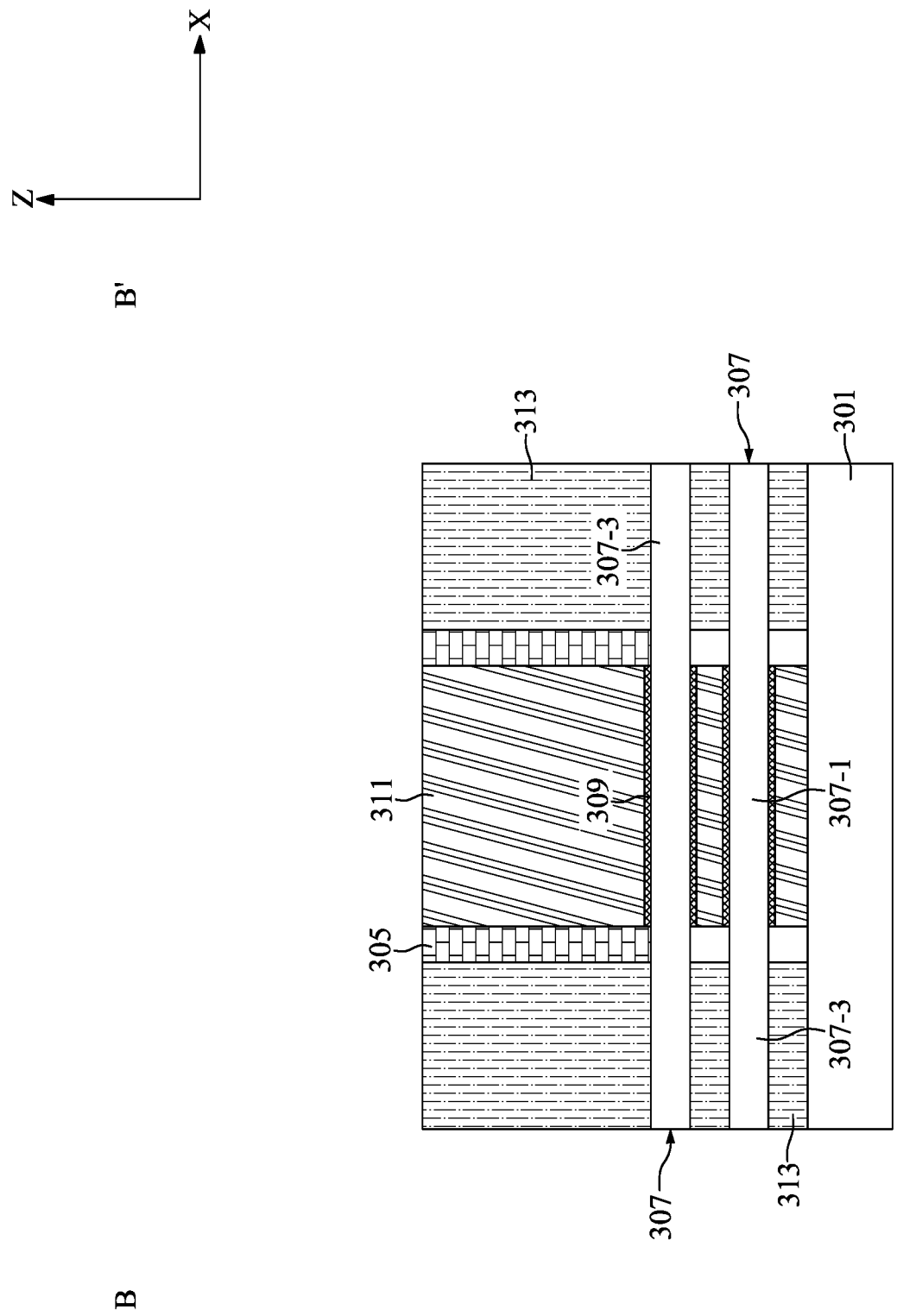

FIG. 38 is a schematic cross-sectional view diagram taken along the line A-A' in FIG. 30 illustrating part of a flow for fabricating the semiconductor device 300 in accordance with one embodiment of the present disclosure. FIG. 39 is a schematic cross-sectional view diagram taken along the line B-B' in FIG. 30 illustrating part of a flow for fabricating the semiconductor device 300 in accordance with one embodiment of the present disclosure. FIGS. 40 and 41 are schematic cross-sectional view diagrams taken along the line B-B' in FIG. 30 illustrating part of a flow for fabricating the semiconductor device 300 in accordance with one embodiment of the present disclosure.

With reference to FIG. 26 and FIGS. 38 to 41, at step S37, in the embodiment depicted, a plurality of gate stacks 311 may be formed surrounding the plurality of coverage layers 309 and a plurality of contacts 313 may be formed surrounding the pairs of source/drain regions 307-3 of the plurality of nanowires 307. With reference to FIGS. 38 and 39, the gate stack 311 (for convenience of description, only one gate stack 311 is described) may be formed in the first trench 425 and may surround the perimeters of the plurality of coverage layers 309. With reference to FIG. 40, the layer of first insulating material 423 may be removed. With reference to FIG. 41, the plurality of contacts 313 may be formed in the places previously occupied by the layer of first insulating material 423 and surrounding the perimeters of the pairs of source/drain regions 307-3 of the plurality of nanowires 307.

Figure 42:
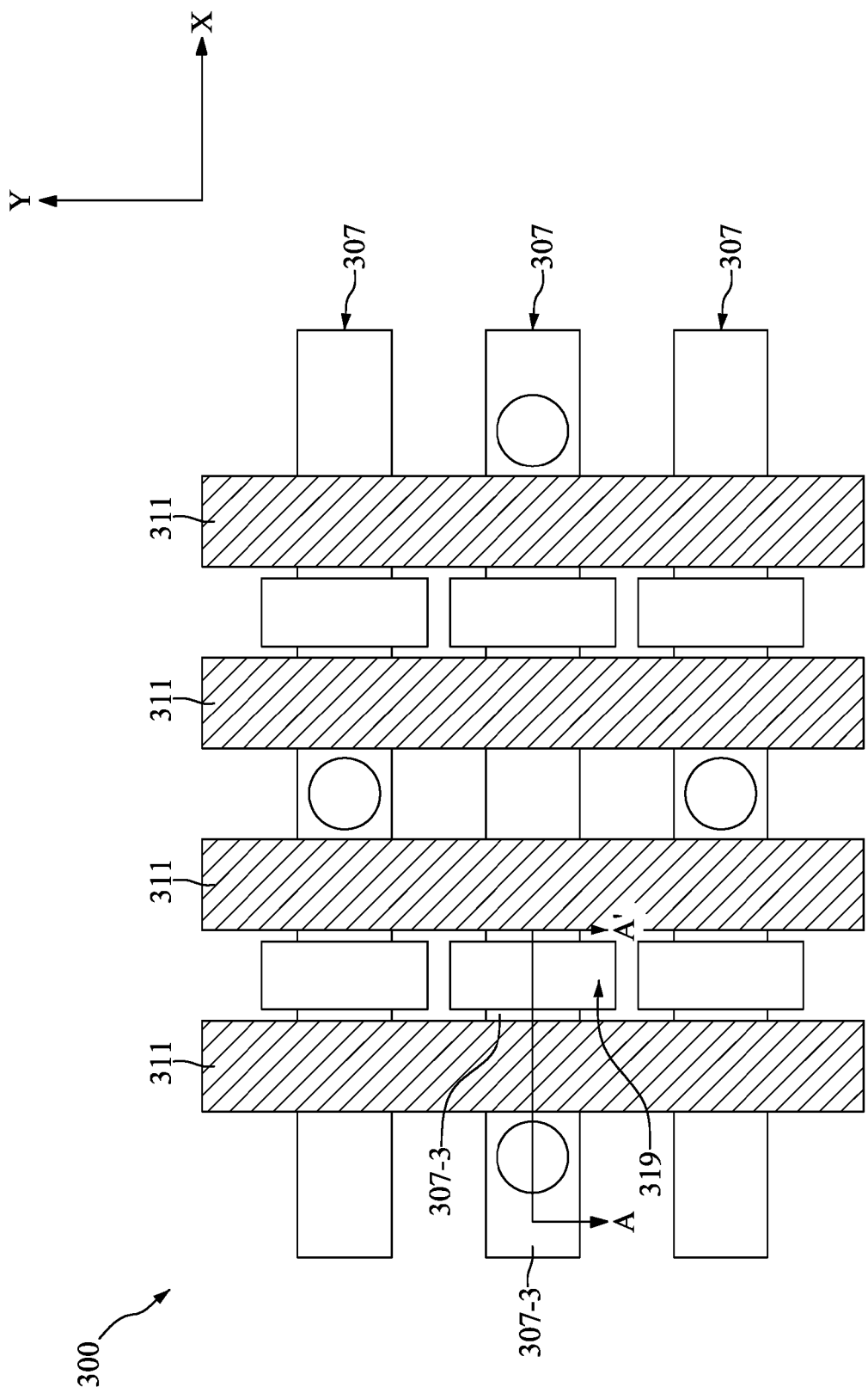
FIG. 42 illustrates, in a schematic top-view diagram, an intermediate semiconductor device in accordance with one embodiment of the present disclosure.
Figure 43:
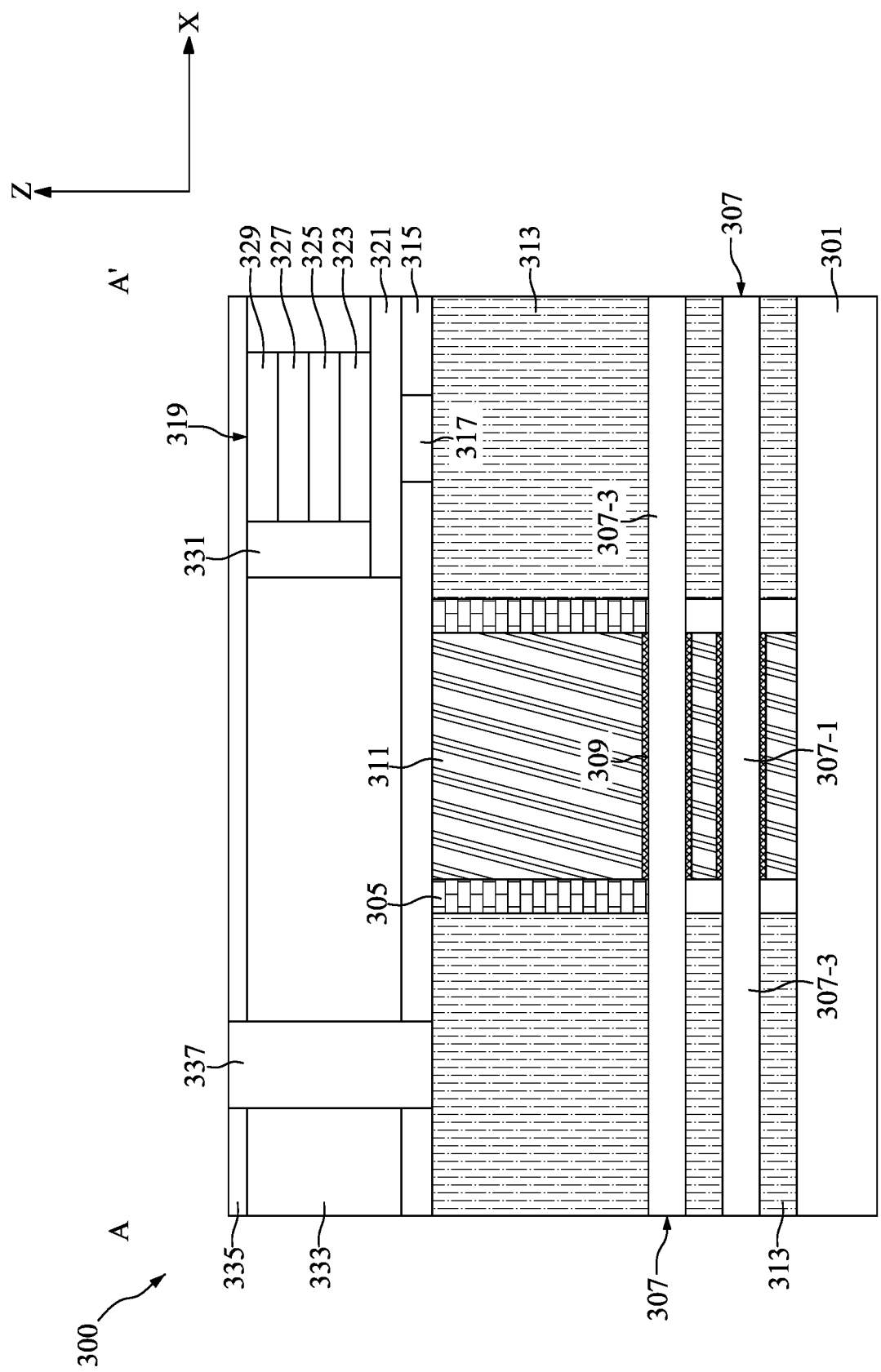
FIG. 43 is a schematic cross-sectional view diagram taken along a line A-A' in FIG. 42.

FIG. 42 illustrates, in a schematic top-view diagram, an intermediate semiconductor device in accordance with one embodiment of the present disclosure. FIG. 43 is a schematic cross-sectional view diagram taken along a line A-A' in FIG. 42. Some elements of the intermediate semiconductor device are not shown in FIG. 42 for clarity.

With reference to FIGS. 26, 42 and 43, at step S39, in the embodiment depicted, a plurality of storage structures 319 and a plurality of bit line contacts 337 may be formed over the substrate 301. The first insulating layer 315, the storage node contact 317, the storage structure 319, the two storage spacers 331, the second insulating layer 333, the third insulating layer 335, and the bit line contact 337 may be formed using a procedure similar to that illustrated in FIGS. 13 to 23.

Referring to FIG. 42 and FIG. 43, in some embodiments, the plurality of gate stacks 311 extend along one direction (the direction Y in FIG. 42), and the plurality of storage structures 319 are separated along the direction and positioned between two adjacent gate stacks 311 along another direction (the direction X in FIG. 42). In some embodiments, the gate stacks 311 have flat top surfaces; in addition, the gate stacks 311 have protrusions towards the substrate 301 between two adjacent nanowires 307.

Figure 44:
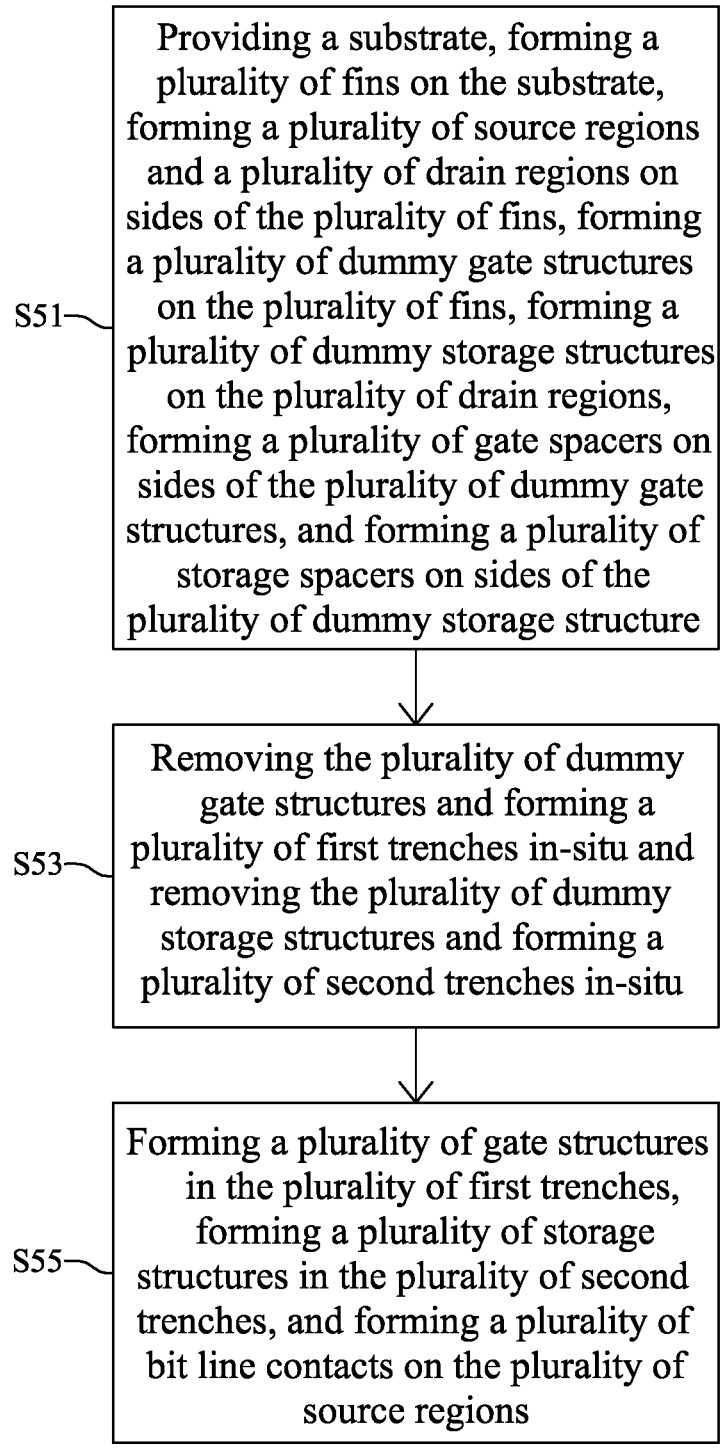
FIG. 44 illustrates, in a flowchart diagram form, a method for fabricating a semiconductor device in accordance with one embodiment of the present disclosure.
Figure 45:
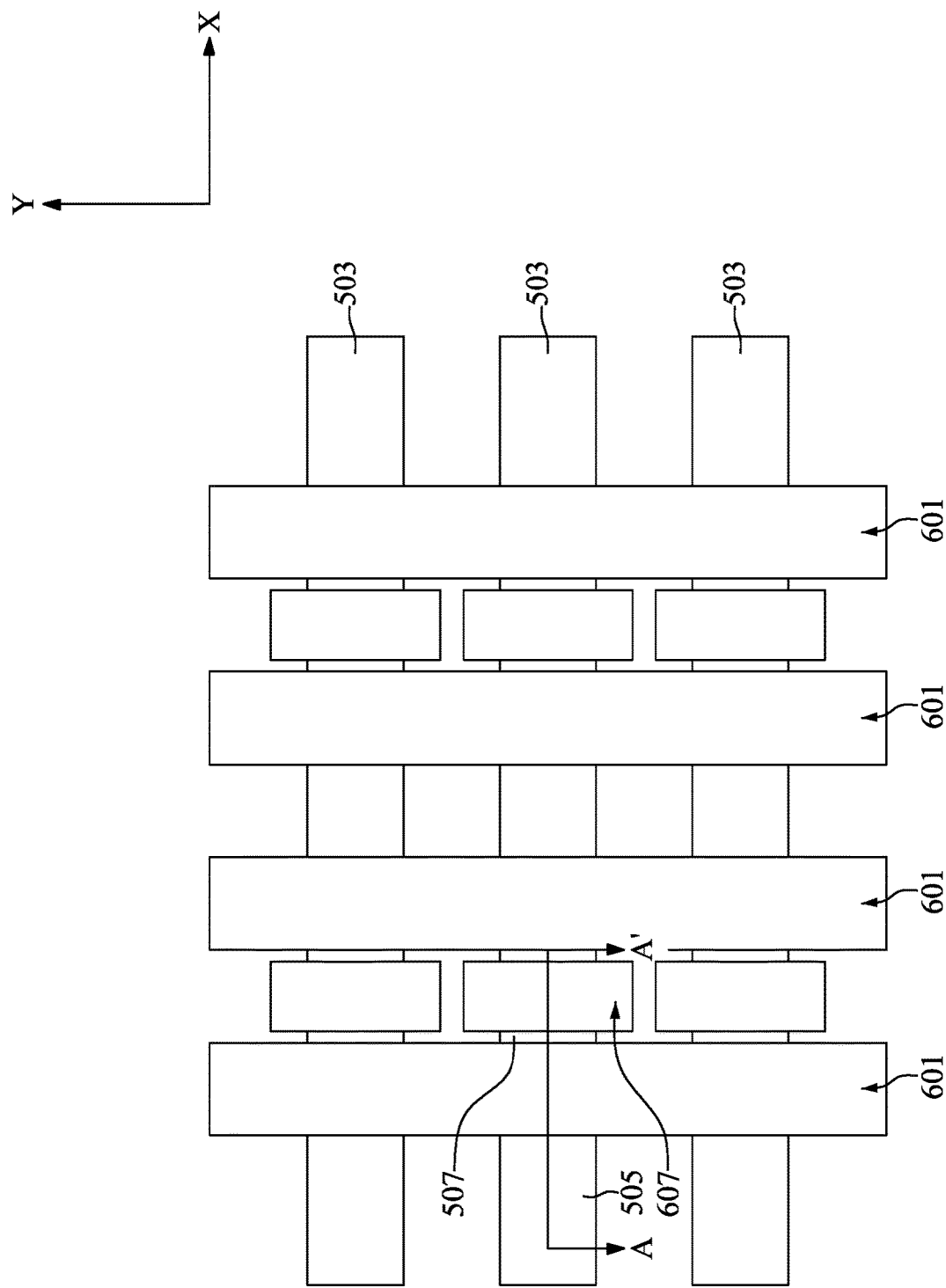
FIG. 45 illustrates, in a schematic top-view diagram, an intermediate semiconductor device in accordance with one embodiment of the present disclosure.
Figure 52:
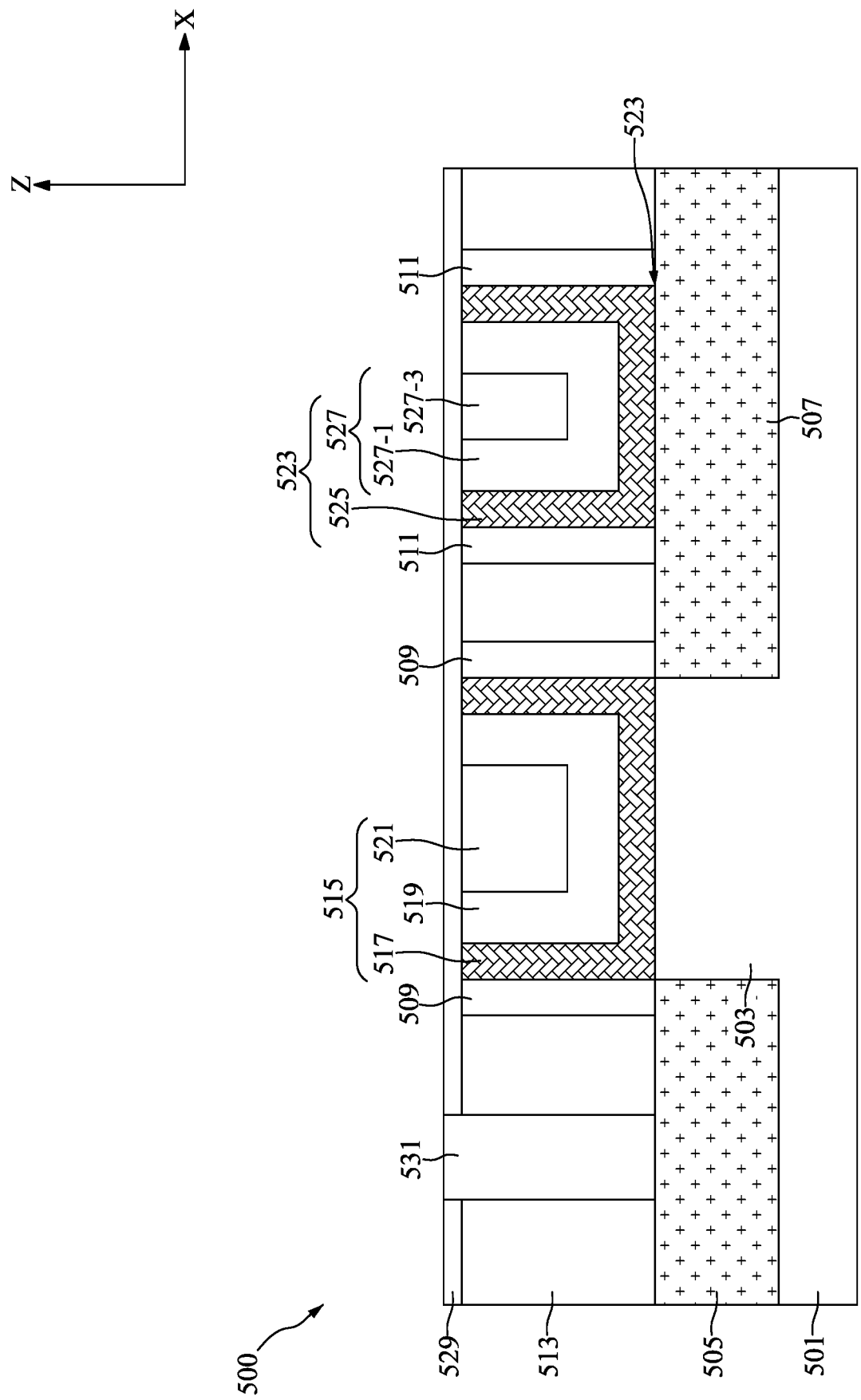
Figure 53:
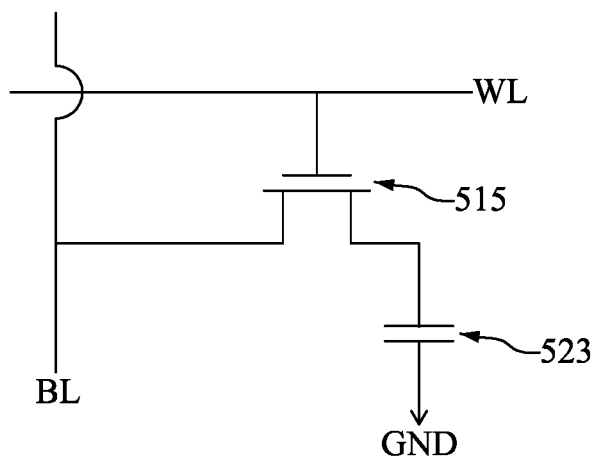
FIG. 53 illustrates, in a schematic circuit diagram, a semiconductor device in accordance with one embodiment of the present disclosure.

FIG. 44 illustrates, in a flowchart diagram form, a method 50 for fabricating a semiconductor device 500 in accordance with one embodiment of the present disclosure. FIG. 45 illustrates, in a schematic top-view diagram, an intermediate semiconductor device in accordance with one embodiment of the present disclosure. Some elements of the intermediate semiconductor device are not shown in FIG. 45 for clarity. FIGS. 46 to 52 are schematic cross-sectional view diagrams taken along the line A-A' in FIG. 45 illustrating part of a flow for fabricating the semiconductor device 500 in accordance with one embodiment of the present disclosure. FIG. 53 illustrates, in a schematic circuit diagram, a semiconductor device 500 in accordance with one embodiment of the present disclosure.

With reference to FIGS. 44 to 47, at step S51, in the embodiment depicted, a substrate 501 may be provided, a plurality of fins 503 may be formed on the substrate 501, a plurality of source regions 505 and a plurality of drain regions 507 may be formed on sides of the plurality of fins 503, a plurality of dummy gate structures 601 may be formed on the plurality of fins 503, a plurality of dummy storage structures 607 may be formed on the plurality of drain regions 507, a plurality of gate spacers 509 may be formed on sides of the plurality of dummy gate structures 601, and a plurality of storage spacers 511 may be formed on sides of the plurality of dummy storage structures 607. For convenience of description, only one fin 503, one source region 505, one drain region 507, one dummy gate structure 601, one dummy storage structure 607, two gate spacers 509, and two storage spacers 511 are described. The fin 503, the source region 505, and the drain region 507 may be formed using a procedure similar to that illustrated in FIGS. 5 and 6.

Figure 46:
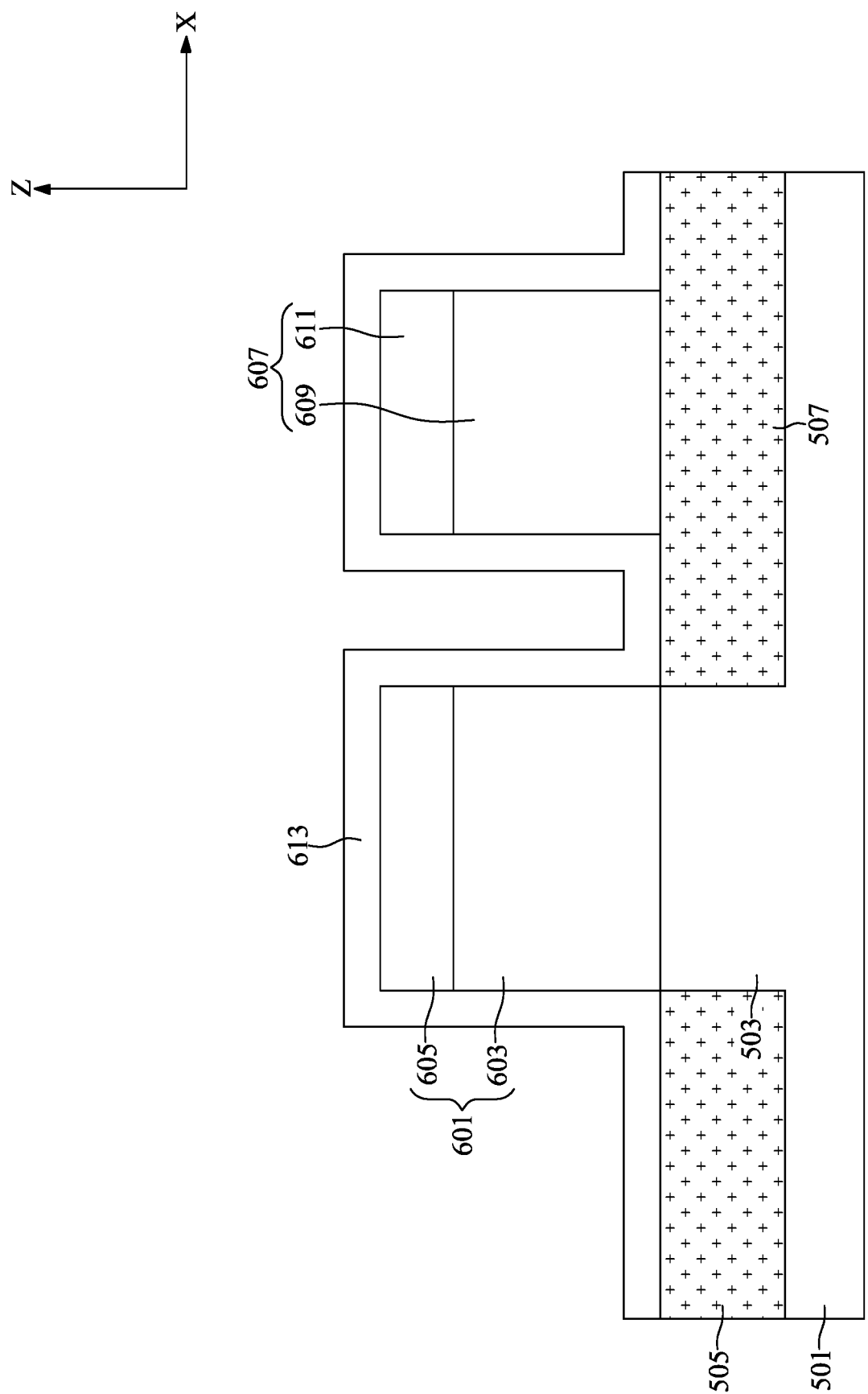
FIGS. 46 to 52 are schematic cross-sectional view diagrams taken along the line A-A' in FIG. 45 illustrating part of a flow for fabricating the semiconductor device in accordance with one embodiment of the present disclosure.

The dummy gate structure 601 may include a bottom gate sacrificial layer 603 and a top gate sacrificial layer 605. The dummy storage structure 607 may include a bottom storage sacrificial layer 609 and a top storage sacrificial layer 611. The bottom gate sacrificial layer 603 and the bottom storage sacrificial layer 609 may be formed of, for example, polysilicon. The top gate sacrificial layer 605 and the top storage sacrificial layer 611 may be formed of, for example, silicon nitride. The dummy gate structure 601 and the dummy storage structure 607 may be formed using a procedure similar to that illustrated in FIGS. 7 and 8. With reference to FIG. 46, a layer of first insulating material 613 may be formed to cover the dummy gate structure 601 and the dummy storage structure 607.

Figure 47:
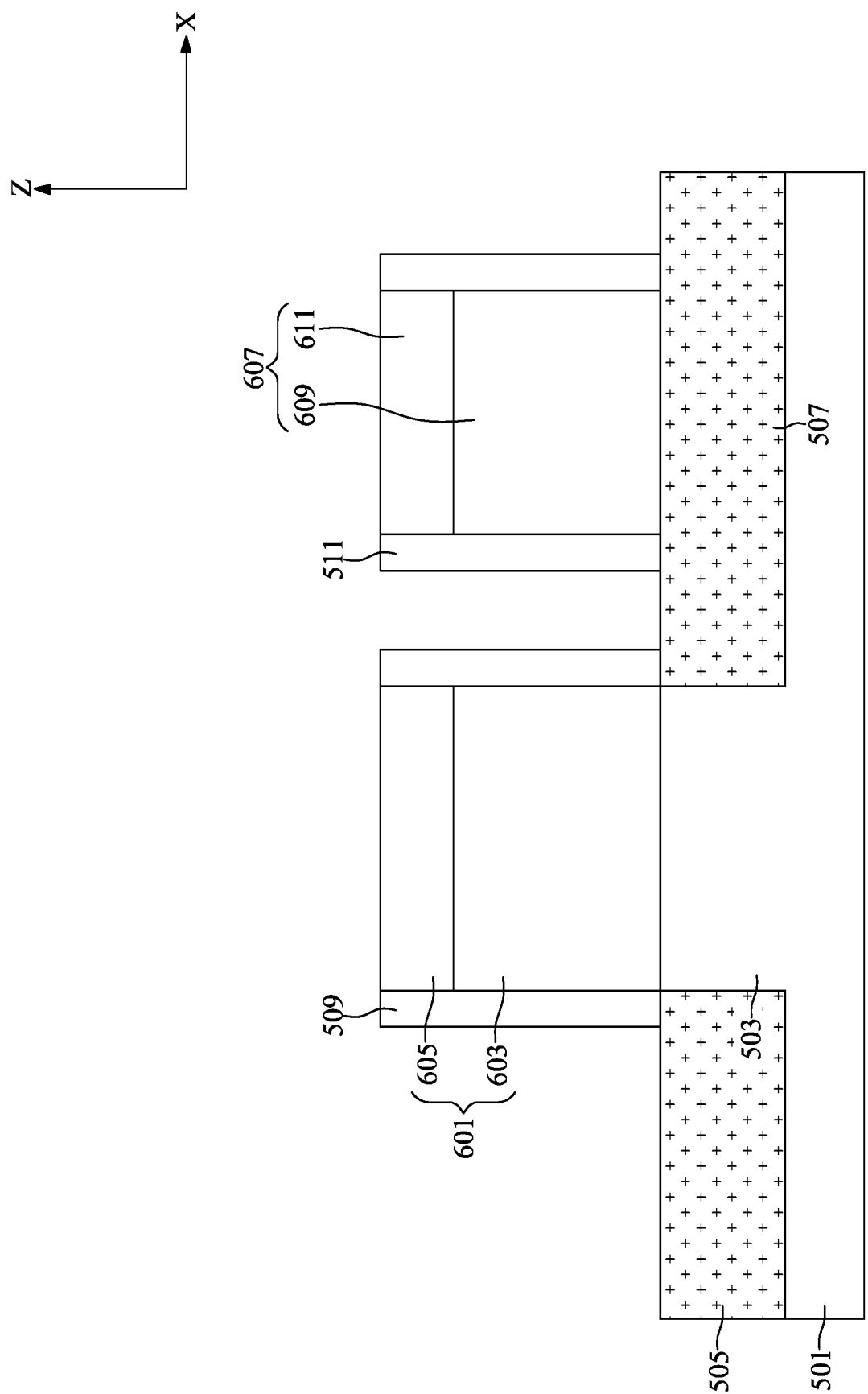

With reference to FIG. 47, an etch process, such as an anisotropic dry etch process, may be performed to remove portions of the layer of first insulating material 613 and concurrently form the two gate spacers 509 on the sides of the dummy gate structure 601 and the two storage spacers 511 on the sides of the dummy storage structure 607. In some embodiments, the distance between the dummy gate structure 601 and the dummy storage structure 607 may be small. Therefore, the layer of first insulating material 613 may not be able to completely fill the space between the dummy gate structure 601 and the dummy storage structure 607. As a result, an air gap (not shown) may be formed between the dummy gate structure 601 and the dummy storage structure 607. The air gap may alleviate the parasitic capacitance between the gate structure 515 and the storage structure 523, as described below.

Figure 48:
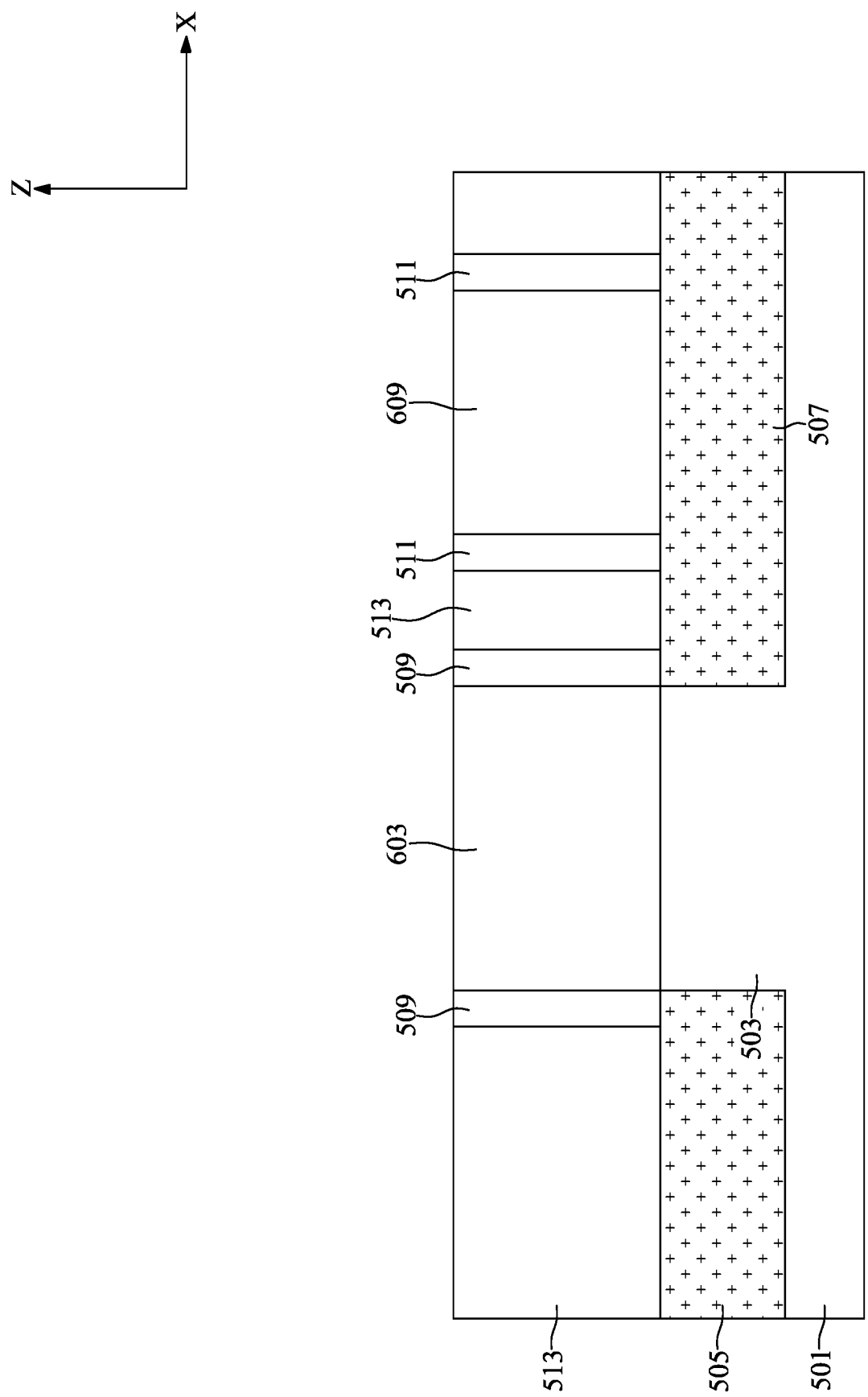
Figure 49:
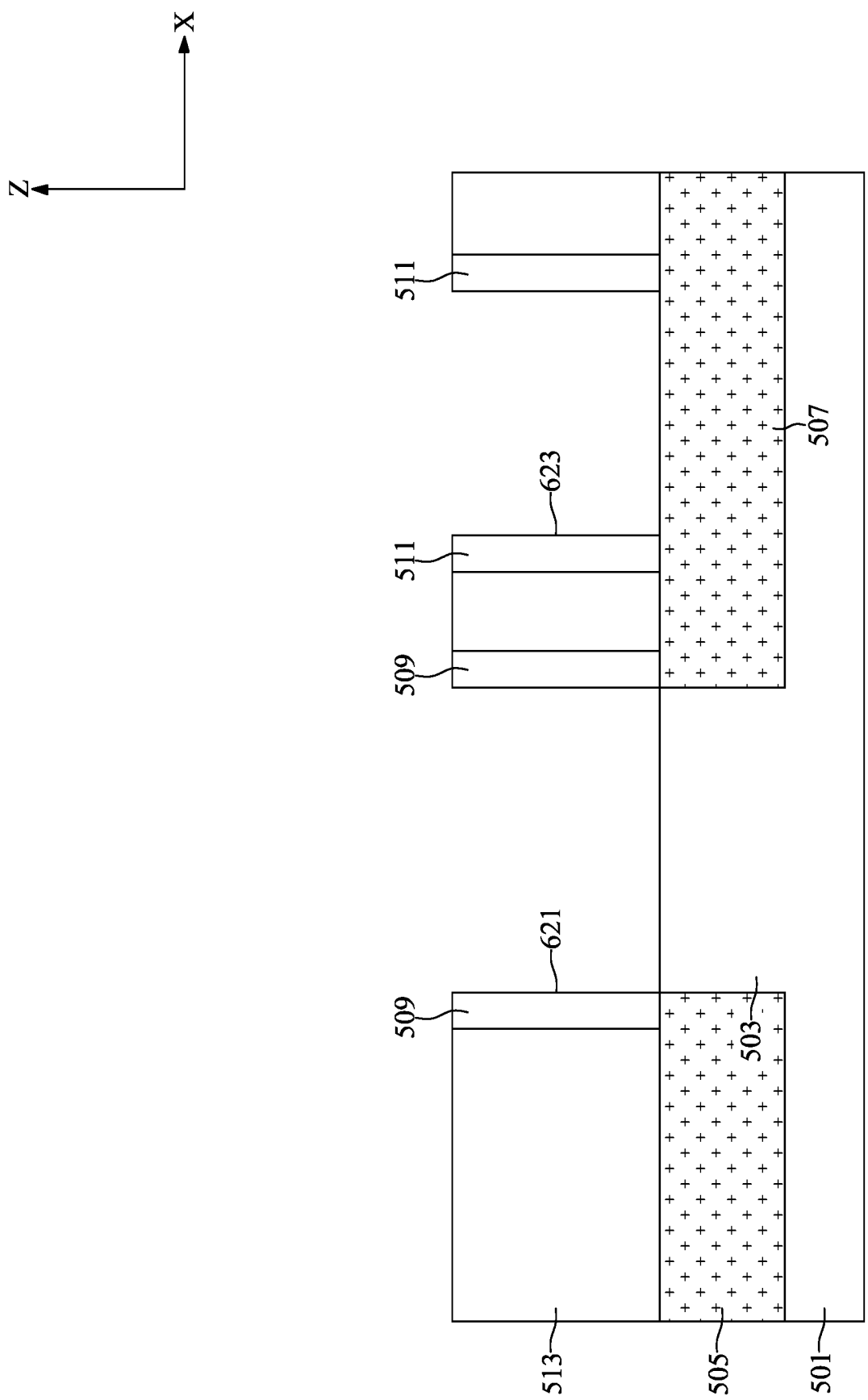

With reference to FIG. 44 and FIGS. 48 and 49, at step S53, in the embodiment depicted, the plurality of dummy gate structures 601 may be removed and a plurality of first trenches 621 may be formed in-situ, and the plurality of dummy storage structures 607 may be removed and a plurality of second trenches 623 may be formed in-situ. For convenience of description, only one first trench 621 and one second trench 623 are described. In some embodiments, the plurality of first trenches 621 extends along one direction (the direction Y in FIG. 45) as the dummy gate structures 601, and the plurality of second trenches 623 are recesses separated by the first insulating material 613 along the direction and positioned between two adjacent first trenches 621 (the direction X in FIG. 45).

With reference to FIG. 48, a first insulating layer 513 may be formed over the intermediate semiconductor device in FIG. 47. A planarization process, such as chemical mechanical polishing, may be performed until the top surface of the bottom gate sacrificial layer 603 and the top surface of the bottom storage sacrificial layer 609 are exposed to provide a substantially flat surface for subsequent processing steps.

With reference to FIG. 49, the bottom gate sacrificial layer 603 and the bottom storage sacrificial layer 609 may be removed. The first trench 621 may be formed in the place previously occupied by the bottom gate sacrificial layer 603 and the second trench 623 may be formed in the place previously occupied by the bottom storage sacrificial layer 609.

With reference to FIG. 44 and FIGS. 50 to 52, at step S55, in the embodiment depicted, a plurality of gate structures 515 may be formed in the plurality of first trenches 621, a plurality of storage structures 523 may be formed in the plurality of second trenches 623, and a plurality of bit line contacts 531 may be formed on the plurality of source regions 505. For convenience of description, only one gate structure 515, one storage structure 523, and one bit line contact 531 are described.

Figure 50:
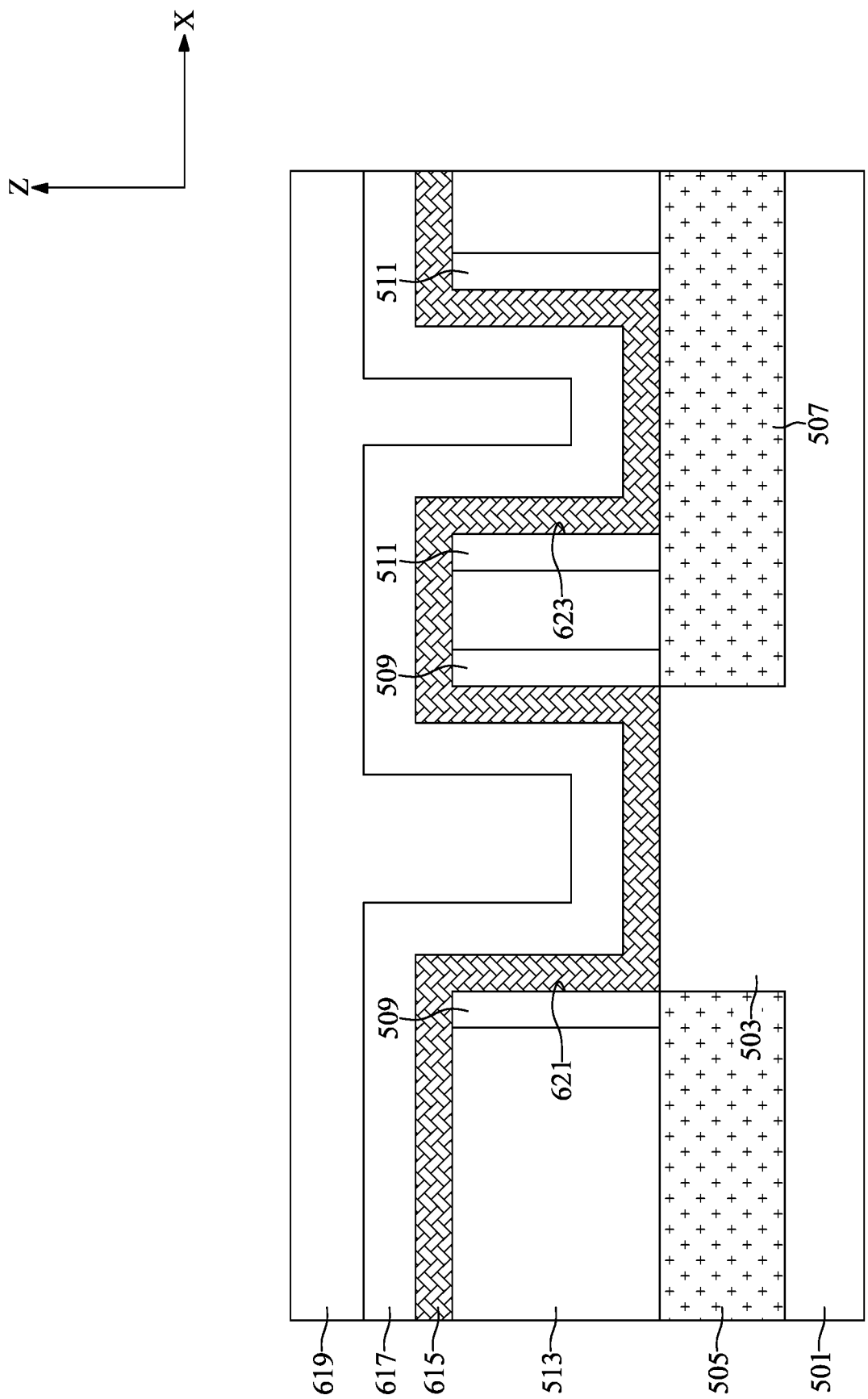

With reference to FIG. 50, a layer of second insulating material 615, a layer of first conductive material 617, and a layer of second conductive material 619 may be formed in the first trench 621 and the second trench 623. The second insulating material 615 may be the same material as the first insulating material 209. The first conductive material 617 may be the same material as the first conductive material 211. The second conductive material 619 may be the same material as the second conductive material 213.

Figure 51:
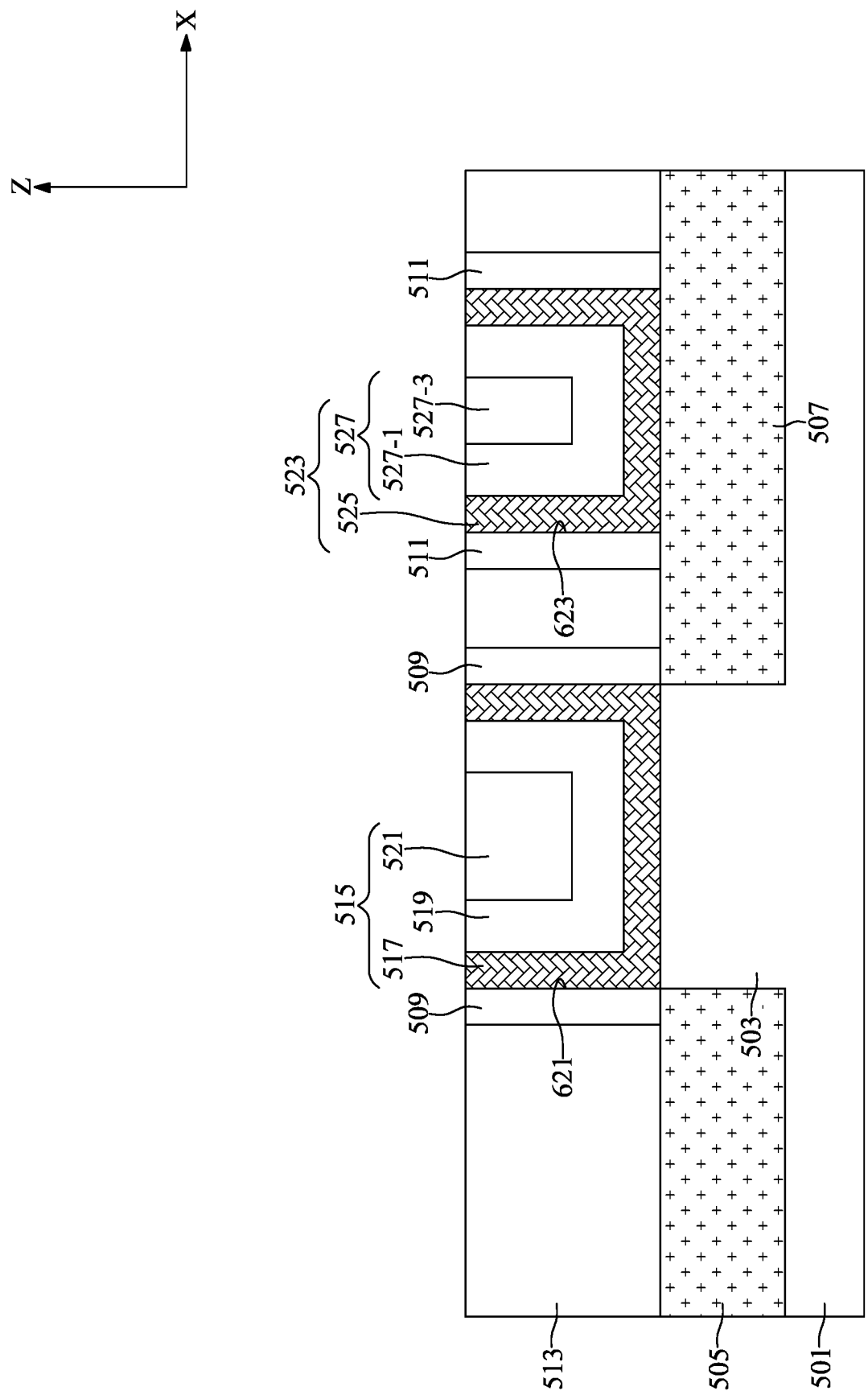

With reference to FIG. 51, a planarization process, such as chemical mechanical polishing, may be performed until the top surface of the first insulating layer 513 is exposed to provide a substantially flat surface for subsequent processing steps, conformally turn the layer of second insulating material 615 into a gate insulating layer 517 and a storage insulating layer 525, turn the layer of first conductive material 617 into a gate conductive layer 519 and a lower portion 527-1, and turn the layer of second conductive material 619 into a gate filler layer 521 and an upper portion 527-3. The gate insulating layer 517, the gate conductive layer 519, and the gate filler layer 521 together form the gate structure 515. The lower portion 527-1 and the upper portion 527-3 together form a storage top electrode 527. The storage top electrode 527, the storage insulating layer 525, and the drain region 507 together form the storage structure 523. The drain region 507 may be regarded as a bottom electrode of the storage structure 523. With reference to FIG. 52, a second insulating layer 529 may be formed on the first insulating layer 513, the gate structure 515, and the storage structure 523. A bit line contact 531 may be formed so as to penetrate the second insulating layer 529 and the first insulating layer 513. The bit line contact 531 may be electrically coupled to the source region 505.

Referring to FIG. 52 and FIG. 45, in some embodiments, the plurality of gate structures 515 extend along one direction (the direction Y in FIG. 45) as the dummy gate structures 601, and the plurality of storage structures 523 are separated at least by the first insulating material 613 along the direction and positioned between two adjacent gate structures 515 along another direction (the direction X in FIG. 45). In some embodiments, the gate structures 515 have flat top surfaces formed by the planarization process in FIG. 51; in addition, the gate structures 515 have protrusions towards the substrate 501 between two adjacent fins 503.

With reference to FIG. 53, the gate structure 515 may be electrically coupled to a word line WL for cell selection. The source region and drain region may be electrically coupled to the storage structure 523 and a bit line BL. The storage structure 523 may be used to store data.

Figure 54:
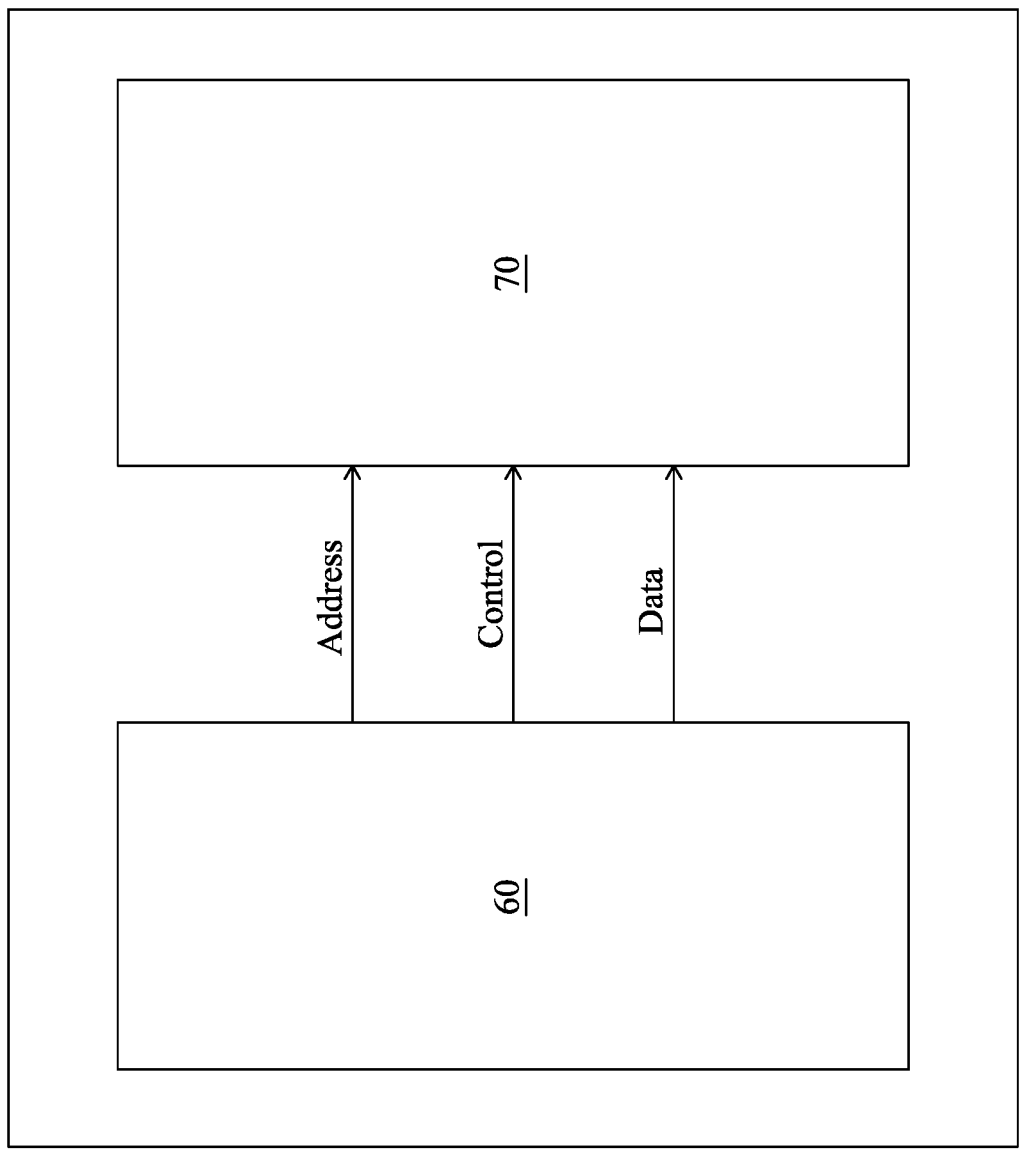
FIG. 54 illustrates, in a schematic top-view diagram, a chip in accordance with one embodiment of the present disclosure.

FIG. 54 illustrates, in a schematic top-view diagram, a chip 1 in accordance with one embodiment of the present disclosure. In some embodiments, the chip 1 may include a processor area 60 and a memory area 70. The processor area 60 may function to follow an instruction cycle. The instruction cycle is followed by the processor area 60 to process instructions from boot-up until, for example, a computer has shut down. The memory area 70, coupled to the processor area 60, may function to store instructions required in the instruction cycle and may function to serve as a main memory of the chip 1. The semiconductor devices 100, 300, and 500 may be integrated in the memory area 70. In other words, the semiconductor devices 100, 300, and 500 and transistors in the processor area 60 may be integrated in a single chip.

One aspect of the present disclosure provides a semiconductor device including a substrate; a fin positioned on the substrate; a gate structure positioned on the fin; a pair of source/drain regions positioned on two sides of the fin; and a dielectric layer positioned above the drain region and adjacent to the gate structure; a storage conductive layer positioned on the dielectric layer; wherein the drain region, the dielectric layer and the storage conductive layer form a storage structure.

Another aspect of the present disclosure provides a semiconductor device including a substrate; a plurality of nanowires positioned above and parallel to a top surface of the substrate, wherein the plurality of nanowires comprises channel regions and source/drain regions positioned on each of both sides of the channel regions; a gate stack positioned surrounding the channel regions; and a storage structure positioned above a drain region of the plurality of nanowires and positioned adjacent to the gate stack; wherein the storage structure comprises a bottom conductive layer positioned above the drain region, a dielectric layer positioned on the bottom conductive layer, and a top conductive layer positioned on the dielectric layer.

Another aspect of the present disclosure provides a method for fabricating a semiconductor device, comprising: providing a substrate; forming a plurality of fins on the substrate; forming a plurality of source regions and a plurality of drain regions on sides of the plurality of fins; forming a plurality of dummy gate structures on the plurality of fins and forming a plurality of dummy storage structures on the plurality of drain regions; forming a plurality of gate spacers on sides of the plurality of dummy gate structures and a plurality of storage spacers on sides of the plurality of dummy storage structure; removing the plurality of dummy gate structures to form a plurality of first trenches in-situ and removing the plurality of dummy storage structures to form a plurality of second trenches in-situ; integrally forming a dielectric layer in the plurality of first trenches and in the plurality of second trenches; forming a conductive layer in the plurality of first trenches and in the plurality of second trenches; and forming a plurality of bit line contacts on the plurality of source regions.

Due to the design of the semiconductor device of the present disclosure, the compact design of the gate structure and the storage structure make the semiconductor device able to be integrated with transistors of a processor in a single chip. As a result, the complicated packaging process may be simplified. Hence, the cost of fabrication of the electronic equipment including the semiconductor device of the present disclosure may be reduced.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor device, comprising:
    a substrate;
    a plurality of nanowires positioned above and extending along a first direction parallel to a top surface of the substrate, wherein the plurality of nanowires comprises channel regions and source/drain regions positioned on each of both sides of the channel regions;
    a gate stack positioned surrounding the channel regions;
    a storage structure positioned above a drain region of the source/drain regions positioned on each of both sides of the channel regions and positioned adjacent to the gate stack; wherein the storage structure comprises a bottom conductive layer positioned above the drain region, a dielectric layer positioned on the bottom conductive layer, and a top conductive layer positioned on the dielectric layer; and
    a bottom electrode positioned below the bottom conductive layer and positioned adjacent to the gate stack, wherein a width of the bottom electrode is greater than a width of the bottom conductive layer.

2. The semiconductor device of claim 1, wherein the plurality of nanowires are arranged vertically.

3. The semiconductor device of claim 1, further comprising two storage spacers positioned on two sides of the top conductive layer, two sides of the dielectric layer, and two sides of the bottom conductive layer.

4. The semiconductor device of claim 3, further comprising two contacts positioned on two sides of the gate stack and surrounding the source/drain regions of the plurality of nanowires.

5. The semiconductor device of claim 4, further comprising two gate spacers positioned between the two contacts and the gate stack.

6. The semiconductor device of claim 5, further comprising a plurality of coverage layers positioned between the channel regions of the plurality of nanowires and the gate stack, wherein a band gap of the plurality of coverage layers is smaller than a band gap of the plurality of nanowires.

7. The semiconductor device of claim 1, comprising:
    a plurality of gate stacks positioned on the plurality of nanowires, wherein the plurality of gate stacks extend along a second direction different from the first direction; and
    a plurality of storage structures separated by an insulating material along the second direction and positioned between two adjacent gate stacks.

8. The semiconductor device of claim 7, wherein the plurality of gate stacks have flat top surfaces and protrusions towards the substrate between two adjacent fins.

* * * * *